(12) United States Patent
Wood

US010374070B2

(10) Patent No.: US 10,374,070 B2
(45) Date of Patent: Aug. 6, 2019

(54) BIDIRECTIONAL BIPOLAR-MODE JFET DRIVER CIRCUITRY

(71) Applicant: John Wood, Northamptonshire (GB)

(72) Inventor: John Wood, Northamptonshire (GB)

(*) Notice: Subject to any disclaimer, the term of this patent is extended or adjusted under 35 U.S.C. 154(b) by 0 days.

(21) Appl. No.: 16/031,752

(22) Filed: Jul. 10, 2018

(65) Prior Publication Data

US 2019/0043969 A1 Feb. 7, 2019

Related U.S. Application Data

(63) Continuation-in-part of application No. 15/595,361, filed on May 15, 2017, now Pat. No. 10,049,884,
(Continued)

(30) Foreign Application Priority Data

Feb. 7, 2013 (GB) .................................. 1302196.9
Mar. 22, 2013 (GB) .................................. 1305250.1
(Continued)

(51) Int. Cl.
*H01L 21/00* (2006.01)
*H01L 29/732* (2006.01)
(Continued)

(52) U.S. Cl.
CPC .... *H01L 29/7322* (2013.01); *H01L 21/30604* (2013.01); *H01L 29/0696* (2013.01);
(Continued)

(58) Field of Classification Search
CPC ............. H01L 29/1058; H01L 29/1066; H01L 29/808–8086; H01L 27/098;
(Continued)

(56) References Cited

U.S. PATENT DOCUMENTS 3,678,347 A 7/1972 Tulp
4,547,959 A 10/1985 Rusch
(Continued)

OTHER PUBLICATIONS

Tomohiko Sugita et al, 'Formation of Through-Holes in Si Wafers by Using Anodically Polarized Needle Electrodes in HF Solution', Jun. 2, 2011, ACS Applied Materials and Interfaces, 2011, pp. 2417-2424.
(Continued)

*Primary Examiner* — Nicholas J Tobergte
(74) *Attorney, Agent, or Firm* — Renner, Otto, Boisselle & Sklar, LLP

(57) ABSTRACT

Double sided versions of several power transistor types are devices that are already known in the literature. Devices built in this configuration are generally required to have a separate driver circuit to control the front and rear control electrodes and provide the gate or base voltage and/or currents for the power switch. This is because there may be of the order of 1000V potential-difference between the frontside and rearside potentials when the transistor is in the off condition—and a single integrated circuit cannot generally sustain this within a single package. The NPN configuration is preferred in this case to benefit from electron conduction for the main power path between the emitters. However, problems arising when using a P-type wafer. The present invention seeks to avoid the use of P-type wafers while still getting the higher conduction performance of NPN operation.

13 Claims, 58 Drawing Sheets

Related U.S. Application Data which is a continuation-in-part of application No. 14/797,498, filed on Jul. 13, 2015, now Pat. No. 9,685,502, which is a continuation-in-part of application No. PCT/GB2014/050368, filed on Feb. 7, 2014.

(30) Foreign Application Priority Data

| | | |
|---|---|---|
| May 27, 2013 | (GB) | 1309465.1 |
| Jun. 25, 2013 | (GB) | 1311298.2 |
| Nov. 29, 2013 | (GB) | 1321151.1 |
| Dec. 16, 2013 | (GB) | 1322177.5 |
| Jan. 20, 2014 | (GB) | 1400866.8 |
| Jul. 14, 2014 | (GB) | 1412513.2 |
| Dec. 12, 2016 | (GB) | 1621043.7 |
| May 1, 2018 | (GB) | 1807139.9 |

(51) Int. Cl.

| | |
|---|---|
| *H01L 29/808* | (2006.01) |
| *H01L 29/10* | (2006.01) |
| *H01L 29/06* | (2006.01) |
| *H03K 7/08* | (2006.01) |
| *H01L 29/08* | (2006.01) |
| *H02M 3/335* | (2006.01) |
| *H01L 21/306* | (2006.01) |
| *H03K 17/60* | (2006.01) |
| *H01L 29/16* | (2006.01) |
| *H01L 29/78* | (2006.01) |
| *H02M 1/00* | (2006.01) |
| *H01L 29/739* | (2006.01) |
| *H01L 29/66* | (2006.01) |
| *H01L 27/102* | (2006.01) |
| *H01L 27/098* | (2006.01) |
| *H01L 29/417* | (2006.01) |

(52) U.S. Cl.
CPC ...... *H01L 29/0804* (2013.01); *H01L 29/0821* (2013.01); *H01L 29/1004* (2013.01); *H01L 29/1095* (2013.01); *H01L 29/1608* (2013.01); *H01L 29/8083* (2013.01); *H02M 3/33584* (2013.01); *H03K 7/08* (2013.01); *H03K 17/60* (2013.01); *H01L 27/098* (2013.01); *H01L 27/102* (2013.01); *H01L 27/1022* (2013.01); *H01L 29/1058* (2013.01); *H01L 29/41708* (2013.01); *H01L 29/66901* (2013.01); *H01L 29/66916* (2013.01); *H01L 29/7395* (2013.01); *H01L 29/7802* (2013.01); *H02M 2001/0009* (2013.01)

(58) Field of Classification Search
CPC ... H01L 27/102–1022; H01L 29/41708; H01L 29/66901–66909; H01L 29/66916
See application file for complete search history.

(56) References Cited

U.S. PATENT DOCUMENTS

| | | | |
|---|---|---|---|
| 5,416,354 | A | 5/1995 | Blackstone |
| 5,493,134 | A | 2/1996 | Mehrotra |
| 5,896,869 | A | 4/1999 | Maniscalco |
| 8,664,690 | B1* | 3/2014 | Chen ............... H01L 27/0262 257/107 |
| 8,963,253 | B2* | 2/2015 | Chen ............... H01L 27/0262 257/119 |
| 9,019,000 | B2* | 4/2015 | Umetani ........... H03K 17/162 327/384 |
| 9,054,524 | B2* | 6/2015 | Chen ............... H01L 27/0262 |
| 9,054,706 | B2 | 6/2015 | Blanchard |
| 9,355,853 | B2 | 5/2016 | Blanchard |
| 9,673,187 | B2* | 6/2017 | Salcedo ........... H01L 27/0259 |
| 9,685,502 | B2 | 6/2017 | Wood |
| 10,049,884 | B2 | 8/2018 | Wood |
| 2011/0121407 | A1 | 5/2011 | Quoirin |
| 2011/0267132 | A1* | 11/2011 | Lubomirsky ....... H01L 29/8083 327/430 |
| 2013/0328103 | A1 | 12/2013 | Salcedo |
| 2014/0111890 | A1 | 4/2014 | Chen |
| 2014/0111892 | A1 | 4/2014 | Chen |
| 2014/0332857 | A1* | 11/2014 | Chen ............... H01L 29/42316 257/265 |
| 2014/0361303 | A1* | 12/2014 | Chen ............... H01L 27/0623 257/66 |
| 2014/0361350 | A1* | 12/2014 | Chen ............... H01L 27/0623 257/273 |

OTHER PUBLICATIONS

U.S. Appl. No. 14/797,498, filed Jul. 13, 2015, U.S. Appl. No. 15/595,361, filed May 15, 2017.

* cited by examiner

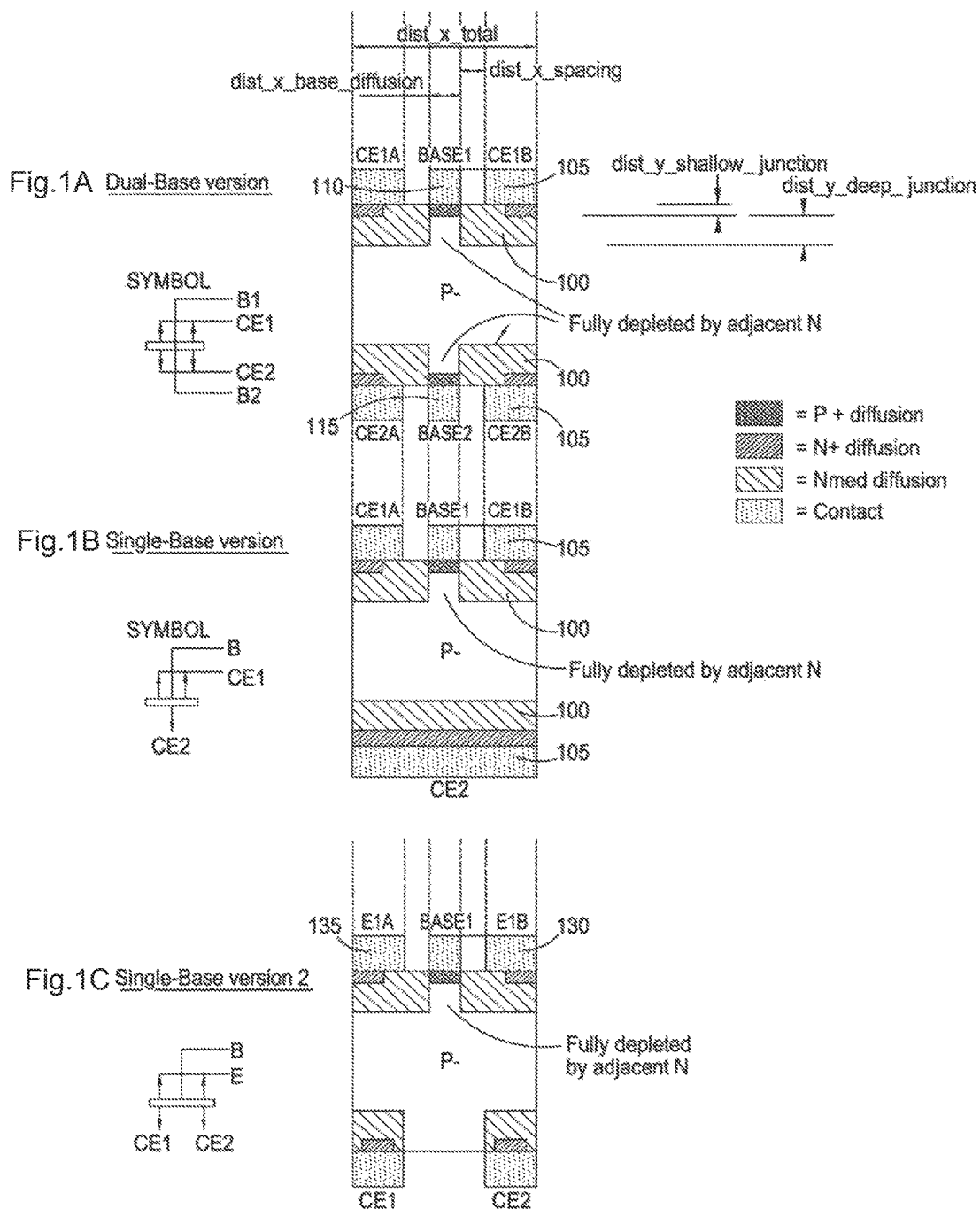

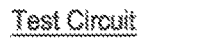
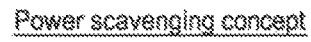
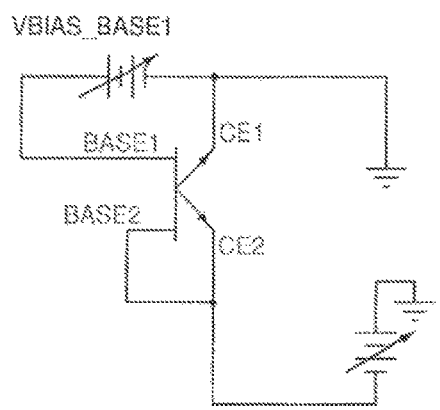
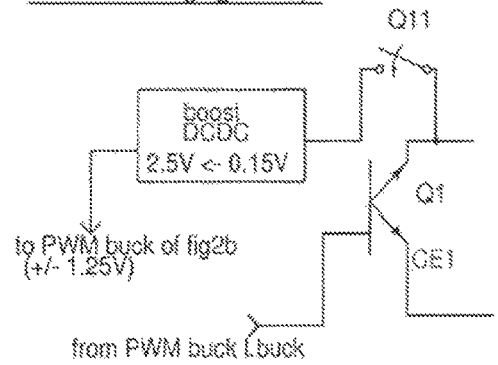
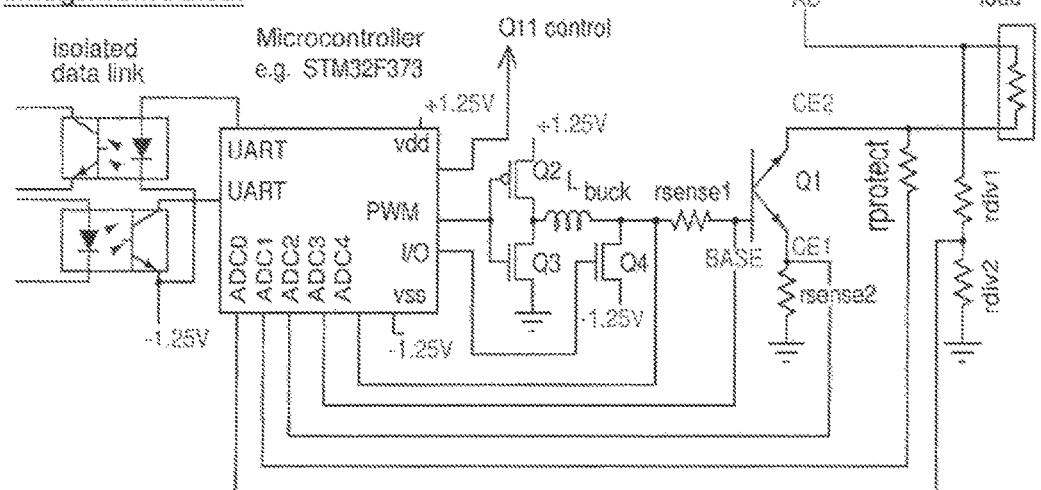

SYMBOL             EQUIVALENT CIRCUIT
                        Fig.5B
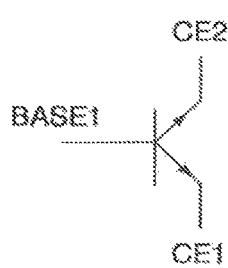
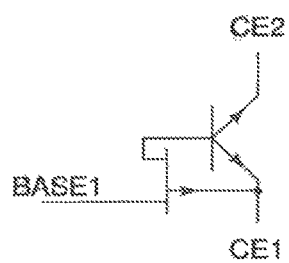
non-encroachment of donors in channel
Fig.5A
            Fig.5C
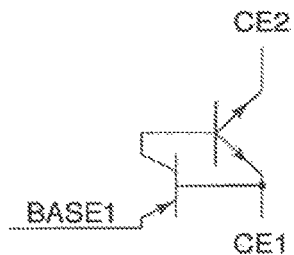
encroachment of donors in channel Unit design.
Cylindrical Symmetry Stacked design for higher
current or higher voltage

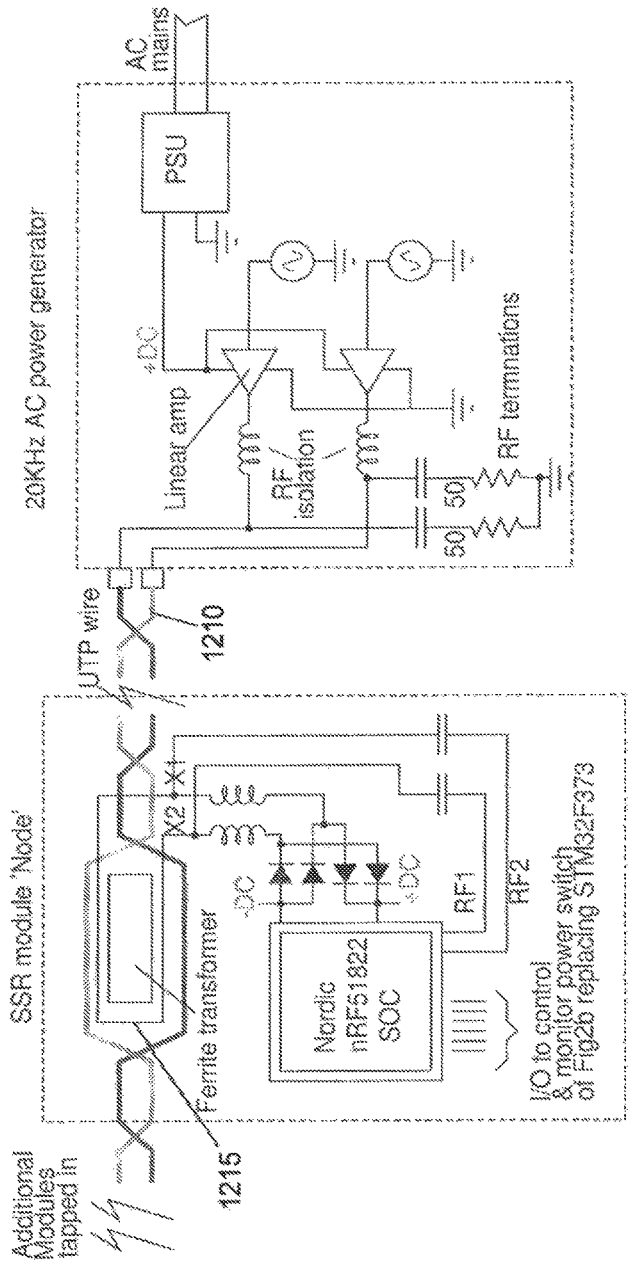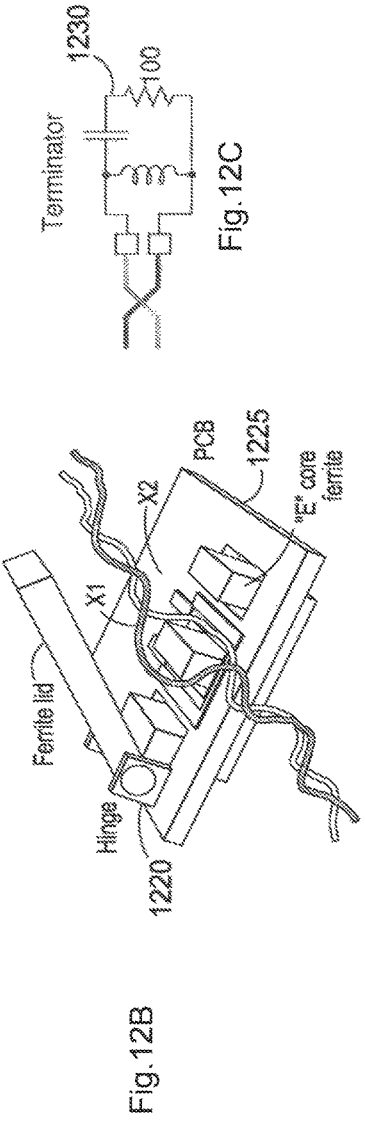

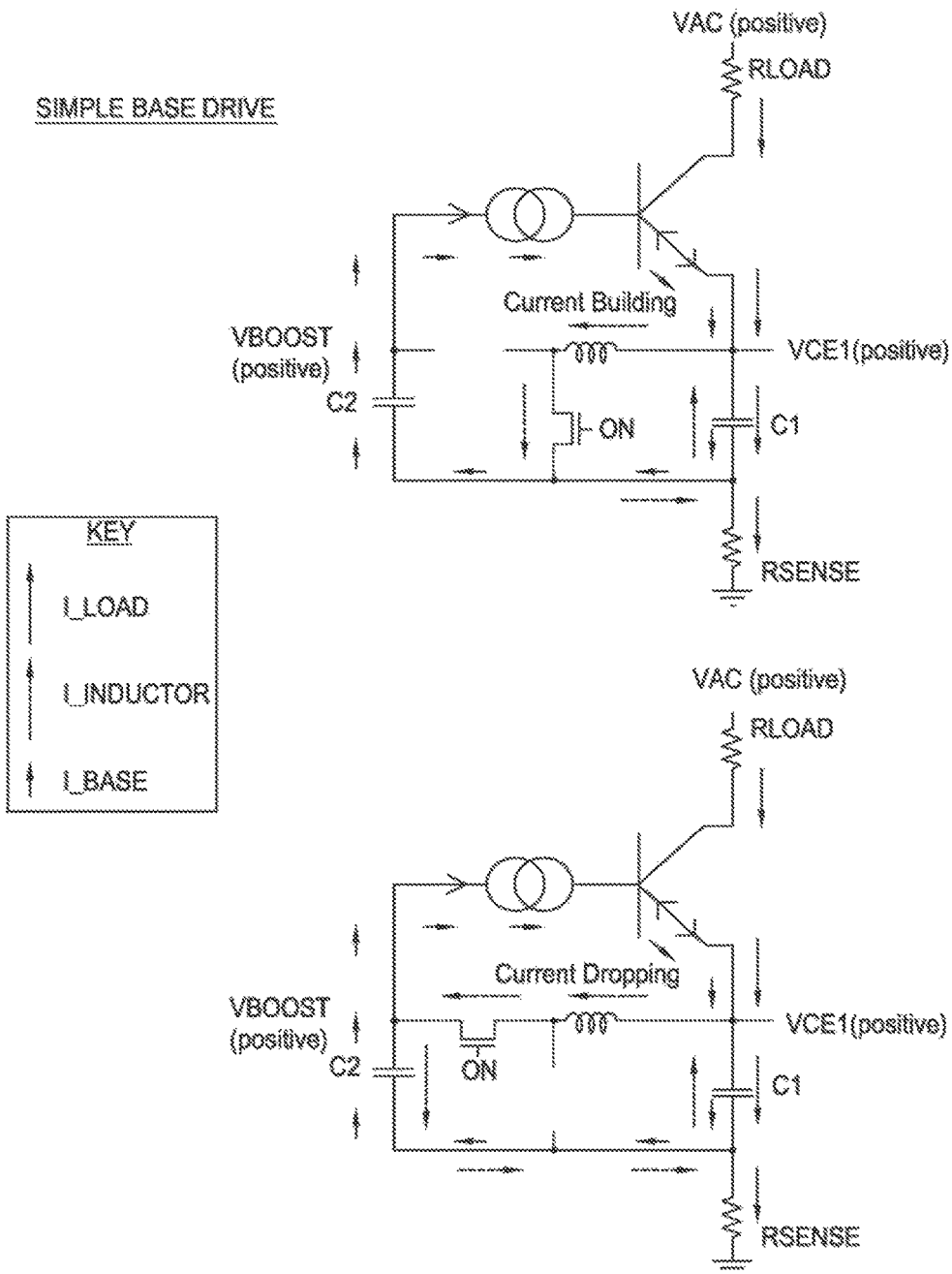

PROCESS STEPS for T2-JFET - base using Oxide only

1) Grow Thermal Oxide
 - wet thermal oxide

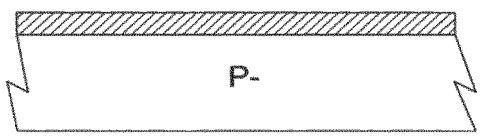

2) Oxide Pattern #1
 - spin on photoresist, BOE etch

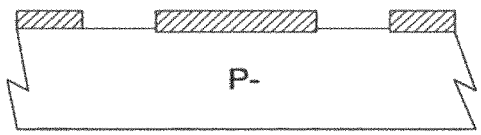

3) Wet Etch
 - KOH thenTrilogy Etch

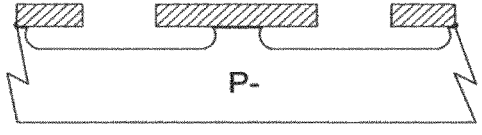

4) Dopant Spin-On / Dip-Coat
 - Apply both sides. Phosphorous

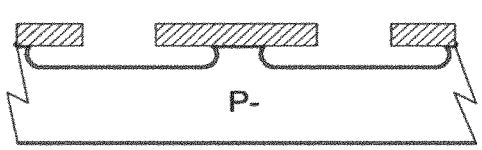

5) Phosphorous Diffusion
 - high temperature diffusion

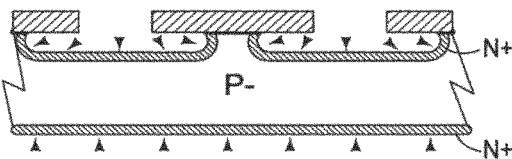

6) Oxide Pattern #2
 - spin on photoresist BOE etch

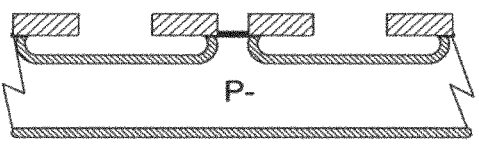

7) Aluminium Evaporation
 - self masking

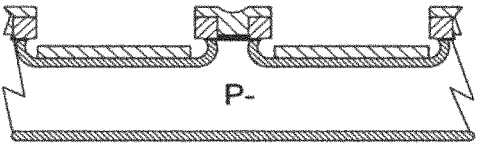

8) Aluminium Anneal

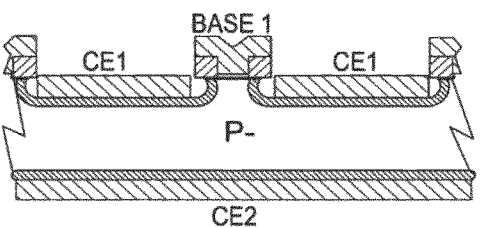

Fig.15

PROCESS STEPS for T2 - BJT base using Oxide only

1) Dopant Spin-On / Dip-Coat
 - Apply both sides. Phosphorous

5) Boron Spin-On
 + high temperature diffuse    shallow P+
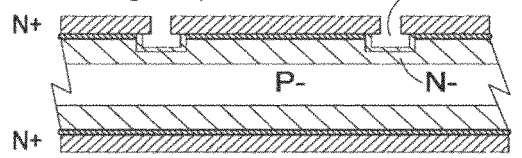

2) Grow Oxide over Phosphorous
 - wet thermal oxide + drive-in of phosphorous
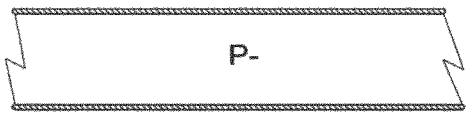

6) Oxide Mask #2
 - open contact for CE1
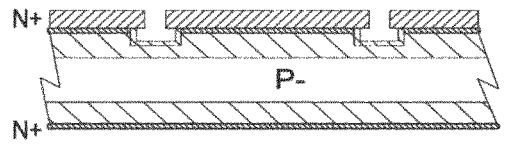

3) Oxide Mask #1
 - spin on photoresist BOE etch
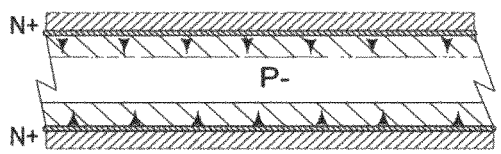

7) Aluminium Evaporation
 - self masking
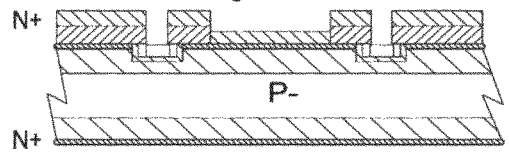

4) Wet Etch
 - KOH then Trilogy Etch    100% undercut
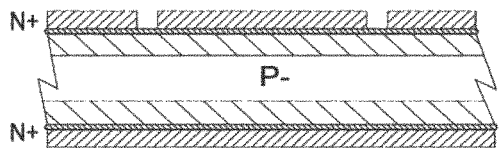

8) Aluminium Backside & Anneal
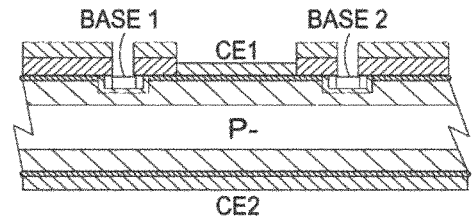

Fig.16

SINGLE MASK T2 - BJT base <100> and <110> etching method

1) Dopant Spin-On / Dip-Coat
- Apply both sides. Phosphorous

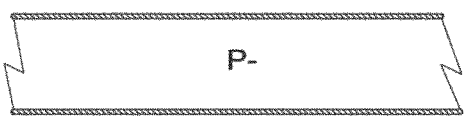

2) Grow Oxide over Phosphorous
- wet thermal oxide + drive-in of phosphorous

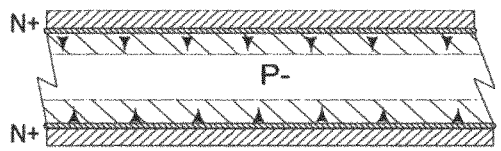

3) Oxide Mask #1
- spin on photoresist BOE etch

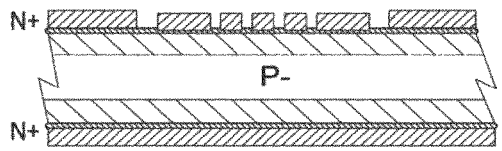

4) Wet Etch
- KOH 54 degree etch pits <110>
100% undercut <100> aligned

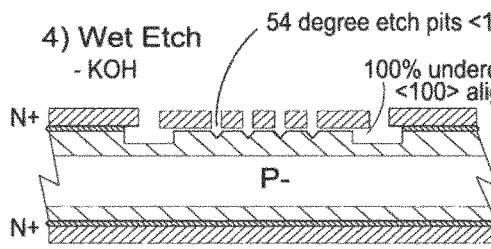

5) Boron Spin-On
+ high temperature diffuse   shallow P+

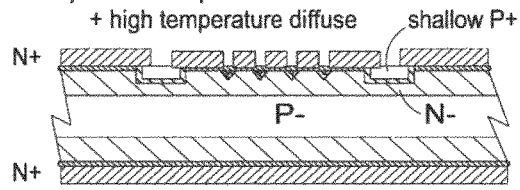

6) [No second mask needed]
- limited depth CE1 etchings are into highly N+ part of CE1 and form a degenerate (ohmic) connection

7) Aluminium Evaporation
- self masking

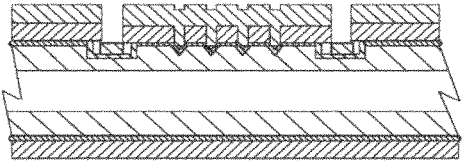

8) Aluminium Backside + Anneal

BASE    CE1

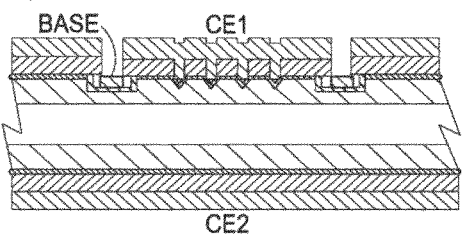

SINGULATION / BEVEL / PASSIVATION STEPS for THYRISTOR 2.0
9) Mount wafer on holder
(vacuum keeps wafer attached and sealed)
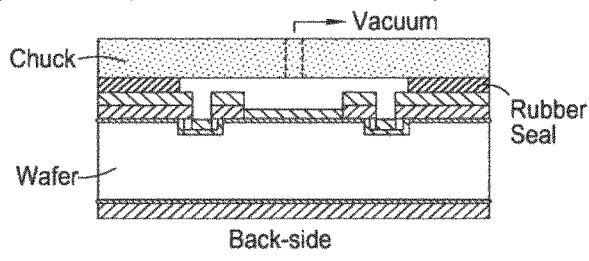
10) Grind singulation slots
(X and Y)
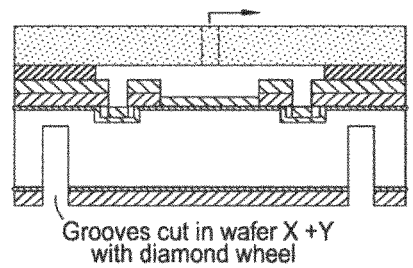
11) Anisotropic Wet Etch
(e.g. KOH solution)
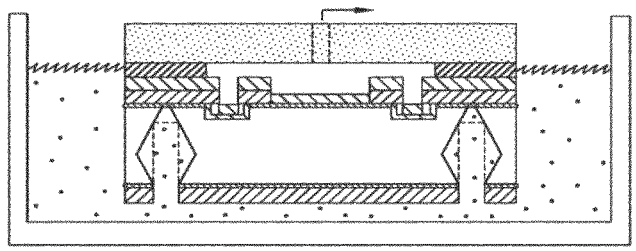
12) Passification
(CVD or ALD) A1203
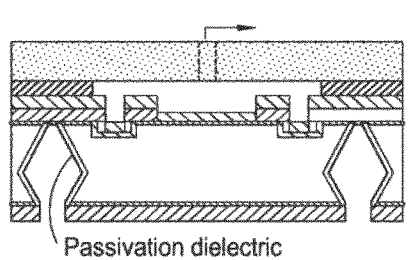
Simulation of above using wet etch atomistic simulator
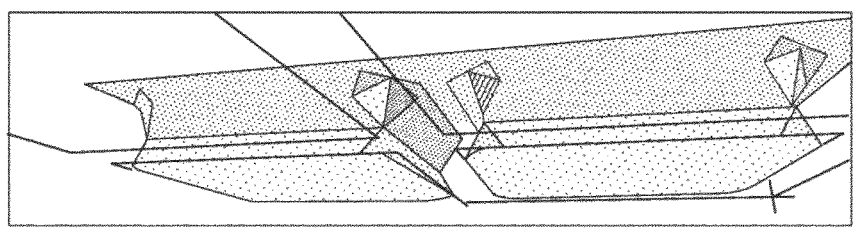
Fig. 19

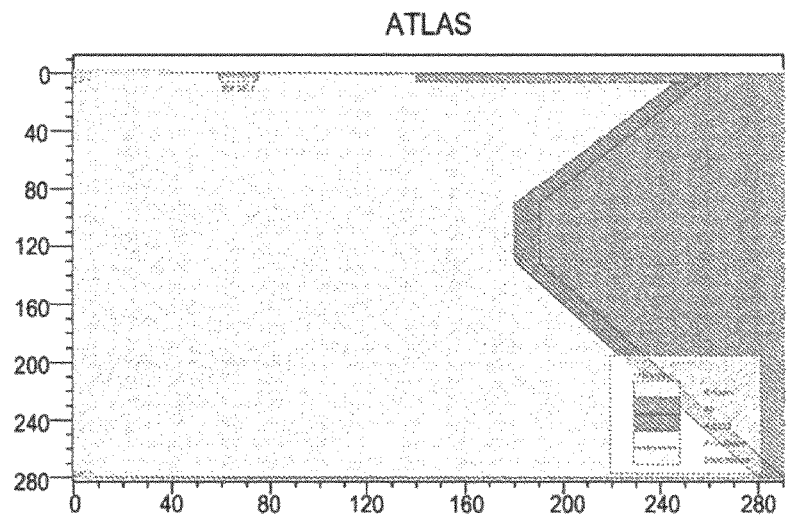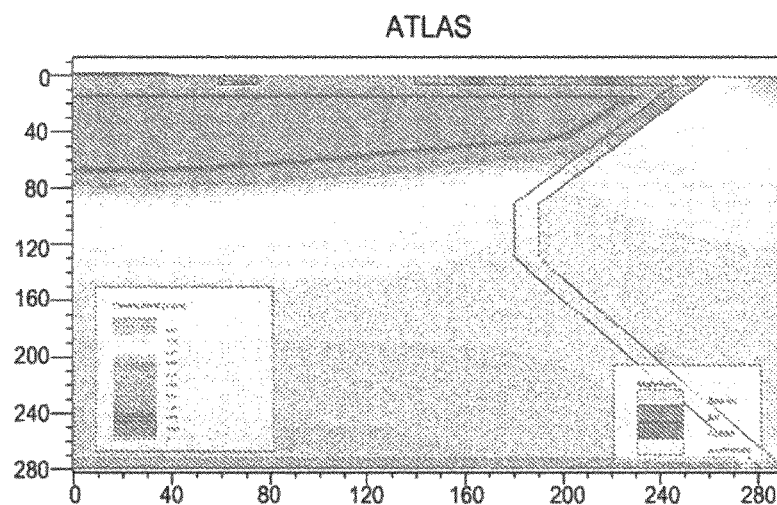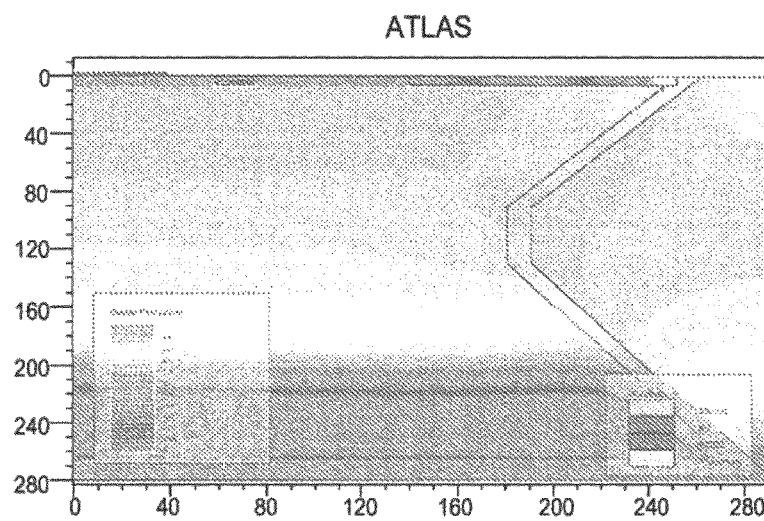
Fig. 20

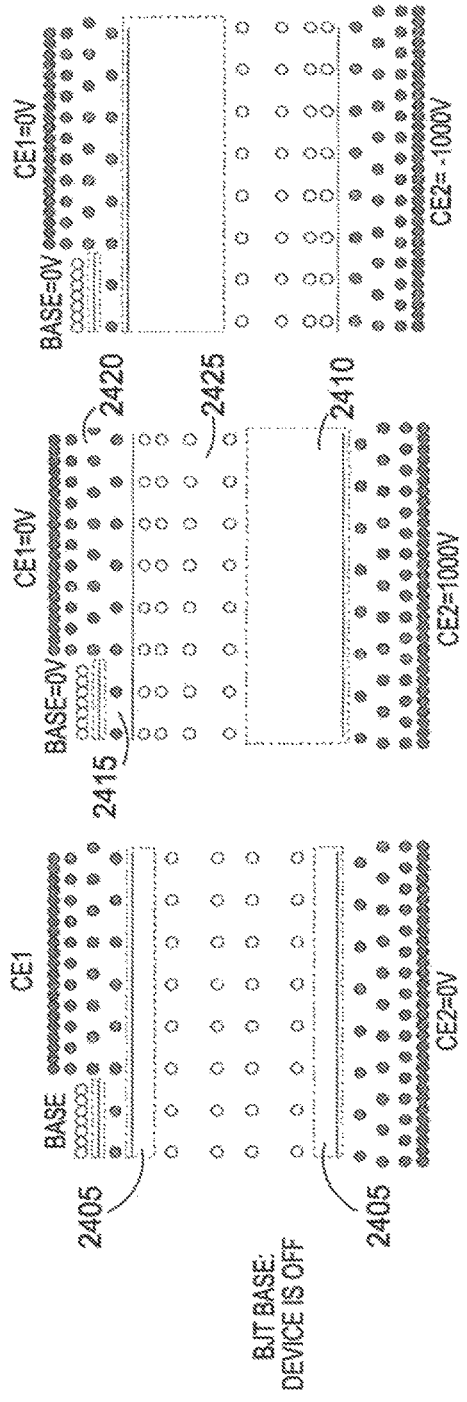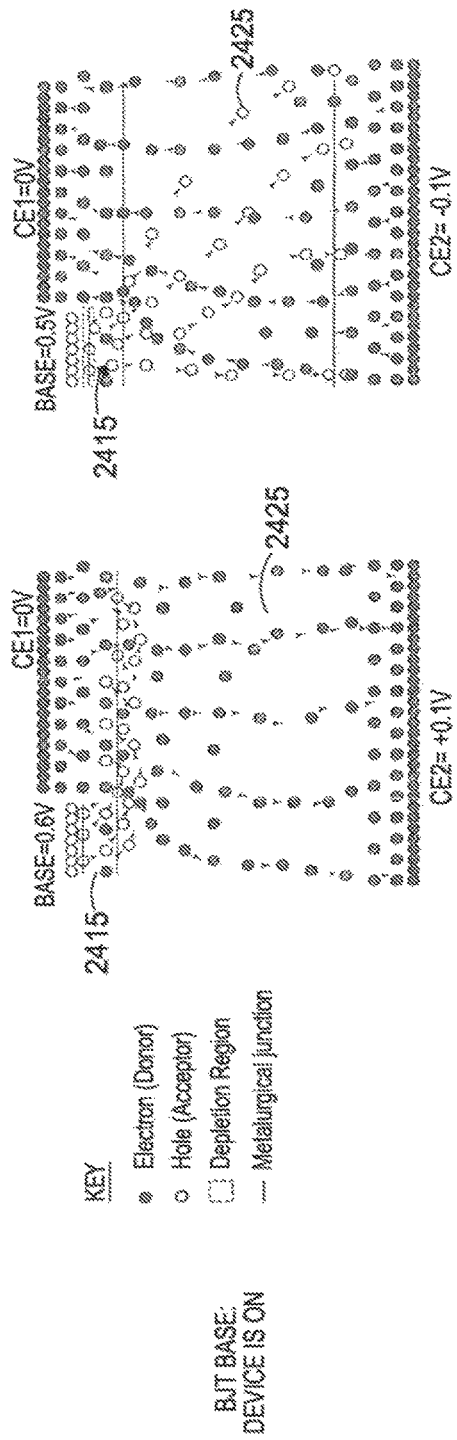

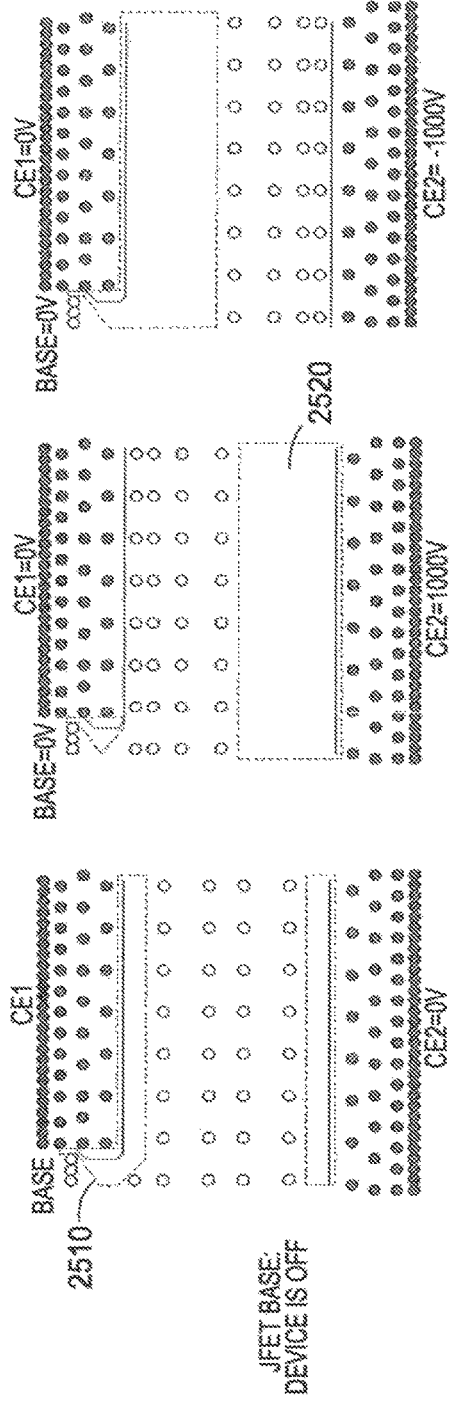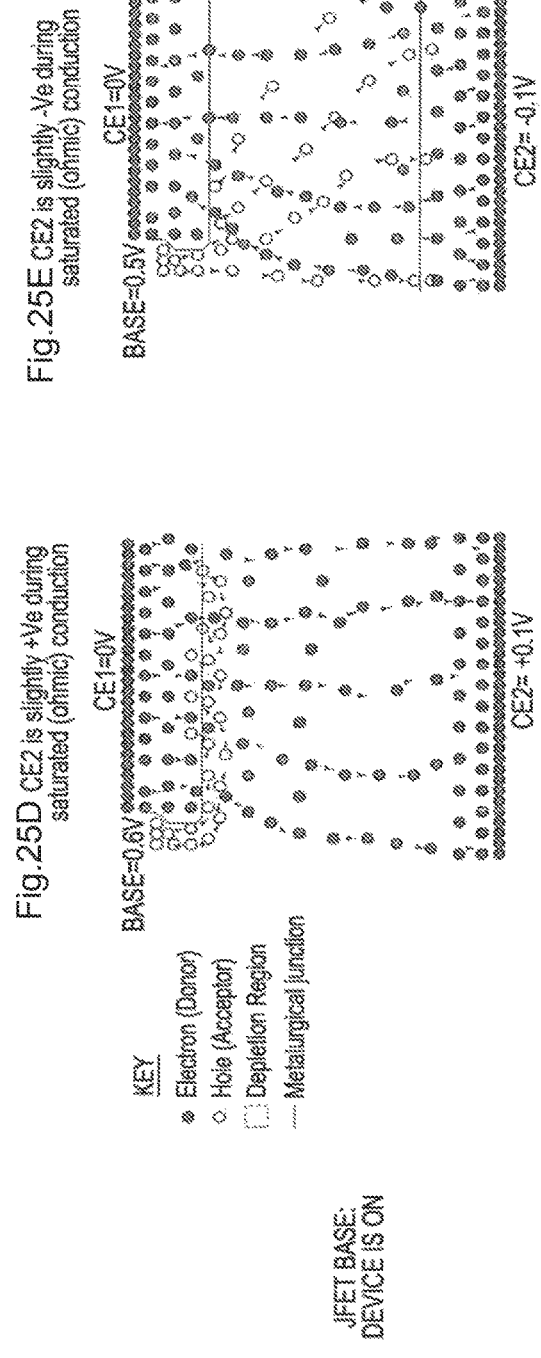

POSITIVE OPERATION
Bootstrap, Chargepumps and
Basedrive circuits
PHASEA - Inductor charging
Fig. 26A
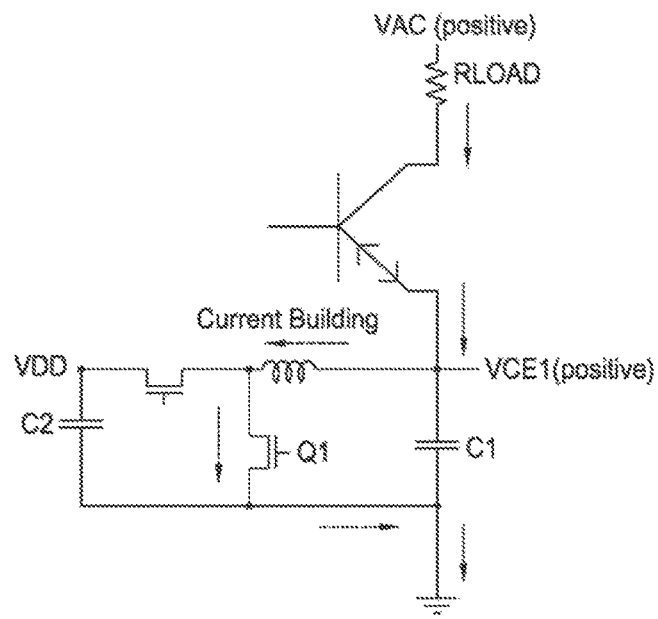
PHASEB - Boost - Inductor discharging
Fig. 26B
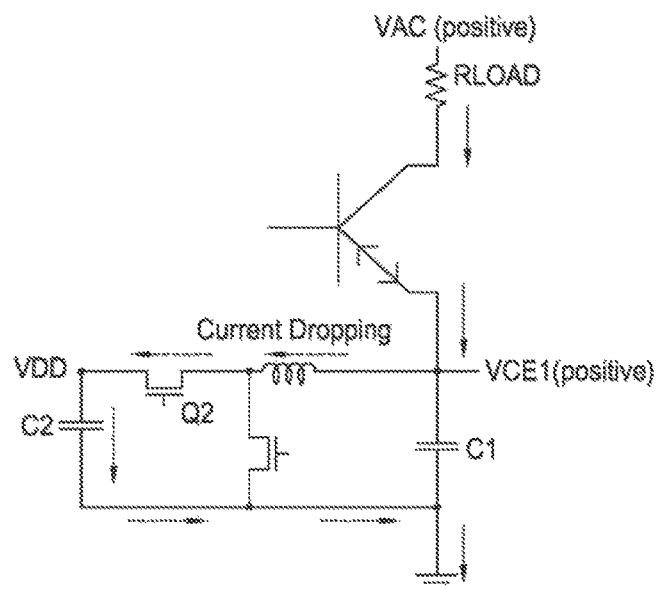
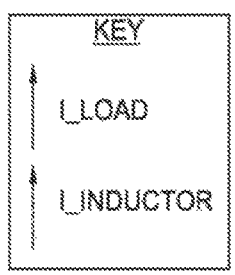

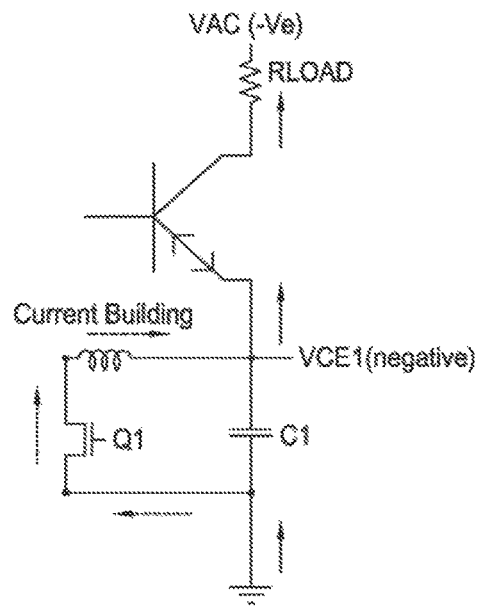
Fig. 26C
NEGATIVE OPERATION
PHASEA - Inductor charging
[Partial circuit diagram for clarity]
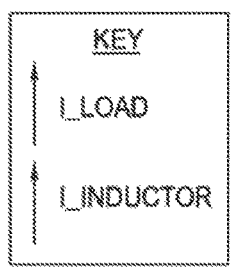
Fig. 26D
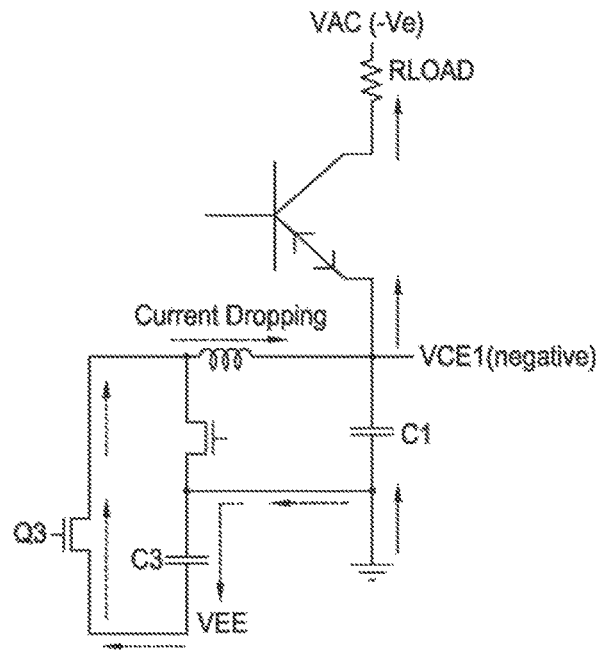
PHASEB - Boost - Inductor discharging
- negative boost stored at C3

Initial Bootstrap

Charge pumps to mirror VEE and VDD and provide VDD_extra

BASE DRIVE CIRCUIT – PWM of either VDD/GND or VEE/GND excursions

Fig.27A
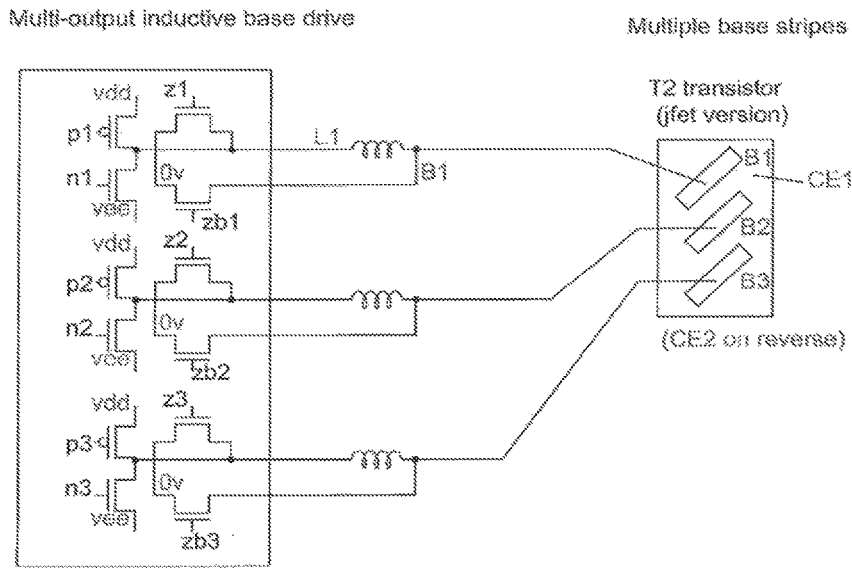
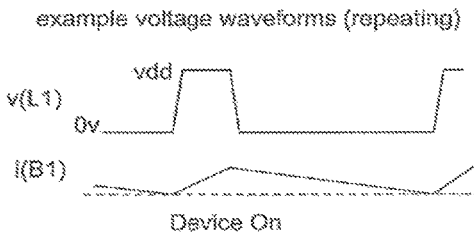
Fig.27B
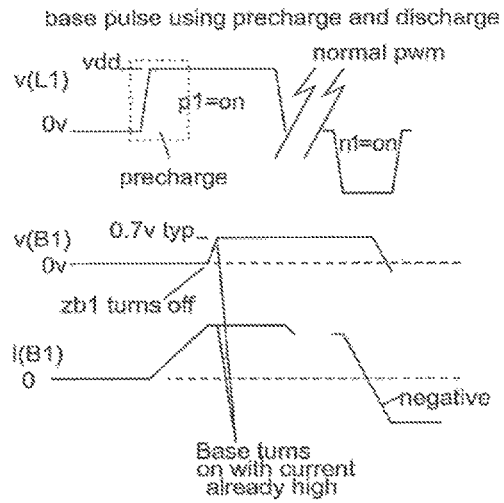
Fig.27C

IGBT 12 device "NIGBT" - AC or DC

Note: BL means buried layer and is optional

Lateral T2 device - AC or DC

N wafer, SOI burried oxide layer, pr SON (silicon on nothing)

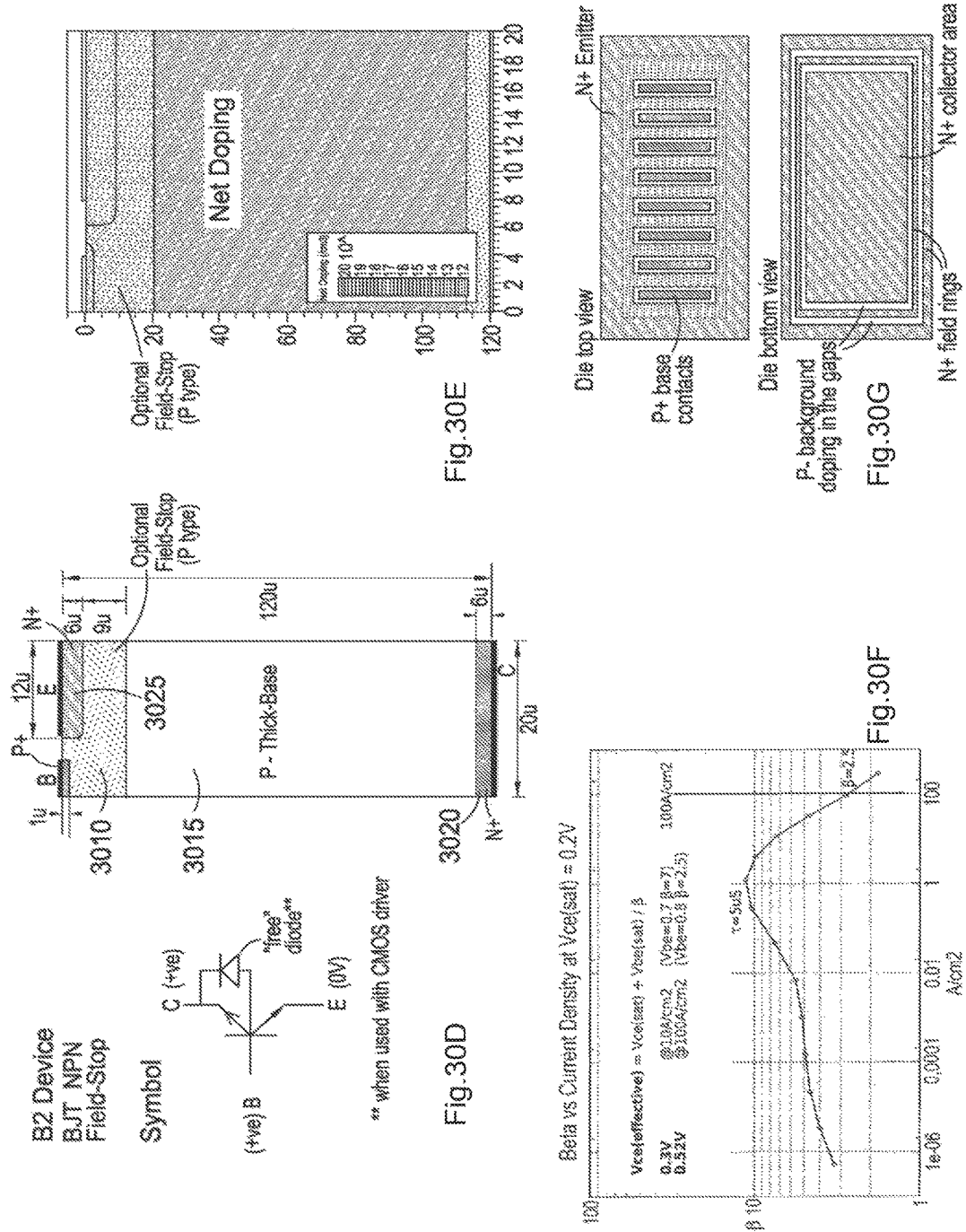

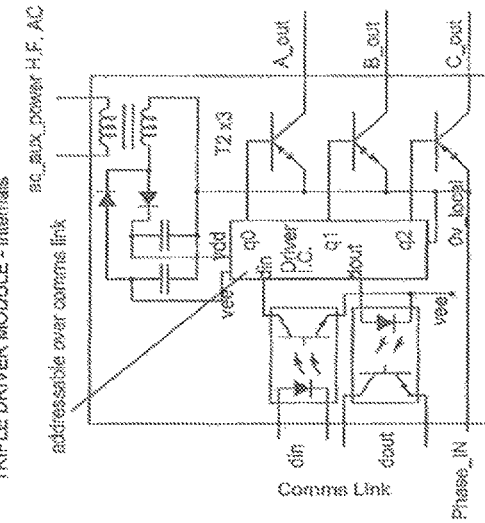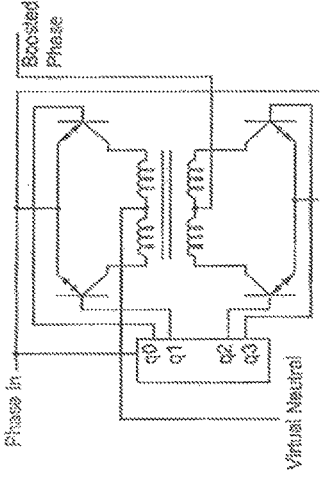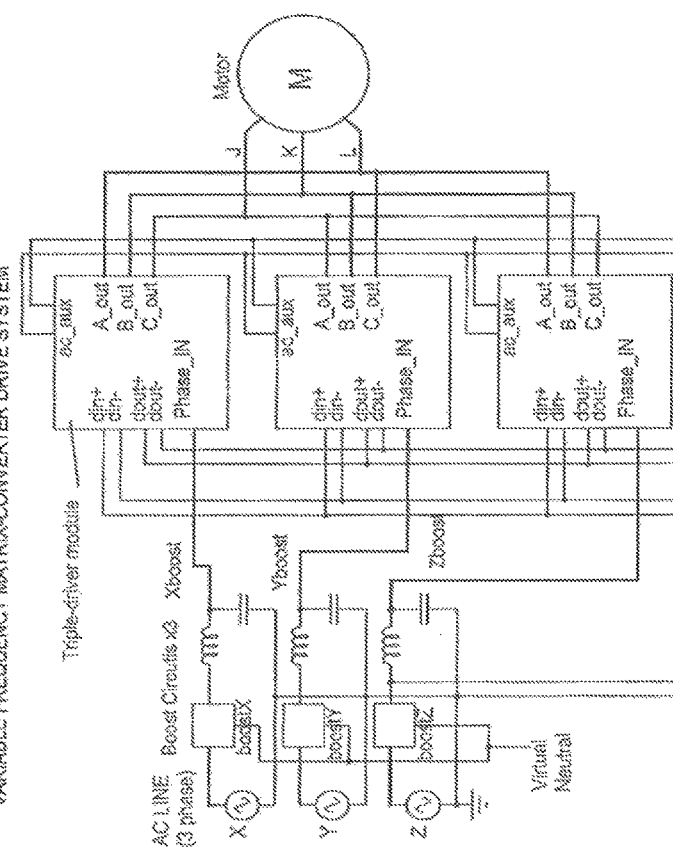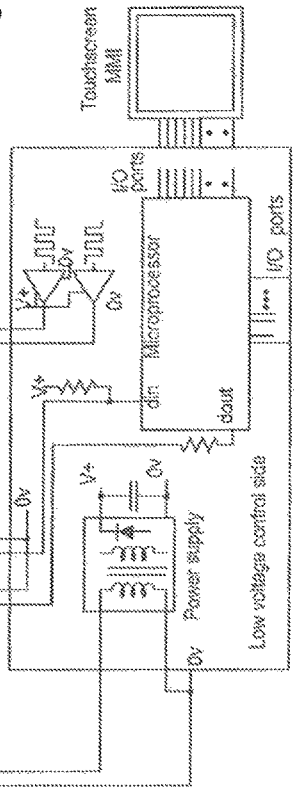
Fig.32B TRIPLE DRIVER MODULE - internals
Fig.32C BOOST CIRCUIT (AC/AC transformer - concept drawing)
Fig.32A VARIABLE FREQUENCY MATRIX-CONVERTER DRIVE SYSTEM

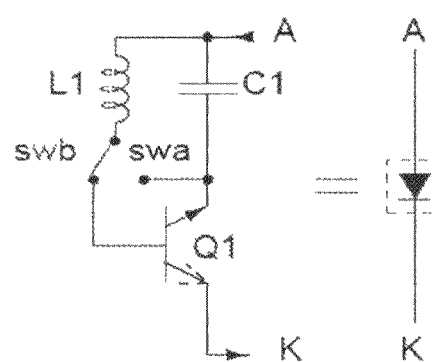
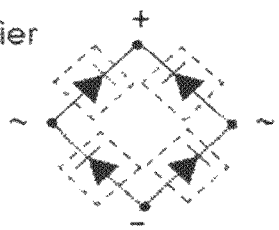
Fig.37A

CMOS die 1.5mm x 1.5mm bottom side is VSS

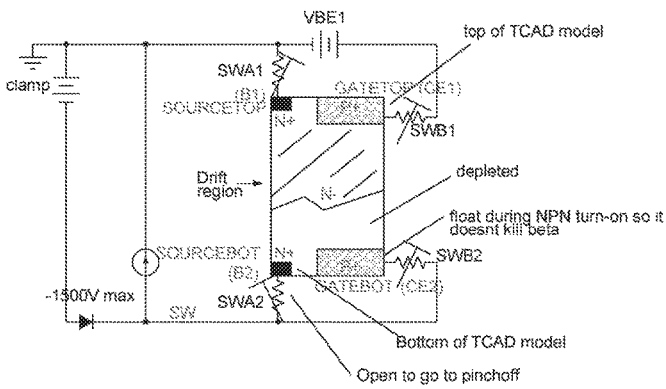
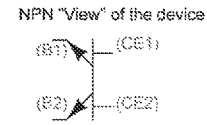
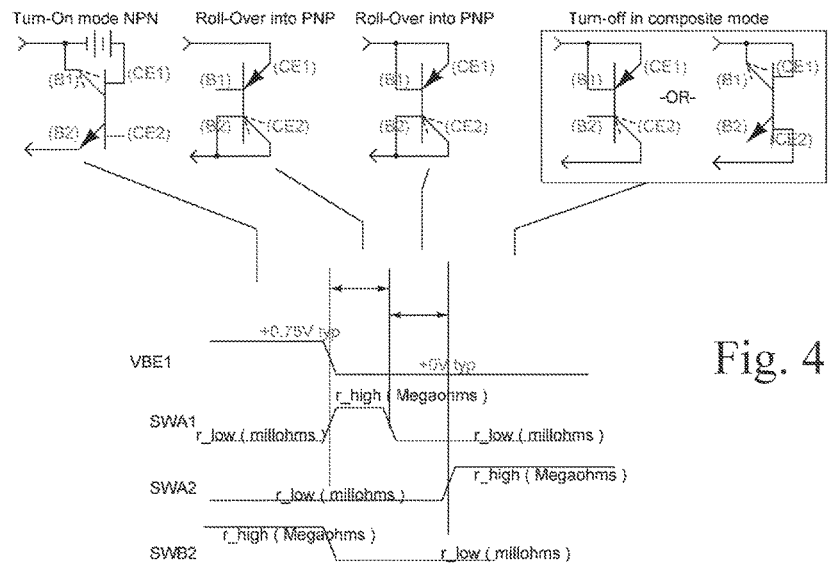
Fig. 45

BIDIRECTIONAL BIPOLAR-MODE JFET DRIVER CIRCUITRY

CROSS-REFERENCE OF THE RELATED APPLICATIONS

This application is a continuation-in-part of U.S. patent application Ser. No. 15/595,361, filed May 15, 2017, which claims priority to United Kingdom patent application number GB1621043.7 filed on Dec. 12, 2016 and is a continuation-in-part of U.S. patent application Ser. No. 14/797,498, filed Jul. 13, 2015, which is a continuation-in-part of International Application No. PCT/GB2014/050368 filed Feb. 7, 2014 which claims priority to United Kingdom patent application numbers GB1302196.9 filed Feb. 7, 2013, GB1305250.1 filed on Mar. 22, 2013, GB1309465.1 filed on May 27, 2013, GB1311298.2 filed on Jun. 25, 2013, GB1321151.1 filed on Nov. 29, 2013, GB1322177.5 filed on Dec. 16, 2013, GB1400866.8 filed on Jan. 20, 2014 and GB1412513.2 filed on Jul. 14, 2014, the entire disclosures of which are incorporated herein by reference in their entirety; this application also claims priority to United Kingdom patent application number GB1807139.9 filed May 1, 2018. Also incorporated herein by reference in their entirety are European patent application number EP85106861.9 filed Jun. 4, 1985, United Kingdom patent application numbers GB1621043.7 filed Dec. 12, 2016 and GB1711544.5 filed Jul. 18, 2017, International Application No. PCT/GB2017/053713 filed Dec. 12, 2017 which claims priority to United Kingdom patent application numbers GB1621043.7, U.S. patent application Ser. No. 14/514,878, filed Oct. 15, 2014, K. D. Hobart "Fabrication of a double-side IGBT by very low temperature wafer bonding", Power Semiconductor Devices and ICs, 1999. ISPSD '99. Proceedings, Experimental Demonstration of High-Voltage 4H—SiC Bi-Directional IGBTs, S. Chowdhury, IEEE Electron Device Letters (Volume: 37, Issue: 8, August 2016) pp 1033-1036, The bipolar mode FET: a new power device combining FET with BJT operation, Microelectronics Journal Volume 24, Issues 1-2, January 1993, Pages 61-74, and De Doncker, R. W.; Lyons, J. P.; "The auxiliary resonant commutated pole converter," Industry Applications Society Annual Meeting, 1990, Conference Record of the 1990 IEEE, vol., no., pp. 1228-1235 vol. 2, 7-12 Oct. 1990.

FIELD OF THE INVENTION

This invention relates to driving bidirectional semiconductor power transistor devices, particularly but not exclusively, to driving a double-sided, bidirectional Bipolar-Mode JFET (BMJFET).

BACKGROUND OF THE INVENTION

Double sided versions of several power transistor types are devices that are already known in the literature e.g. bidirectional double sided Silicon Carbide IGBTs as illustrated in FIG. 43, Thyristors and Triacs. Almost any vertical-power high voltage devices are capable of bidirectionality by forming control features of such a device on both the front and back surfaces and sharing a common drift region of lowly doped silicon between the two sides of silicon.

Devices built in this configuration are generally required to have a separate driver circuit to control the front and rear control electrodes and provide the gate or base voltage and/or currents for the power switch. This is because there may be of the order of 1000V potential-difference between the frontside and rearside potentials when the transistor is in the off condition—and a single integrated circuit cannot generally sustain this within a single package.

One double-side bidirectional device is described in granted U.S. Pat. No. 9,054,706 (referred to as the 'BTRAN' herein and reproduced in FIG. 42 for convenience) and in its preferred embodiment is constructed in an NPN format using a P-type wafer with N+ emitter diffusions front and back sides. The NPN configuration is preferred in this case to benefit from electron conduction for the main power path between the emitters which is 2× higher conductivity than hole conduction as would be present for a PNP version However, problems arising when using a P-type wafer include 1) Lack of suitable high-voltage P-type wafer: Only an N-type wafer can benefit from the NTD (Neutron Transmutation Doping) system that converts silicon into phosphorus at a uniform concentration giving excellent uniformity which supports >3 kV operation. 2) While in theory, there should be no problem producing a good quality P-type high voltage float-zone wafer for <3 kV operation, in practice these are not readily available because no market currently exists for them. 3) P-type wafers require different field termination structures and/or passivation requiring some development effort. 4) NPN devices constructed on P-wafers have an enhanced avalanche breakdown multiplication coefficient potentially reducing breakdown voltage. 5) For Silicon-Carbide devices, there is no known method of controlling the P-type dopants to the accuracy required for high voltage P-type wafers.

Alternatively, a PNP version of the BTRAN can be envisaged using an N-type wafer where the structure remains the same but the doping types are swapped (P→N and N→P). Unfortunately a PNP type power structure uses holes as its main carries for current and therefore has a 2:1 reduction in conductivity in the saturation resistance region vs NPN. Also, in the context of Silicon Carbide, the even more severe reduction of hole mobility in this material makes a PNP a poor choice.

SUMMARY OF THE INVENTION

The present invention seeks to avoid the use of P-type wafers while still getting the higher conduction performance of NPN operation.

According to a first aspect of the present invention, there is provided a method of driving a bidirectional semiconductor power transistor device, the method comprising: driving the semiconductor power transistor device on a high side of the transistor that is at a higher potential than an opposing low side of the transistor, the high side of the transistor comprising a P+ electrode and a N+ electrode; and selectively steering current into either the P+ electrode of the semiconductor power transistor device or into the N+ electrode of the semiconductor power transistor device on the high side of the semiconductor power transistor device.

The current being switched is that of the through current of the power switch, not an external power source, which isn't required.

In this way, their respective good turn on and good turn off loss properties may be exploited.

Sequencing various switches may enable a bipolar 'base' drive current to not require an external source of power and/or the device may be swapped ('rolled') between NPN and PNP drive.

Protection and control isolation features may be facilitated.

The method may further comprise using a controller to determine, through a voltage comparator, the side of the transistor that is at the lowest potential and driving the semiconductor power transistor device accordingly.

Wherein driving the semiconductor power transistor device may comprise driving a gate of the semiconductor power transistor device.

Wherein the controller may drive the semiconductor power transistor device by outputting a PWM signal to drive switches.

Wherein the switches may comprise low on-resistance mosfets.

Wherein the bidirectional semiconductor power transistor device may comprise a double sided bidirectional semiconductor power transistor device.

Wherein the bidirectional semiconductor power transistor device may comprise a bidirectional Bipolar-Mode JFET (BMJFET).

Wherein the bidirectional Bipolar-Mode JFET (BMJFET) may comprise a double sided bidirectional Bipolar-Mode JFET (BMJFET).

Wherein the bidirectional Bipolar-Mode JFET (BMJFET) may comprise an ultra-lateral single sided bidirectional Bipolar-Mode JFET (BMJFET).

Wherein the bidirectional semiconductor power transistor device may comprise a Silicon Carbide semiconductor construction.

Wherein the bidirectional semiconductor power transistor device may comprise N-type wafer.

According to a second aspect of the present invention, there is provided an electronic component comprising: a bidirectional semiconductor power transistor device; and a switching construction configured to drive the bidirectional semiconductor power transistor device in the manner recited in the first aspect.

Wherein the electronic component comprises an auxiliary resonant commutated pole converter auxiliary switch.

Traditional power switches are fabricated from P and N type regions of semiconductor material with metalised layers and sometimes with thin oxide layers for field-effect devices. Well known in the art are technologies such as Bipolar Junction Transistors (BJT), Junction Field Effect Transistors (JFET), Metal Oxide Field Effect Transistors (MOSFET) and Insulated Gate Biploar Transistor (IGBT) which generally switch DC voltages. Whereas Triacs, Silicon Controlled Rectifiers (SCR) as well as modified (typically back-to-back) versions of the DC switch types have been used to switch AC power. Whether fabricated on Silicon or a compound semiconductor such has Silicon Carbide (SiC) all these standard devices has one or more limitation when it comes to the common task of switching AC power on and off These limitations lead to the following problems.

Lack of AC switching ability.

Expensive semiconductor materials.

Complex semiconductor processing steps.

Inherent voltage drop on turn on (typ. 0.8 to 2.5 volts) limiting efficiency.

Lack of turn-off ability—can prevent implementation of short-circuit protection feature.

Complex, high-voltage, high current +ve and −ve base/gate drive circuitry.

High on-resistance for high voltage devices.

It is an object of the present invention to address the problems described above.

The proposed new device can be manufactured at low cost on standard BJT fabrication equipment, has inherent AC switching ability and simple drive requirements. Voltage drop at turn on can be under 100 mV at 10's of amps per cm·squared and the device can switch high voltages both on and off at will with a single polarity drive pulse without latch-up. In conjunction with a low cost microcontroller, these switches can perform efficient mains voltage switching, short circuit protection, load diagnostics and data logging functions for smart power, smart appliance systems without requiring special heatsinks or fan cooling.

A bi-directional bipolar junction transistor (BJT) structure may comprise: a base region of a first conductivity type, wherein said base region constitutes a drift region of said structure; first and second collector/emitter (CE) regions, each of a second conductivity type adjacent opposite ends of said base region; wherein said base region is lightly doped relative to said collector/emitter regions; the structure further comprising: base connection to said base region, wherein said base connection is within or adjacent to said first collector/emitter region.

It will be appreciated that the term "drift region" refers to a high voltage sustaining region including a relatively low doping concentration. During the off-state of the device, the drift region is substantially fully depleted. In a conventional high voltage BJT, the collector region generally acts as the high voltage sustaining layer. On the contrary, the thick base, drift region works as the high voltage sustaining layer. Furthermore, in the conventional high voltage Thyristor, the main current conduction generally takes place through four active semiconductor layers, e.g. cathode (N), gate (P), ndrift (N) and anode (P). By contrast, the bi directional device of the present invention provides current conduction through three active layers, i.e. first CE region, base region and the second CE region.

Broadly speaking the base connection and base region define a second transistor which enables the bi-directional BJT structure to support a high voltage in a case where, in effect, a base emitter junction of the structure is forward biased so that a high current through this junction would otherwise flow. This second transistor may either constitute a further BJT or may be a JFET, depending upon whether the base connection is within or in the vicinity of/adjacent to the first CE region, respectively. Thus where the base connection is within the first CE region the second transistor is a BJT transistor with collector/emitter terminals connected to the base connection and to the base, drift region respectively and with its base connection formed by the first CE region of the bi-directional BJT structure. Typically the first and second CE regions of the bi-directional BJT structure are heavily doped, for example in a range between $10^{18}$ cm$^{-3}$ to $10^{21}$ cm$^{-3}$ whilst the base region is lightly doped compared to the CE regions. The first CE region may extend laterally to form the base of the second transistor. Thus, for example, the first and second CE regions of the BJT structure may be $N^+$ type and the base region of the bi-directional BJT structure $P^-$, and the second transistor may then be a PNP transistor with the base region comprising a preferably relatively lower doped, $N^-$ extension of the first, $N^+$ CE region, and with collector/emitter terminals of the second transistor comprising the $P^-$ base region and the base connection. In preferred embodiments the base connection is an ohmic connection comprising a region of the first conductivity type, typically heavily doped, for example a range between $10^{18}$ cm$^{-3}$ to $10^{21}$ cm$^{-3}$, such as a $P^+$ region.

In other embodiments the second transistor is a JFET and the base connection/ohmic contact (P+) and base, drift region constitute source/drain connections of the JFET. The gate terminal of the JFET is then formed by the (heavily doped, N.sup.+) first CE region of the bi directional BJT structure. In this case the (ohmic) base connection is adjacent (which here includes slightly spaced apart from) the first CE region. The channel region of the JFET lies between the (ohmic) base connection and the base drift region so that, in effect, the JFET controls conduction between the base connection and the base drift region.

It can therefore be appreciated that where there is a forward conduction path from the base region to the second CE region the second transistor effectively stops substantially the entire voltage of what may be a high voltage across the device appearing between the base connection and the second CE region—this would otherwise drive a large current through the device which would destroy it. Instead when a forward conduction path between the base region and the second CE region is present (driven by a voltage on the base region relative to the second CE region) a forward conduction path between the base connection and the base region includes a depleted portion of the base region—that is the base connection of the structure is effectively isolated by the depleted portion of the base region. Thus during switch on, when a high voltage can appear across the first and second CE regions, substantially all this voltage can also appear between the base connection and second CE region across the base depletion region. As the device turns on the voltage across the first and second CE terminals will fall to a very low voltage and this ceases to be a potential problem.

Preferably when the base region and the base connection are of p-type and the first and second CE regions are of n-type, the following on and off states occur in the BJT structure: (1) when no voltage is applied to any terminals, the structure may be in an off-state so as to form depletion regions between said first CE region and base region and between said second CE region and base region; (2) when a positive voltage is applied to said second CE region and no voltage is applied to the first CE region and the base connection, the structure is in an off-state so as to form a depletion region between said second CE region and base region; (3) when a negative voltage is applied to said second CE region and no voltage is applied to the first CE region and the base connection, the structure may be in an off-state so as to form a depletion region between said first CE region and base region; (4) when a first positive voltage is applied to said second CE region, a second positive voltage being applied to the base connection and no voltage is applied to the first CE region, the structure is in an on-state in which majority carriers from the first CE region flow through the base region towards the second CE region, and minority carriers from the base connection are injected into the base region, the minority carriers being recombined with the majority carriers in a region adjacent the first CE region;

(5) when a negative voltage is applied to said second CE region, a positive voltage being applied to the base connection and no voltage is applied to the first CE region, the structure is in an on-state in which majority carriers from the second CE region flow through the base region towards the first CE region, and minority carriers from the base connection are injected into the base region flowing towards the second CE region, the minority carriers being recombined with the majority carriers in a region adjacent the second CE region. Here the majority carriers are electrons and the minority carriers are holes.

Preferably when the base region and the base connection are of n-type and the first and second CE regions are of p-type, the following on and off states occur in the BJT structure: (1) when no voltage is applied to any terminals, the structure may be in an off-state so as to form depletion regions between said first CE region and base region and between said second CE region and base region; (2) when a positive voltage is applied to said second CE region and no voltage is applied to the first CE region and the base connection, the structure is in an off-state so as to form a depletion region between said first CE region and base region; (3) when a negative voltage is applied to said second CE region and no voltage is applied to the first CE region and the base connection, the structure may be in an off-state so as to form a depletion region between said second CE region and base region; (4) when a first positive voltage is applied to said second CE region, a negative voltage being applied to the base connection and no voltage is applied to the first CE region, the structure is in an on-state in which holes from the second CE region flow through the base region towards the second CE region, and electron from the base connection are injected into the base region, the electrons being recombined with the holes in a region adjacent the second CE region; (5) when a negative voltage is applied to said second CE region, a negative voltage being applied to the base connection and no voltage is applied to the first CE region, the structure is in an on-state in which holes from the first CE region flow through the base region towards the second CE region, and electrons from the base connection are injected into the base region flowing towards the first CE region, the electrons being recombined with the holes in a region adjacent the first CE region.

Conveniently, in some preferred embodiments the base connection is recessed into a surface of the structure—conveniently an ohmic connection of the first conductivity type can be formed within a recessed portion of the first CE region. Conveniently the recess may be sufficient to also incorporate a metal connection to the ohmic for example P.sup.+ region. It will be appreciated that in the proposed device the base region may be ohmic in nature so as to drive the main transistor (not the second transistor) comprising the first CE region, base region and second CE region into the saturation region in which both saturation diffusion and drift current apply.

It will be appreciated that the labelling of the first and second CE regions is arbitrary. Although In some preferred embodiments the device is a vertical device, a lateral device may also be fabricated. For example the first and second CE regions may be fabricated in a common layer, displaced laterally from one another, separated by a base region which runs beneath the first and second CE regions and laterally, joining these regions to one another.

In some preferred embodiments the base, drift region is wider in a direction between the ends of the region adjacent the CE regions than each CE region. However in some very high voltage devices the CE regions themselves may be relatively wide, comprising a long (deep) diffusion. In embodiments a current carrying capability of a connection path between the base connection and the second CE region is less than a current carrying capability of a connection path between the first and second CE regions—that is the main conduction path through the device is between the first and second CE regions, the base connection merely providing a relatively small base current. It will further be appreciated that the structure is non-latching, that is a connection between the first and second CE regions is switched off on removal of a voltage from the base connection (without requiring a current between the first and second CE regions to go to zero).

A bipolar junction transistor (BJT) structure may comprise: a base region of a first conductivity type, wherein said base region constitutes a drift region of said structure; first and second collector/emitter (CE) regions, each of a second conductivity type adjacent opposite ends of said base region; wherein said base region is lightly doped relative to said collector/emitter regions; the structure further comprising: a base connection to said base region, wherein said base connection is within or adjacent to said first collector/emitter region and a buried layer of the second conductivity type disposed between the second CE region and the base region.

This bipolar junction transistor structure could be termed as a non-insulated gated bipolar junction transistor (NIGBT). It will be appreciated that the NIGBT devices preferably operate in DC applications in which the buried layer can help to sustain high voltage due to the punch-through structure. The NIGBT structure is capable of operating in AC mode as well. However, in the AC mode, voltage sustaining capability can be limited in one direction (or during a DC application) as the device try to deplete the highly doped buried layer.

A bipolar junction transistor (BJT) structure may comprise: a base region of a first conductivity type, wherein said base region constitutes a drift region of said structure, the drift region being a reverse voltage sustaining region; an emitter region of a second conductivity type; a collector of a second conductivity type, the collector and emitter being adjacent opposite ends of said base region; wherein said base region is lightly doped relative to said collector and emitter regions; the structure further comprising: a base connection region of the first conductivity type formed adjacent to said emitter region and a field stop layer of the first conductivity type formed between the emitter region and the base region, the base connection being within the field stop layer.

The doping concentration of the field stop layer may be less than that of the base connection. The thickness of the field stop layer may be more than that of the base connection. The BJT structure may be configured such that a diode is formed between the collector and base region. The diode may be configured to operate as a reverse conducting diode when driven by a driver circuit. The driver circuit may include a software controlled driver which can allow the BJT structure to prove the free-wheeling diode characteristics. The software controlled driver may be configured such that the free-wheeling virtual diode may not allow large reverse voltage to occur.

The invention may provide a driver circuit operatively connected to the BJT structures above, the driver circuit comprising a first PWM controller and a second PWM controller, the first and second PWM controllers being coupled to one another, wherein the first PWM controller is capable of controlling a low voltage transistor and the second PWM controller is a high-frequency converter. The invention may also provide a driver circuit operatively connected to a standard BJT structure—thus it would be apparent that the driver circuit described in this specification are not limited to the proposed BJT structures disclosed but they are applicable to standard BJT structures as well.

The second PWM controller may be a buck converter using an inductor. The cross modulation of the first and second PWM controllers across a base drive inductance may allow a continuous dynamic current control of the BJT structure with high speed on and off capability. The frequency of the second PWM controller may be such that the off time is of substantially similar order compared to the minority carrier (e.g. electron) lifetime ensuring that conductivity of the BJT structure remains substantially constant during the period controlled by the second PWM controller. The second PWM controller may be a phase offset controller. The driver circuit may further comprise a third PWM controller which is a phase offset controller, wherein the second and third phase offset controllers each drive an inductor with a common point on a base connection terminal of a transistor. The first PWM controller may be coupled to the base connection terminal of the transistor so as to drive the transistor. The multiphase offsets of the second and third PWM controllers create a relatively high effective frequency to match a reduced minority-carrier lifetime of high speed transistors. The combination of the driver circuit and the BJT structure may be configured to provide a reverse conducting diode.

When the base region is of p conductivity type, the driver may be configured to detect a negative current of the base so that holes can be pulled out from the junction between the first CE region and base to clamp a negative excursion.

The current rating of the base region substantially equal to that of the collector or emitter so as to yield a reverse free-wheeling diode of substantially equal current rating to the forward rating.

The base region may be configured to be clamped to ground using a MOSFET from the driver. The base current may be produced by the driver circuit to result in a reverse bias switch on transistor action so as to reduce the voltage drop in a current flow path below a normal voltage drop of a diode.

A computer program product comprising a computer readable medium in which a computer program is stored, the computer program comprising computer readable code which, when run by a controller of a driver circuit, causes the driver circuit to operate as the driver circuit above, wherein the computer program is stored on the computer readable medium.

When the controller is configured to detect a voltage of the BJT structure in an off-state, the computer program product may configured to turn on the BJT structure to emulate a reverse conducting diode action.

In a related aspect the invention provides a driver circuit, in particular for a structure as described above, comprising a voltage sensing resistor and a current sensing resistor each coupled to one of the CE regions (optionally the same region). A microcontroller is coupled to the resistors to receive respective voltage sensing and current sensing signals. In embodiments the microcontroller is configured to provide a PWM (pulse width modulation) output for controlling a current into the base connection of the structure, via an inductance. This arrangement facilitates accurate control of the device along a defined operating path. The voltage across the device and current through the device are sensed and the current into the base connection may then be adjusted to move the device between a switched-on and a switched-off configuration in a controlled manner.

In a further aspect the invention also provides a circuit breaker comprising a first, power semiconductor switching device and a driver circuit, wherein said circuit breaker has two power switching terminals, and further comprises a power supply, and a controller for said power semiconductor switching device powered by said power supply, wherein said power supply is coupled in series with said first power semiconductor switching device between said power switching terminals to derive a power supply from said terminals whilst said power semiconductor switching device is on, and wherein said power supply comprises a second switching device coupled in series with said first power semiconductor switching device, between said power switching terminals, such that the circuit breaker is operable without a separate power supply.

In embodiments, by employing a second switching device in series with the first the relatively high current through the power switching device when on can be leveraged with only a very small voltage drop to generate sufficient power for driving a base current into the device. It will be appreciated that when the power switching device is on the voltage drop across the two power switching terminals should be as low as practicable, and by employing a second, low voltage switching device in series with the first a reasonable power, for example of order 1 watt can be achieved with a very small voltage drop, for example of order 0.1 volts, without wastage in, for example, a lead resistor. In preferred embodiments the power switching device is a high voltage device and the second device is a low voltage device, in particular forming part of the input stage of a DC-to-DC converter. In this context a power device refers to a high voltage device which typically operates with a voltage in the range greater than 100 volts, 500 volts or 1000 volts and or at currents at greater than 1 amp, 10 amps or 100 amps. A low voltage device typically operates at a voltage of less than 50 volts, in embodiments less than 10 volts.

An aspect of the present invention provides, a method of etching a substrate, wherein the substrate is a silicon substrate or a substrate having a silicon surface, is disclosed. The method includes placing the substrate in a container, wherein the substrate is a N-type substrate; providing a volume of an acid solution in the container, wherein the acid solution serves as an insulator; and drilling, using one or more needles supplied with a voltage, one or more holes on the surface of the substrate to locally invert the N-type substrate to a P-type substrate, wherein the voltage applied on the surface of the substrate anodically etches the surface of the substrate to create the one or more holes by surface inversion.

It is preferable that the circuit breaker can be installed either way around in a circuit and thus the direction of current flow between the power switching terminals may not be known. In preferred embodiments, therefore, the power supply is a switched mode power converter comprising a plurality of low voltage switching devices arranged to charge and discharge an energy storage component, (capacitor and/or inductor) so that power for the controller is provided with the same plurality no matter which way round the circuit breaker is connected into each circuit. Thus the power supply may further comprise a sensor to sense a direction of current flow for controlling the plurality of switching devices according. Broadly speaking the switches are arranged so that whichever the direction the current flows a positive side of the energy storage component delivers power to a positive line for the controller, and vice versa. This can be achieved by sensing the direction of current flow through the circuit breaker in order to determine which of the two terminals is positive with respect to the other, so that the switches can be controlled accordingly. Preferably the power supply also includes an arrangement to ensure proper start-up of the circuit breaker. In embodiments this comprises a reservoir capacitor charged by leakage current through the power switching device when the power switching device is off In embodiments the power supply from this leakage current is sufficient to operate a microcontroller or other circuit to sense the direction of current flow through the circuit breaker, i.e. the orientation in which a circuit breaker is connected, before the power switching device has switched on, and thus when the device switches on can automatically start up the switched mode power converter to provide power of the correct polarity to the controller.

The invention further provides a circuit breaker operably connected to the BJT structure above, the circuit breaker comprising: an input capacitor connected to a CE region; an inductor coupled to the input capacitor; first and second switching devices coupled to the inductor; a second capacitor coupled to the second switching device; and a pulse width modulation (PWM) controller configured to control the first and second switching devices. It will be appreciated that the circuit breaker can be operably connected to a standard BJT structure.

When a positive voltage is applied to the CE terminal, the first switching device may be configured to charge the inductor, and the second switching device may be configured to charge the second capacitor. The charging of the inductor may be controlled by controlling the duty cycles of the PWM controller. When a negative voltage is applied to the first CE terminal, the second switching device and the second capacitor may be disconnected from the circuit breaker.

The circuit breaker above may further comprise a third switching device and a third capacitor which are coupled to the first switching device, the inductor and the first capacitor. The third switch may be configured to charge the third capacitor.

The invention may further provide a bootstrap circuit operatively connected to the BJT structure above and operatively connected to the circuit breaker above, the bootstrap circuit comprising a first diode coupled with the second capacitor of the circuit breaker and a second diode coupled with the third capacitor of the circuit breaker, wherein the bootstrap circuit is configured to store positive or negative leakage current in the first and/or third capacitors through the first and second diodes so as to turn on the bi-direction BJT structure. It will be appreciated that the bootstrap circuit breaker can be operably connected to a standard BJT structure.

The bootstrap circuit may further comprise a bleed resistor to provide sufficient current to turn on the BJT structure if there is inherent leakage current present in the BJT structure.

The bootstrap circuit may further comprise an auxiliary tap circuit switching on around the zero-crossing times so as to power the BJT structure.

The invention may further provide a driver circuit operatively connected to a plurality of BJT structures above, wherein each BJT structure is disposed side by side on a chip and wherein the driver circuit comprises a plurality of independent PWM drivers each independently driving the base connection of each BJT structure through an inductor. Each PWM driver may be configured to control current to the base connection and switching time of the BJT structure independently. It will be appreciated that the driver circuit can be operably connected to a plurality of standard BJT structures.

Each PWM driver may be configured to control the current during an on-state of the BJT structure using a discontinuous current inductor drive.

The discontinuous current mode may occur when an off-time from the PWM driver is sufficiently long so that the inductor current decreases to zero.

The invention may further provide a driver circuit operatively connected to a BJT structures above or to a standard BJT structure, the driver circuit comprising a resistive digital to analogue controller (DAC) for controlling the current of the base of the BJT structure. The DAC may be configured to control the base current of the BJT structure according to a control program which is reactive to measured operating conditions of the BJT structure.

The invention may further provide a matrix converter comprising an array of BJT structures above, the matrix converter further comprising a control circuit comprising a plurality of channels which are configured to control the switching of the array of BJT structures.

The invention may further comprise a relay circuit for a low leakage current application, the relay circuit comprising the BJT structure above or a standard BJT structure, the relay circuit further comprising a load resistor and a switching device arranged parallel to the load resistor, wherein the switching device is configured to bypass any leakage current from the BJT structure around the load resistor during switching off operation.

The relay circuit may further comprise a further switching device coupled with the load resistor, the further switching device being configured to obtain Pico-ampere level leakage current into the load resistor.

The invention may further provide a driver chip operatively connected to a BJT structure above or to a standard BJT structure and may comprise the driver circuit above, wherein the driver chip is configured to apply pre-programmed coefficients determined after manufacturing the components of the driver chip.

The first PWM controller may be configured to vary phases for different regions of the BJT structure based on calibration parameters of the driver chip so as to allow a large die including the BJT structure to turn on and/or off to compensate for the difference in for example carrier lifetime and/or doping levels.

The driver chip and other circuit component including base inductors and storage capacitors may be mounted directly on top of a wafer comprising the BJT structure.

According to a further aspect of the present invention, there is provided a method of manufacturing a bipolar junction transistor (BJT) structure, the method comprising: forming a base region of a first conductivity type, wherein said base region constitutes a drift region of said structure; forming first and second collector/emitter (CE) regions, each of a second conductivity type adjacent opposite ends of said base region, wherein said base region is lightly doped relative to said collector/emitter regions; and forming a base connection to said base region, wherein said base connection is within or adjacent to said first collector/emitter region.

The method may further comprise: etching the first collector/emitter region; and forming a diffusion region in the etched region. The method may further comprise filling polysilicon in a trench to form the first collector/emitter region and/or to form a thin interfacial oxide region.

The method may further comprise applying an anisotropic wet chemical etching of the first collector/emitter region with artwork aligned at either zero degrees or 45 degrees to form a simultaneous undercut of an oxide and a self-terminating V-groove etch of contact holes.

The method may further comprise applying the anisotropic wet etching to form a bevel etch to control the edges of the BJT structure. The method may further comprise applying an electric field grading technique to reduce minority carrier injection from the collector/emitter regions. The method may further comprise forming a three dimensional or stacked structure so as to give higher power ability and/or higher sensitivity and lower conduction losses.

The method may further comprise forming a recessed BASE contact so that the electrodes on collector/emitter regions can form the three dimensional or stacked structure.

According to a further aspect of the invention, there is provided an active rectifier comprising:

a power bipolar junction transistor (BJT), having a first and second input/output (I/O) connections and a base connection;

first and second rectifier terminals, wherein said first I/O connection of said BJT is coupled to said first rectifier terminal, wherein said second I/O connection of said BJT is coupled to said second rectifier terminal;

a driver oscillator to provide a two phase drive waveform having a first (on) portion and a second (off) portion;

at least one controllable switch controlled by said driver oscillator and coupled between said second rectifier terminal, said base connection of said BJT and said second I/O connection of said BJT, to selectively route current from said second rectifier terminal between said second I/O connection of said BJT and said base connection of said BJT;

wherein said driver oscillator controls said controllable switch to route said current from said second rectifier terminal between said base and second I/O connections of said BJT in proportion of a ratio of durations of said first and second portions of said drive waveform.

The second I/O connection of said BJT may be coupled to said second rectifier terminal via a filter, and wherein said filter may comprise a capacitor such that a connection between said second I/O connection of said BJT and said second rectifier terminal is via said capacitor.

The active rectifier may further comprise an inductance between said second rectifier terminal and said base connection said BJT to store current for said base connection whilst said controllable switch is routing current from said second rectifier terminal away from said base connection of said BJT.

The controllable switch may comprise a first controllable switch coupled between said second rectifier terminal and said second I/O connection of said BJT and a second controllable switch coupled between said second rectifier terminal and said base connection of said BJT and; and wherein the two phase drive waveform may comprises first and second waveforms, said first waveform having an on portion corresponding to said first portion of said two phase drive waveform, said second waveform having an off portion corresponding to said second portion of said two phase drive waveform, wherein said first waveform controls said first controllable switch and said second waveform controls said second controllable switch.

The controllable switch may comprise a first controllable switch coupled between said second rectifier terminal and said second I/O connection of said BJT and a second controllable switch coupled between said second rectifier terminal and said base connection of said BJT and; and wherein the two phase drive waveform may comprise first and second waveforms, said first waveform having an off portion corresponding to said second portion of said two phase drive waveform, said second waveform having an on portion corresponding to said first portion of said two phase drive waveform, wherein said first waveform controls said first controllable switch and said second waveform controls said second controllable switch.

The active rectifier may further comprise a boost converter to boost a voltage drop across one or more circuit elements coupled between said rectifier terminals to provide a power supply for said drive oscillator.

The boost converter may be coupled across one or more circuit elements coupled in an emitter circuit of said BJT The active rectifier may further comprise an inductance between said second rectifier terminal and said base connection said BJT to store current for said base connection whilst said controllable switch is routing current from said second rectifier terminal away from said base connection of said BJT; and wherein said boost converter may comprise said inductance, to boost said voltage drop, and said driver oscillator such that said driver oscillator, and inductance together with said at least one controllable switch form a boost converter to power said driver oscillator.

The active rectifier may be configured to use leakage current through said BJT, or a high voltage current source device, or a resistor, to provide power to bootstrap said driver oscillator of said booster converter.

The on portions of said first and second waveforms are non-overlapping such that there is a dead time between said on portions; the active rectifier may further comprise a power harvesting device or Schottky diode coupled to a connection between said second rectifier terminal and said second I/O terminal of said BJT to harvest power from said voltage drop during said dead time.

The first I/O connection of the BJT may be a collector connection and the second I/O connection of said BJT may be an emitter connection.

The ratio of durations of the first portion to the second portion of the two phase drive waveform may be less than 1:1.

BRIEF DESCRIPTION OF THE EMBODIMENTS

These and other aspects of the invention will now be further described, by way of example only, with reference to the accompanying figures in which:

FIG. 1A illustrates an example dual-base version of a vertical cross-sectional structure of a double-gated device;

FIG. 1B illustrates a single-base version of a vertical cross-sectional structure of a double-gated device;

FIG. 1C illustrates an alternative single-base version of a vertical cross-sectional structure of a double-gated device;

FIG. 2A illustrates a drive circuit used for the devices of FIG. 1;

FIG. 2B illustrates a drive circuit used for the bi-directional BJT devices of FIG. 1;

FIG. 2C illustrates a power scavenging circuit;

FIG. 5A is a schematic symbol of a BJT device which illustrates a P-channel JFET being effectively in series with the base terminal;

FIG. 5B is a schematic symbol of a BJT device which illustrates non-encroachment of donor atoms in channel;

FIG. 5C is a schematic symbol of a BJT device which illustrates encroachment of donors in channel;

FIG. 12A illustrates structures which enable an either/or choice of wireless/wired and has an additional advantage of furnishing power to the attached device in wired-mode without having to break the wires when a node is attached to the network;

FIG. 12B shows a hinged magnetic transformer for use with the structures of FIG. 12A;

FIG. 12C shows a terminator for use with the structures of FIG. 12A;

FIG. 13A is a schematic bootstrap/boost voltage circuit diagram which shows a +Ve voltage conduction of the AC transistor;

FIG. 15 illustrates process steps of a bi-directional BJT device (JFET-base transistor) using oxide only;

FIG. 16 illustrates process steps of a bi-directional BJT device (BJT-base transistor) using oxide only;

FIG. 17 illustrates the processing steps of manufacturing the bi-directional device (BJT base transistor) using a single mask in {100} and {110} etching methods;

FIG. 19 illustrates singulation/bevel/passivation steps for the bi-directional BJT device;

FIG. 20 illustrates electric field distributions in a bi-directional device;

FIG. 24A is an illustration of a bi-directional BJT device (BJT PNP base) in an off state with zero volts in terminals;

FIG. 24B shows the device of FIG. 24A in an off state having CE2 with a positive voltage and other terminals at zero volt;

FIG. 24C shows the device of FIG. 24A in an off state having CE2 with a negative voltage and other two terminals still at zero volt.

FIG. 24D shows the device of FIG. 24A in an on-state with CE2 at +0.1V, CE1 at 0V and BASE at +0.6V;

FIG. 24E shows the device of FIG. 24A in an on-state with CE2 at −0.1V.

FIG. 25A illustrates the off-state operations of an alternative bi-directional BJT device in which all terminals are in zero voltage;

FIG. 25B illustrates the off-state operations of the device of FIG. 25A having CE2 with a positive voltage and other terminals at zero volt;

FIG. 25C illustrates the off-state operations of the device of FIG. 25A having CE2 with a negative voltage and other two terminals still at zero volt;

FIG. 25D illustrates the on-state operations of the device of FIG. 25A having CE2 at +0.1V, CE1 at 0V and BASE at +0.6V;

FIG. 25E illustrates the on-state operations of the device of FIG. 25A having CE2 at −0.1V.

FIG. 26A illustrates an arrangement of switches which operate in two phases during positive inductor charging phase;

FIG. 26B illustrates the arrangement of FIG. 26A during positive inductor discharging phase;

FIG. 26C illustrates the arrangement of FIG. 26BA during negative inductor charging phase;

FIG. 26D illustrates the arrangement of FIG. 26A during negative inductor discharging phase;

FIG. 27A illustrates a driver circuit, specifically a multi-output inductive base drive;

FIG. 27B illustrates example voltage waveforms for use in the driver circuit of FIG. 27A;

FIG. 27C illustrates base pulse using pre-charge and discharge for use in the driver circuit of FIG. 27A;

FIG. 30D illustrates a cross section and equivalent circuit of an alternative IGBT;

FIG. 30E illustrates the doping profile of the device of FIG. 30D);

FIG. 30F illustrates Beta vs Current Density waveform;

FIG. 30G illustrates a top view and bottom view of a full die according to the devices above;

FIG. 32A shows a variable frequency matrix converter drive system topology for low cost and high reliability using the transistor structures and driver techniques described in the previous embodiments in which;

FIG. 32B illustrates triple driver module for the system of FIG. 32A;

FIG. 32C illustrates a boost circuit for the system of FIG. 32A.

FIG. 37A illustrates an active diode concept;

FIG. 45A illustrates a transient test circuit;

FIG. 45B illustrates symbols appropriate for Bipolar operation;

FIG. 45C illustrates a biplolar turn off sequence for high performance switching;

DETAILED DESCRIPTION OF THE EMBODIMENTS

Figure 3A:
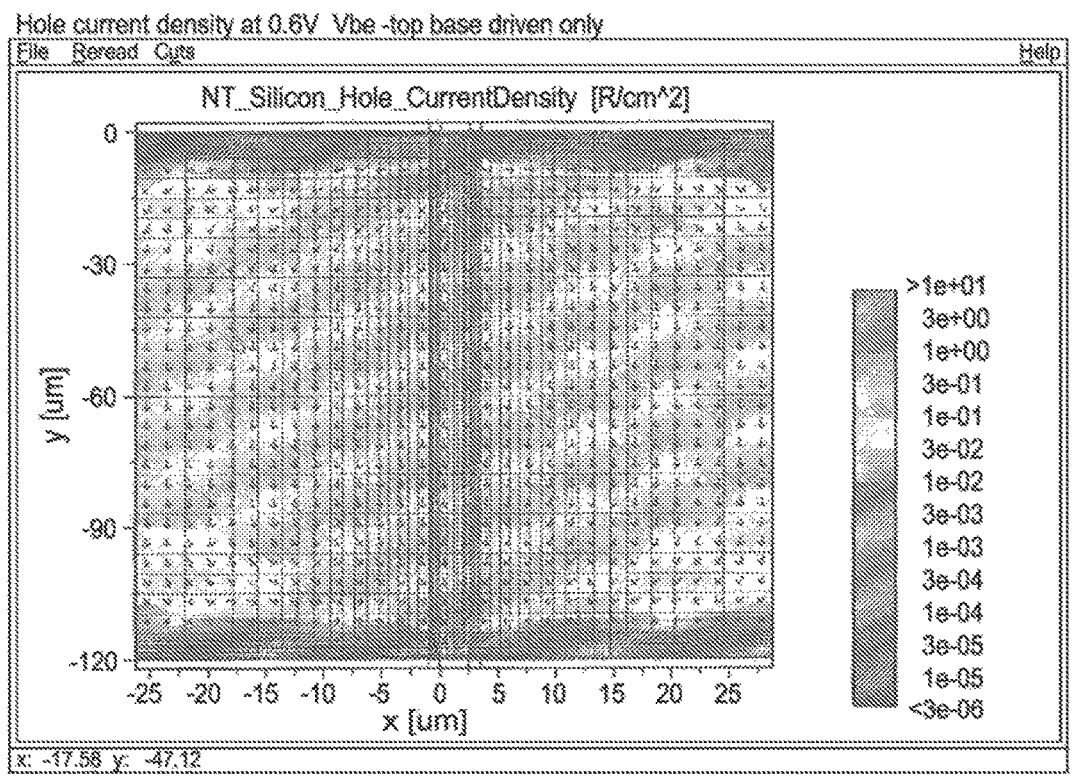
FIG. 3A illustrates hole current densities when operating as per FIGS. 1 and 2.

An Example of a Bi-Directional Transistor Design

What follows is a general non-limiting explanation of the concepts and an initial design which may not be subject to well-known optimisation techniques for highest gain, highest voltage withstand ability.

The present invention will be described with respect to certain drawings but the invention is not limited thereto but only by the claims. The drawings described are only schematic and are non-limiting. Each drawing may not include all of the features of the invention and therefore should not necessarily be considered to be an embodiment of the invention. In the drawings, the size of some of the elements may be exaggerated and not drawn to scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that operation is capable in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that operation is capable in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Similarly, it is to be noticed that the term "connected", used in the description, should not be interpreted as being restricted to direct connections only. Thus, the scope of the expression "a device A connected to a device B" should not be limited to devices or systems wherein an output of device A is directly connected to an input of device B. It means that there exists a path between an output of A and an input of B which may be a path including other devices or means. "Connected" may mean that two or more elements are either in direct physical or electrical contact, or that two or more elements are not in direct contact with each other but yet still co-operate or interact with each other. For instance, wireless connectivity is contemplated.

Reference throughout this specification to "an embodiment" or "an aspect" means that a particular feature, structure or characteristic described in connection with the embodiment or aspect is included in at least one embodiment or aspect of the present invention. Thus, appearances of the phrases "in one embodiment", "in an embodiment", or "in an aspect" in various places throughout this specification are not necessarily all referring to the same embodiment or aspect, but may refer to different embodiments or aspects.

Furthermore, the particular features, structures or characteristics of any embodiment or aspect of the invention may be combined in any suitable manner, as would be apparent to one of ordinary skill in the art from this disclosure, in one or more embodiments or aspects.

Similarly, it should be appreciated that in the description various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Moreover, the description of any individual drawing or aspect should not necessarily be considered to be an embodiment of the invention. Rather, as the following claims reflect, inventive aspects lie in fewer than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some features included in other embodiments, combinations of features of different embodiments are meant to be within the scope of the invention, and form yet further embodiments, as will be understood by those skilled in the art. For example, in the following claims, any of the claimed embodiments can be used in any combination.

In the description provided herein, numerous specific details are set forth. However, it is understood that embodiments of the invention may be practised without these specific details. In other instances, well-known methods, structures and techniques have not been shown in detail in order not to obscure an understanding of this description.

In the discussion of the invention, unless stated to the contrary, the disclosure of alternative values for the upper or lower limit of the permitted range of a parameter, coupled with an indication that one of said values is more highly preferred than the other, is to be construed as an implied statement that each intermediate value of said parameter, lying between the more preferred and the less preferred of said alternatives, is itself preferred to said less preferred value and also to each value lying between said less preferred value and said intermediate value.

The use of the term "at least one" may mean only one in certain circumstances. The use of the term "any" may mean "all" and/or "each" in certain circumstances.

The principles of the invention will now be described by a detailed description of at least one drawing relating to exemplary features. It is clear that other arrangements can be configured according to the knowledge of persons skilled in the art without departing from the underlying concept or technical teaching, the invention being limited only by the terms of the appended claims.

Figure 41:
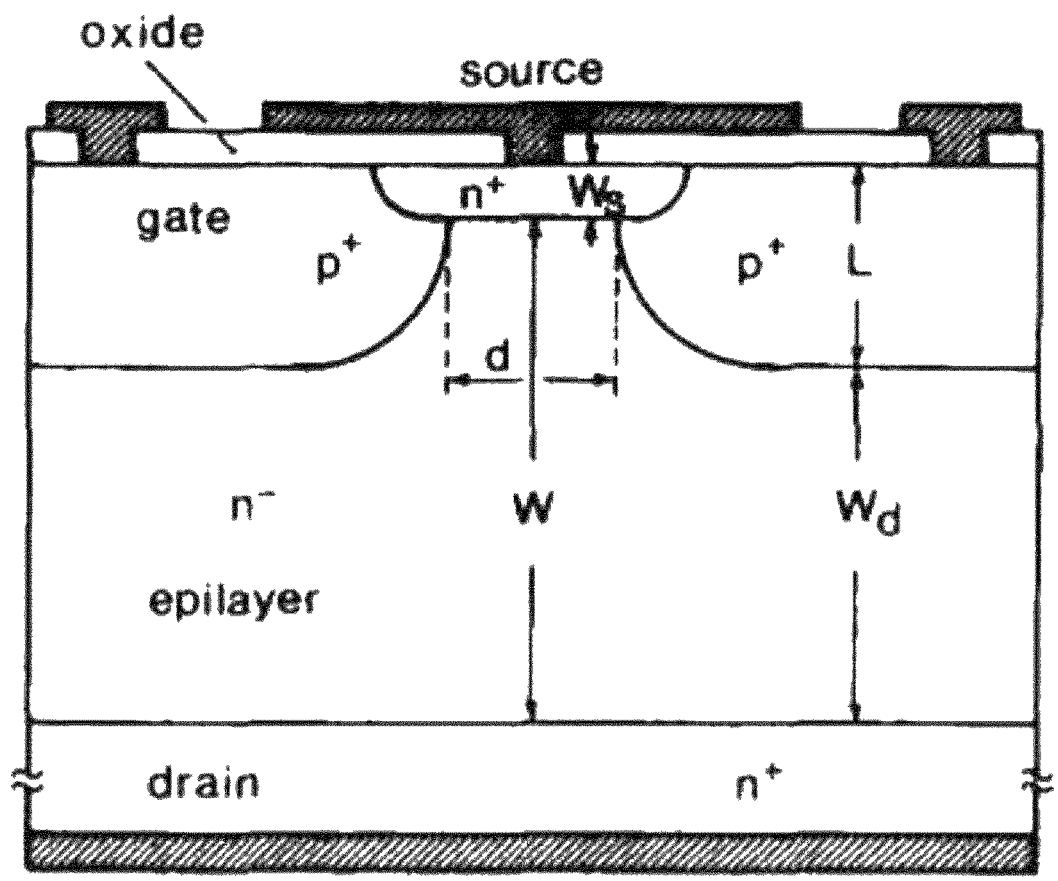
FIG. 41 illustrates a cross section of single sided, unidirectional BMJFET structure.
Figure 42:
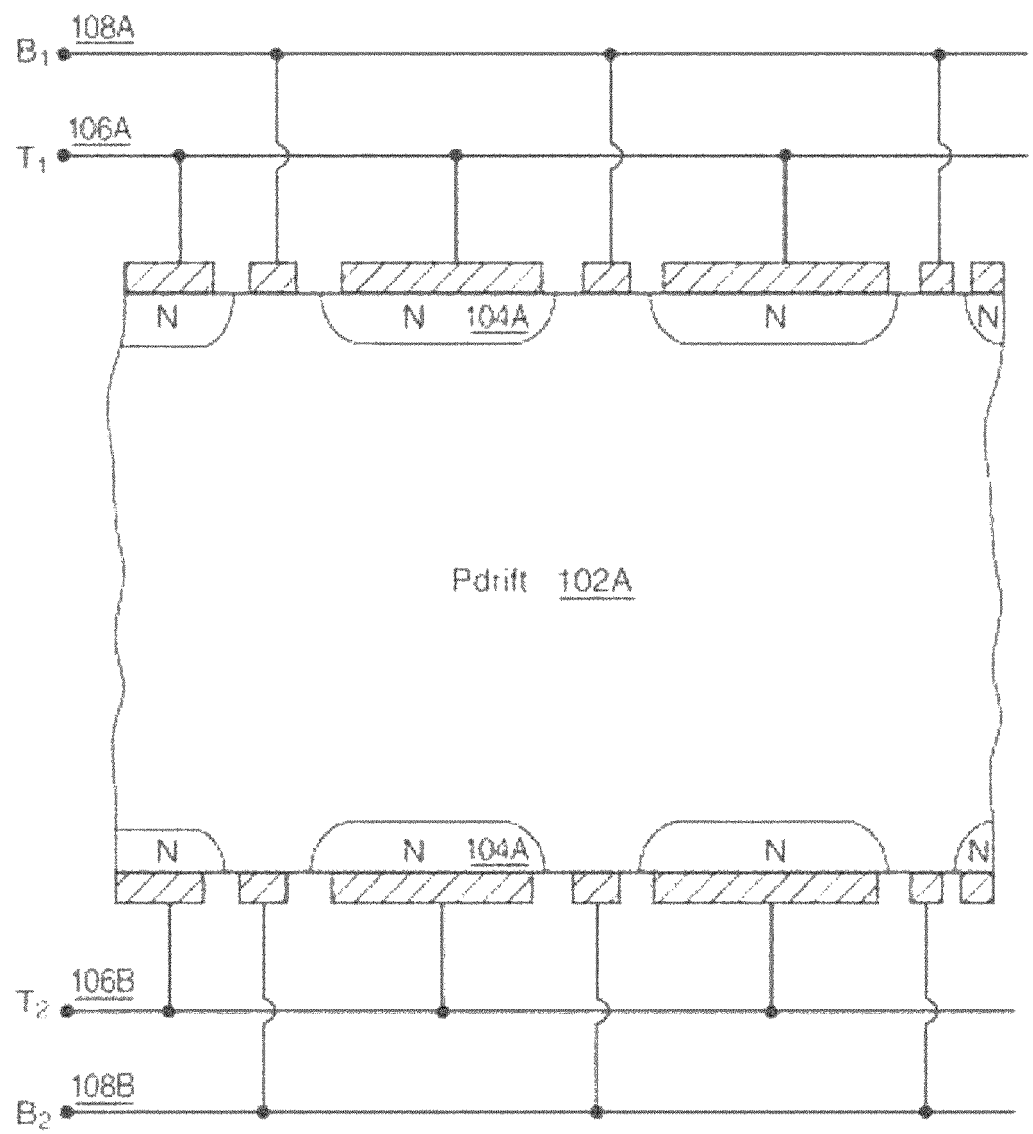
FIG. 42 illustrates a B-TRAN device.
Figure 43:
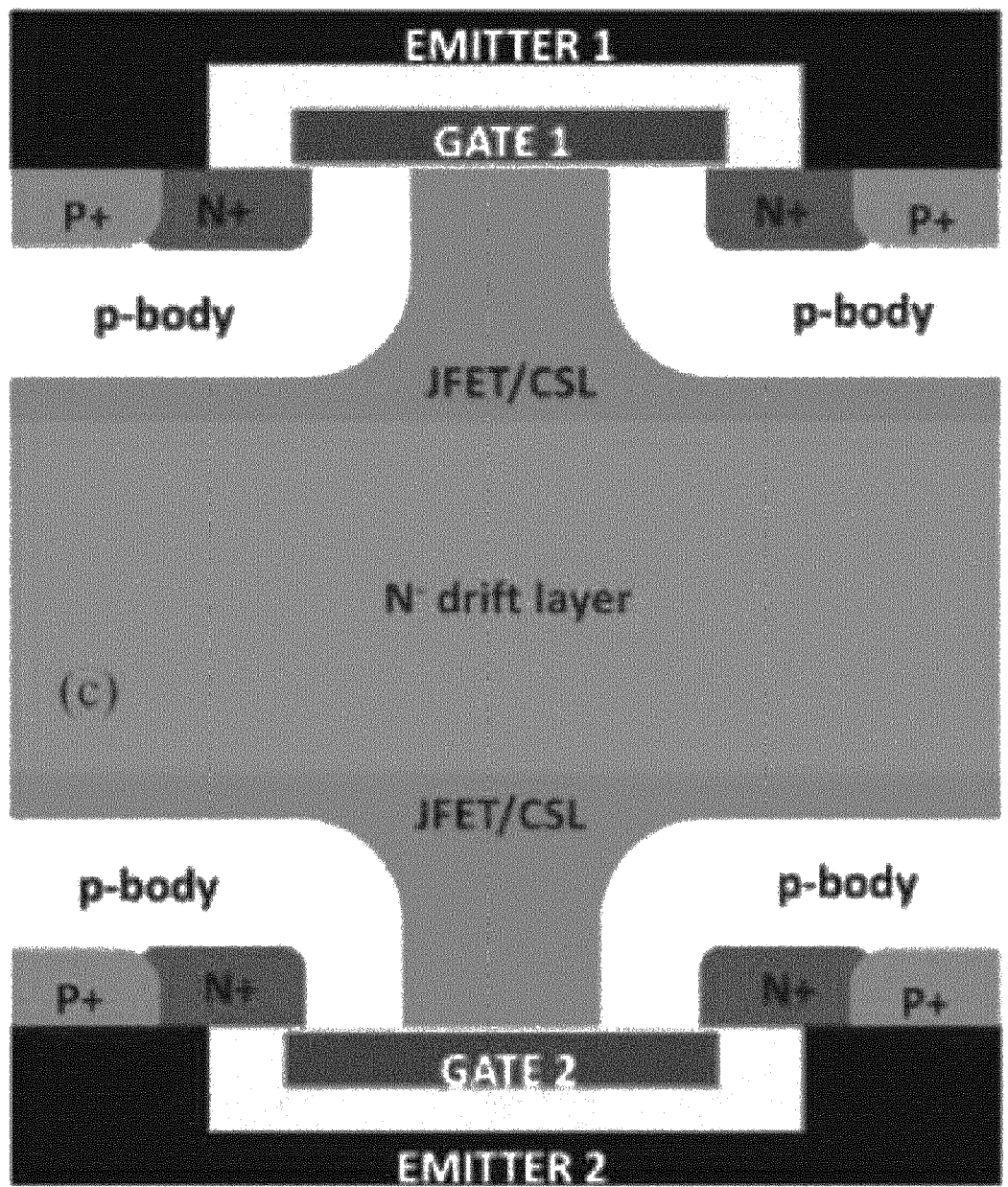
FIG. 43 illustrates a double sided Silicon Carbide IGBT.

FIG. 41 shows a conventional single sided, unidirectional BMJFET structure as per "The bipolar mode FET: a new power device combining FET with BJT operation", Microelectronics Journal Volume 24, Issues 1-2, January 1993, Pages 61-74, where the Source electrode goes to 0V power and control, Drain goes to +Ve power potential, Gate is controlled +Ve or −Ve with a small voltage with respect to Source.

Figure 44:
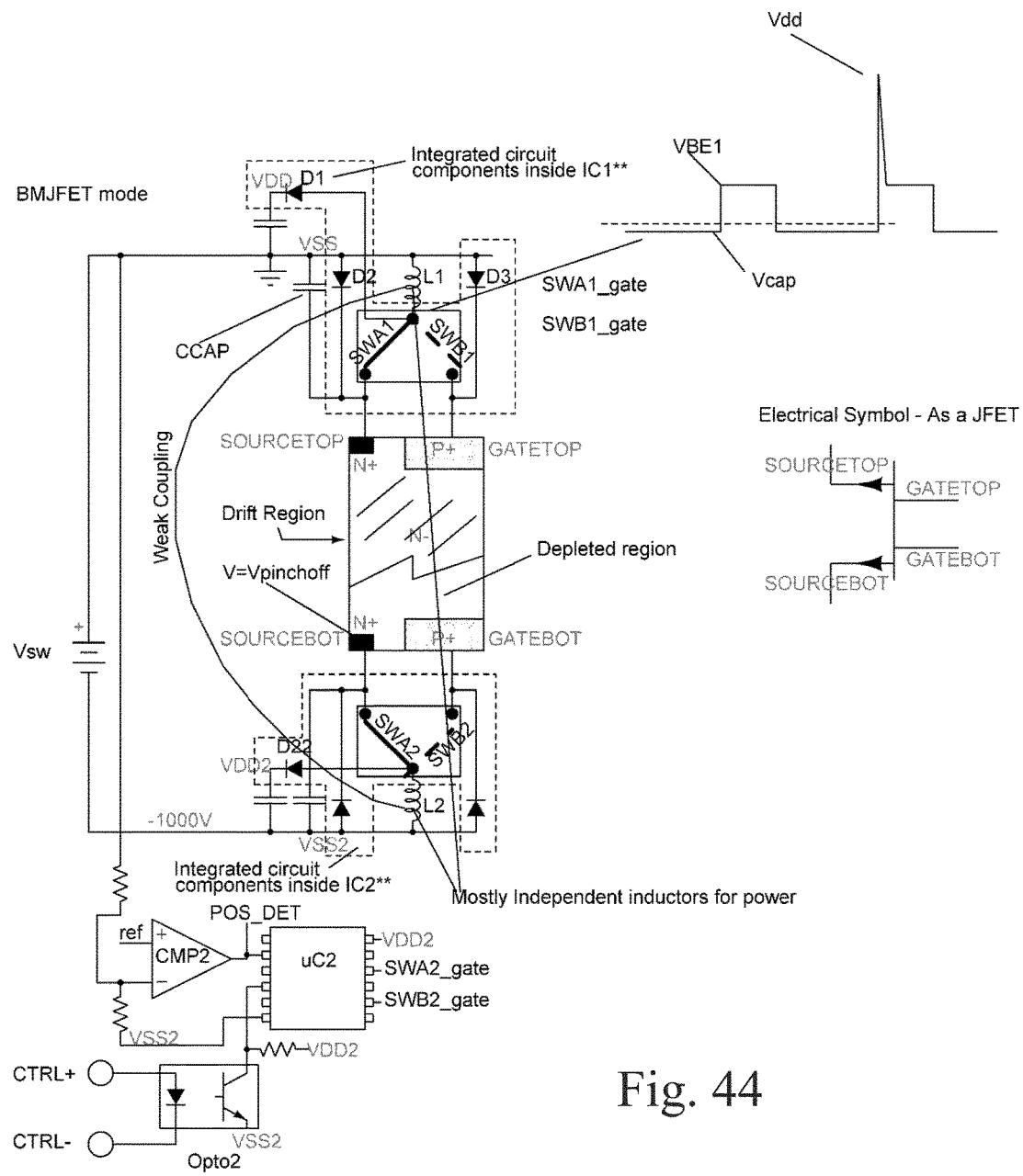
FIG. 44 illustrates a bidirectional Bipolar Mode JFET and driver.

To make the bidirectional version, this structure is duplicated on each side of a N-type wafer—including as shown in FIG. 44 (only components involved in the shown switch conduction polarity are shown; field limiting ring structures, common on most high voltage transistors are not shown. In practice, a full complement of components are provided to top and bottom driver to allow bidirectional operation.)

It is an object of this invention that new circuitry as described will allow for this N-type-wafer double-sided BMJFET device to operate in a more efficient NPN operation than is possible for single sided BMJFET.

The double sided BMJFET characteristic can be well anticipated from known operation of the single-sided BMJFET where each side's gate electrode would be driven to control a positive polarity existing on the opposite side of the device. Two separate drivers, one for each side would be needed. With the dual configuration there actually exists a fundamentally better way to drive the device in bipolar mode.

FIG. 44 Shows the preferred operation where, unlike the classic BMJFET mode where the source electrode is driven from the low-side, it is here driven from the high-side (whichever side happens to be high at the time—the controller can determine this through CMP1 or CMP2).

The mode has been identified before in connection with a different transistor type:

In FIG. 2a an emitter-follower NPN mode can be invoked by driving the base on the opposing side of the transistor to the side which is at the lowest potential. Because of the different connection system of the double-sided BMJFET described here versus that in FIG. 2a, the correspondence between terminal names as follows CE1 will be SOURCETOP and CE2 will be SOURCEBOT, BASE1 will be GATETOP, BASE2 will be GATEBOT.

Figure 31A:
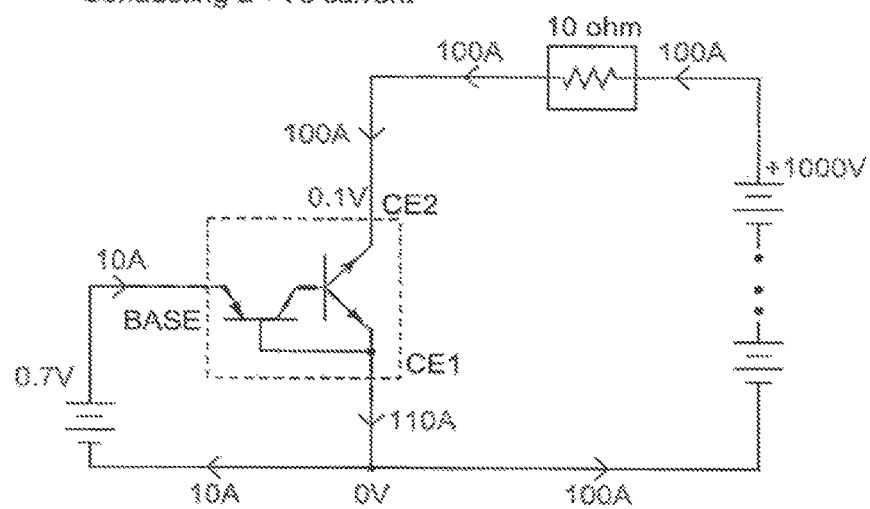
FIG. 31A illustrates main current path with a positive voltage.
Figure 31B:
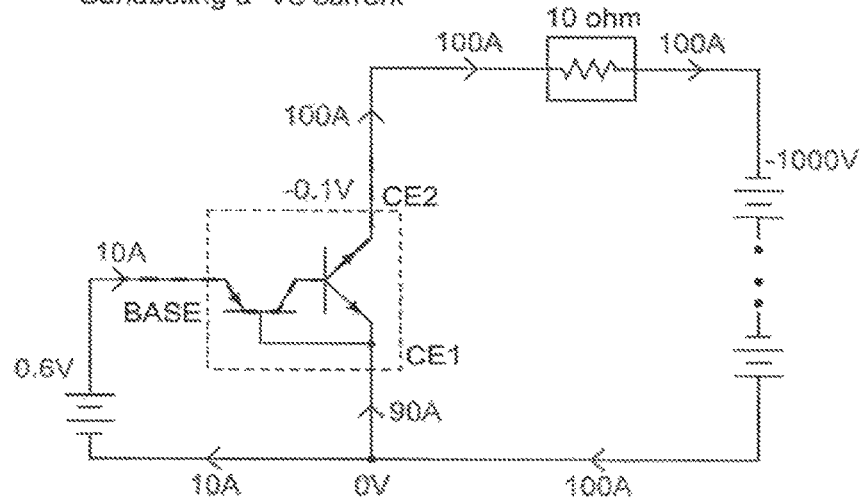
FIG. 31B illustrates main current path with a negative voltage.

The mode is an emitter-follower transistor configuration and not common-emitter and FIG. 31A and FIG. 31B give a numerical example showing that there is a preferred mode of bipolar operation with reduced device current densities and where the base current is actually useful in the load circuit and not entirely wasted in circulation. This applies to standard BJTs operating in reverse direction, Bidirectional BJTs and Bidirectional Bipolar-Mode JFET when operating in bipolar mode and with electrode polarities as mentioned.

FIG. 44 has a diagram of a bidirectional BMJFET. Shown is an electrical symbol representing the JFET characteristic of the device. The JFET characteristic keeps the device off when the gate is reverse biased and turns on in majority-carrier mode when the gate approaches zero bias. JFET mode is fast but suffers from a high "On" resistance (at best this is Wafer_thk/Wafer_resistivity). This limitation was the original spur to the development of the BMJFET—to allow minority carrier injection by forward biasing the JFET gate/source diode junction (at which point GATE would be referred to as BASE terminal)—just like a bipolar transistor.

UC2 is a microcontroller with PWM outputs able to drive the switches SWA, SWB which are low on-resistance mosfets.

On the low side of the device, CMP2 is a voltage comparator. Either or all of these components can be integrated within IC1, IC2.

Note that only the components needed to illustrate operation in the shown Vsw polarity are present in the diagram. In practice, both topside and bottomside have a full complement of components since the overall circuit is to work as a bidirectional switch in either polarity.

SWA1, SWB1 are driven from a microcontroller (not shown) circuit on the high side identical to uC2 shown for the low side. The PWM ratio steers load current flowing through inductor L1 into either the P+ or the N+ electrodes making an effective "Forced Beta" base drive current into the P+ base region i.e. the ratio of base current to emitter current (i.e. hole current: electron current in this configuration). By managing the switch timing sequence, it is also possible to insert a non-conduction period and obtain a boosted VDD supply via D1, of the order ~1V to ~5V typically to power the microcontroller and other drive electronics without need for a external supply on the high side.

Diodes D2 and D3 represent internal body diodes of the large SWA, SWB mosfets and provide a default power path prior to boot-up.

On the low side, a copy of the same circuitry will be biased differently because of the imposed switch voltage Vsw. Terminal SOURCEBOT will take up a potential of perhaps 3V to 50V depending on the construction of the JFET region of the BMJFET and fairly independent of the Vsw. SOURCEBOT is effectively the source of an Nch JFET whose gate is GATEBOT. Conveniently, this voltage can be rectified and used to power-up the low side microcontroller and other driver circuitry.

Control firmware can use the signal POS_DET to detect the correct mode highside or lowside to operate in. Highside operation was discussed above. Lowside operation involves turning SWA2 and SWB2 on or off at the correct time to implement the best possible switching characteristic.

Although possible, it is not currently anticipated that the lowside needs to perform a high frequency, forced-beta type drive of it local source/base.

Weak coupling between the inductors is indicative of the potential for transmitting power or information between the highside and lowside.

Opto2 (and the not-shown Opto1) show a minimalist isolated on/off control path of the switch from another control system.

FIG. 45 shows a Bipolar turn Off sequence for high performance switching. In FIG. 45a VBE1 represents the effect of control circuit SWA1, SWB1 forced beta system of FIG. 44 in producing a forward bias voltage for the Gate/Base electrode. The diagram is drawn in such a way to be compatible with entering into a transient TCAD model.

In FIG. 45b the electrical symbols are redrawn to show the bipolar aspects of the transistor giving three different ways to depict the same transistor. It is important to realise that dependent on the terminal connections, the same device can be operated as NPN or PNP.

These symbolic representations are used in FIG. 45c to show how the device is turned on as an NPN where conduction is highest by virtue of a favourable Electron vs. Hole mobility ratio. The sequence illustration explains how the device can be 'rolled over' from NPN to PNP conduction which has typically a lower beta and therefore is easier to turn off cleanly (an NPN turn off tends to oscillate with plasma generated and amplified—slowing down the turn off dramatically).

Even though PNP conduction is sub-optimal for conduction losses, the short duration of this mode during turn-off has minimal impacts on the switching efficiency.

Figure 7:
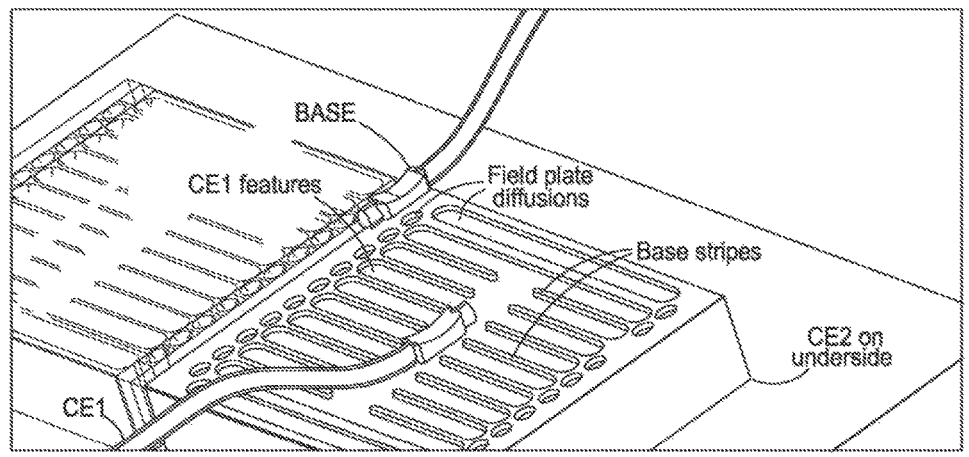
FIG. 7 illustrates a concept view of an alternative transistor comprising multiple parallel connected stripes and metallisation together with field-plate extensions for increased breakdown voltage.

Note that the DC paths for the switches include inductors L1/L2 of FIG. 7. These inductors are in the order of milliohms of DC resistance so for the purposes of FIG. 45c, they can be ignored.

Figure 46:
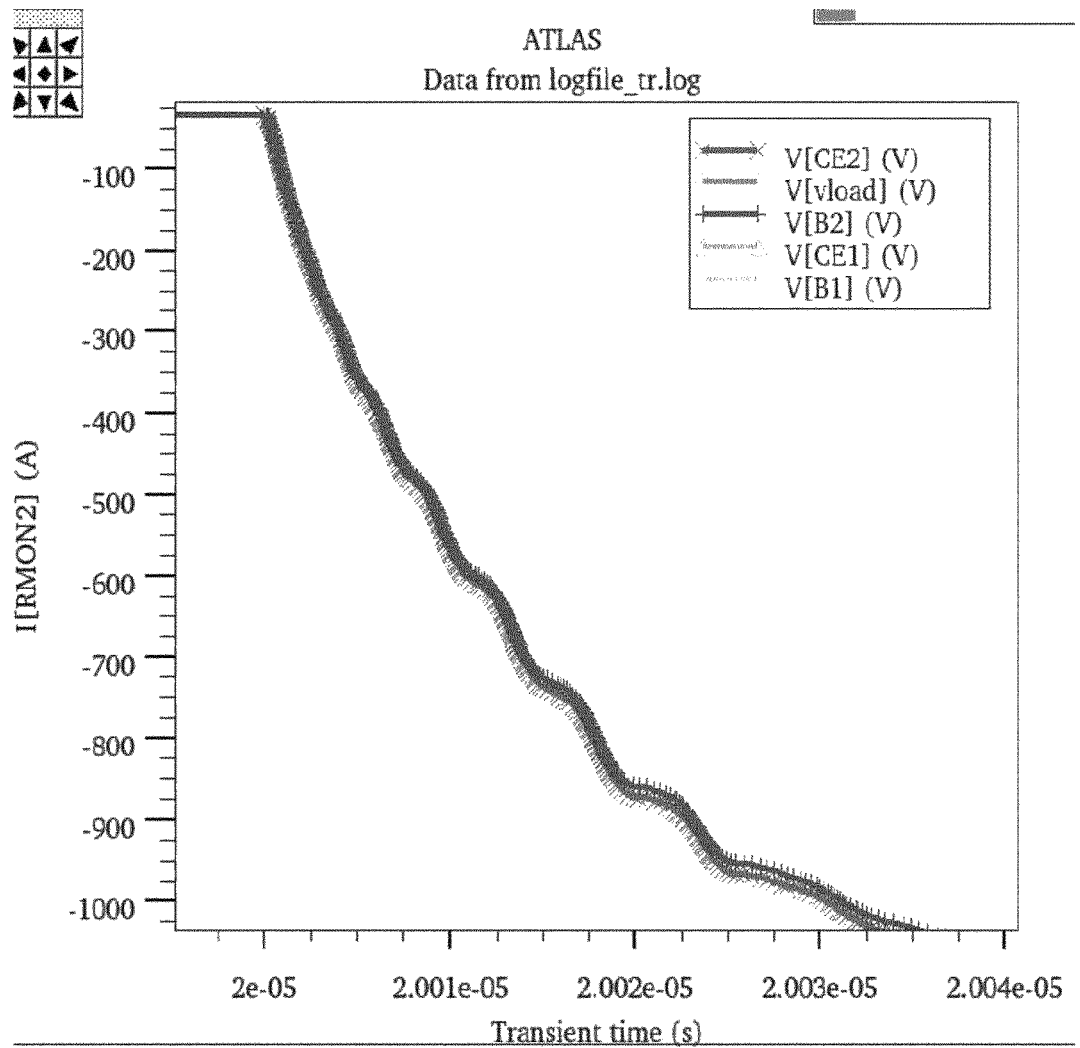
FIG. 46 illustrates TCAD falltime @ 100 A/cm2.

FIG. 46 is an example turn-off waveform in TCAD simulation of a 240 u thick N− wafer BMJFET device driven in the way described and at 100 A/cm2 current density. Fall time is around 33 nS for 1000V.

Figure 47:
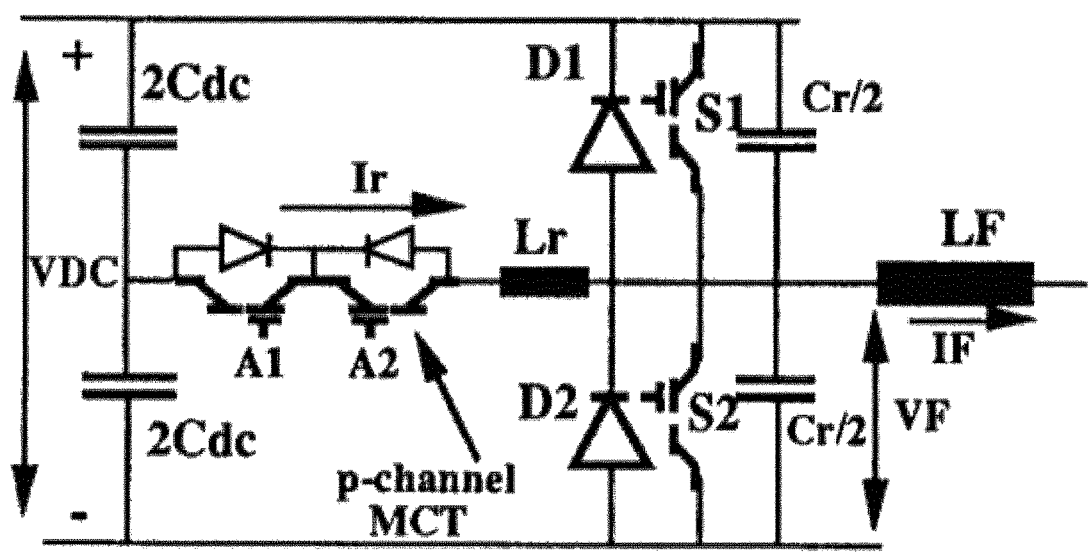
FIG. 47 illustrates an Auxiliary Resonant Commutated Pole converter.

To reduce switching losses by the soft-switching method, Auxiliary resonant commutated pole converter, the bidirectional auxiliary switches (depicted as A1, A2 in FIG. 47) can be replaced with a single bidirectional BMJFET and drive circuit as described by this invention.

While emphasis has been given to bipolar-mode operation (minority carrier injection) of the devices, it should be pointed out that at low current operation, a fully JFET characteristic (majority carrier only) can be obtained by reducing the level of forward bias voltage to below approximately 0.6V for a silicon BMJFET which suppresses the bipolar mode.

An NPN type structure may be described but certainly a PNP structure is also possible by reversing the doping systems. Where reference is made to diffusion, ion implantation is also an option and so on.

FIG. 1(A) shows an example of the vertical cross-sectional structure of a double-gated device. On each face of a lightly doped P− wafer are relatively-deep diffused Nmed (doping ranging from 10.sup.18 cm·sup.−3 to 10.sup.21 cm·sup.−3) regions to form the CE (Collector Emitter) regions 100. These Nmed regions are routed to metal contacts in the usual way via a highly doped N+ diffusion to make the CE electrodes 105. Metal contact to the P− wafer is achieved with a relatively shallow P+ diffusion to make a Base electrode 110, 115.

Useful for working operation of the "Invisible Base" concept of JFET second transistor is the management of several design factors within a controlled range. When the parameters are within a solution-space then the Nmed regions fully deplete the P− silicon around the Base contact area and stop what would otherwise be a direct conduction path from the upper Base1 electrode 110 to the lower Base2 electrode 115.

The Base may be "invisible" because of this depletion but still functions like a BJT Base when forward biased. The transistor may also work even when the P− base region is impinged by the N doping to a degree. In this case the operation of the base 'channel' may be somewhere between the physics of PNP and a Pch JFET.

Below are listed variables are given for an initial working solution for a 1200V device with a 50 mV on-voltage and a current gain of 15. Default doping concentration profiles are assumed.

Silicon wafer thickness (120 micron)[O 150] dist_x_total_microns=50
 dist_x_spacing_microns=1.O
 dist_x_base_diffusion_microns=2.5
 dist_y_shallowjunction_microns=1.O
 dist_y_deepjunction_microns=5.0
 substrate doping=1.5e14 cm−3
 Nless doping=1e18 cm·sup.−3
 N+ doping=1 e19 cm·sup.−3
 P+ doping=1 e20 cm·sup.−3

The pitch of repeating patterns would be at "dist×total microns/2" intervals and metallisation would connect the multiple stripes together in the normal way to make a larger device. The width in the TOAD simulations was 10,000 microns.

FIG. 1 also shows the electrical symbol for the structures.

The dual-base structure of FIG. 1 (A) is intended to be driven by transformer-coupled base windings. Minority carriers are injected on the top and bottom of the structure through the P/N, i.e. Base/CE forward biased junction increasing conductivity between CE1 and CE2 terminals. The symmetry gives equal current gain (hFE) in both the forward and reverse polarity power conduction directions.

A single base structure of FIG. 1 (B) when driven according to FIG. 2a (but with Base2 terminal omitted) injects carriers only on the top side and so hFe is approximately halved when not switching in the preferred CE voltage polarity quadrant. However, this structure has the big advantage of a single base drive circuit (directly coupled) and does not require masking and patterning on both sides of the wafer as is the case with the alternative designs.

Finally, in one embodiment, the structure of FIG. 1 (C) is similar but has two CE electrodes 130, 135 displaced laterally on the lower side of the silicon and relies on minority carriers being injected from 'above' or the top side by the dedicated base and emitter region on the top side. This design may suit lower voltages and thinner silicon wafers.

In all cases above it will be appreciated that, in the bi-directional transistor design, the Base (i.e. the P of the NPN structure) is working as the Drift region and supports the full 'off voltage rather than the usual configuration of an NPN transistor where the collector (N region of an NPN structure) would act as the voltage-supporting drift region.

All the structures described above have much lower losses and hence higher efficiency than the standard IGBT device.

Figure 3B:
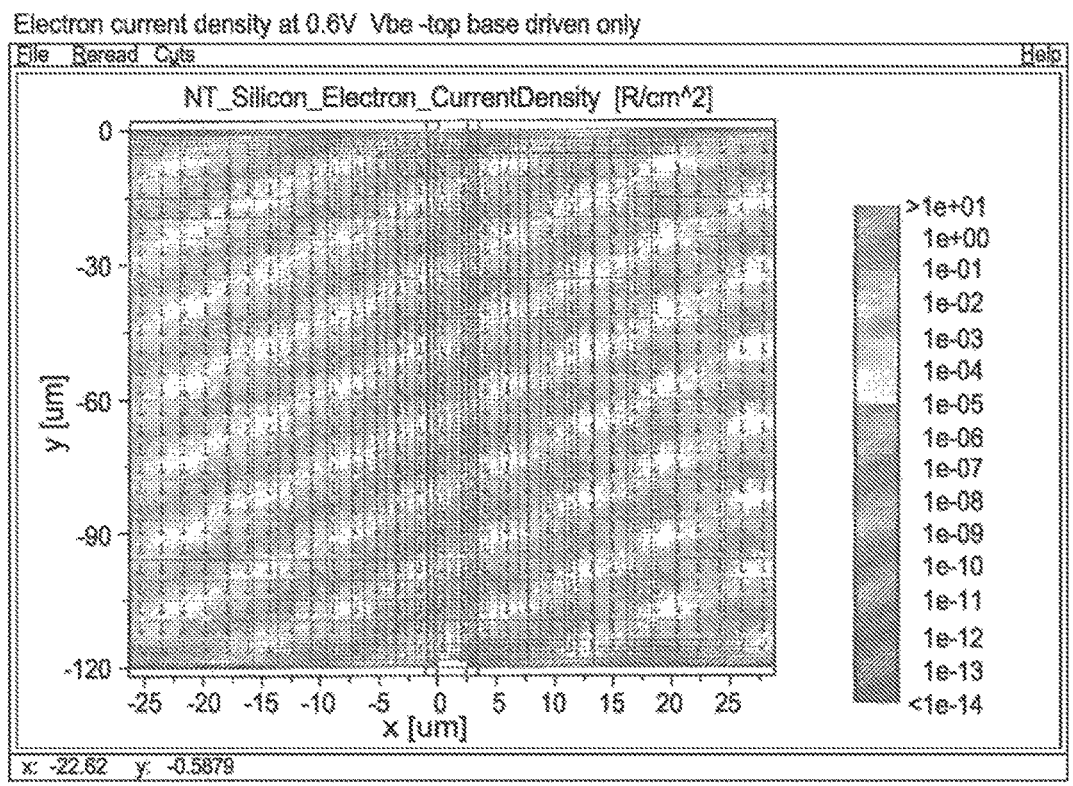
FIG. 3B illustrates electron current densities when operating as per FIGS. 1 and 2.

FIG. 3 shows the Hole and Electron current densities when operating as per FIGS. 1 (A) and 2a.

FIG. 2b illustrates a drive circuit 200 used for the bi-directional BJT devices of FIG. 1. The drive circuit 200 has a microprocessor control of the base current and can give complete safe-operating area, short circuit protection, zero-crossing on and off all defined by software. A STM32F373 microcontroller for example is able to control up to 6 switches at an added cost of $0.50 per switch. It has flash ROM for data logging and UART I/O for communication.

In FIG. 2b, MOSFETs Q2 and Q3 drive a small inductor L using PWM output and synchronous rectified buck-converter technique to efficiently create the low (0.7V typical) base voltage and current to switch the main transistor Q1 (or the bi-directional BJT) on. Q4 is a quick-turn-off device for Q1 and can impose a negative base bias which helps to increase the breakdown voltage of Q1. Rsense1 and the ADC channels ADC4, ADC3 give feedback to the control program as to the instantaneous base current and base voltage. Rsense2 with ADC2 measures the emitter current (which includes base current which can be subtracted out digitally). ADC 1 via the protection resistor Rprotect measures the transistor voltage drop (VCE1-CE2) when switched on. An algorithm can adjust the PWM ratio until the targeted voltage drop (VCE1-CE2) is maintained. Just sufficient base current will be used which can prevent deep saturation of the main transistor which otherwise renders it slow to turn-off ADC0 with voltage divider formed by Rdiv 1, Rdiv2 allows the zero-crossing time of the mains waveform to be detected (for optional zero-crossing synchronised on/off of the power switch) and for the smart-appliance metering application the total power delivered to the load is given by multiplying this value by the through collector/emitter current determined previously.

Description of Power Scavenging Concept (Illustrated in FIG. 2c)

A detailed circuit is described later but in principle the bi-directional BJT device can get its base current from the voltage drop across itself while it is switched on providing that the Hfe (current gain) is sufficiently high.

For example with 10 A passing through the switch, an assumed Hfe (current gain) of 20, and a VCE1-VCE2 drop of 0.15 volts and the Vbe to switch the device on is 0.7 volts.

The power used in the base is 10 A/20*0.7 volts=0.35 W, while the power loss over the switch is 10 A*0.15V=1.5 W. Extracting 0.35 W with an efficient DC-DC boost converter operating at the 0.15V requires a high-voltage switch Q1 1 which protects the low-voltage circuits when the main transistor is off For example, 2.333 amps is needed from this 0.15V source to power the base. If Q1 1 itself is of BJT type construction then it too needs a source of a lower base current from the scavenging power supply.

To make things easier and in pursuit of the lowest overall losses the intelligence of the microprocessor can be used so that Q1's VCE1-VCE2 drop is deliberately higher while switched on during the low-current portions of the mains cycle in order to extract and store energy into the Vdd, Vss capacitors ready for implementing lower voltage drop in Q 1 during the peak voltage times.

Description of the Charge Control Model:

With a microprocessor in control of the switching, and digital feedback of all the analogue quantities in the circuit a charge-control model can be executed in order to keep the power transistor switched on in the most efficient way without overdriving the base. Generally, a measure of the VCE1-VCE2 voltage drop is taken and if lower than a pre-set target, e.g. 0.1 volts, then more base current is commanded from the PWM. Knowing that internal charge is building up on the base/CE junctions and the capacitance of these junctions and the required minority charge needed to support a particular switched current, the quantity and duration of this base current boost can be regulated in order to intercept the demand current through the device as it is seen to rise. Similar algorithm can be used for reducing currents. The algorithm can also take into account the recombination lifetime to have a constant estimate of the charge available for conduction.

Flash Memory

With a self-writable flash memory in the microprocessor, each power transistor can have permanently stored a calibration area setup after manufacture during test and referable when operational to improve the accuracy of the algorithms and the reported measurements of the device.

Alternative Fabrication Technique

An example of the fabrication technique of the devices of FIGS. 1 and 2 is described below.

Etched Trench:

From additional simulations it is found that an etched trench with vertical sidewall in the silicon, when diffused, gives a FET-'base' structure of higher performance than a simple diffused planar junction.

It is also more economical in terms of time and equipment utilisation to etch a trench and make a shallow diffusion (.about.30 minutes total) than a deep thermal diffusion which can take many hours. It also allows a sharper edge to the diffusion profile to be achieved.

Figure 4A:
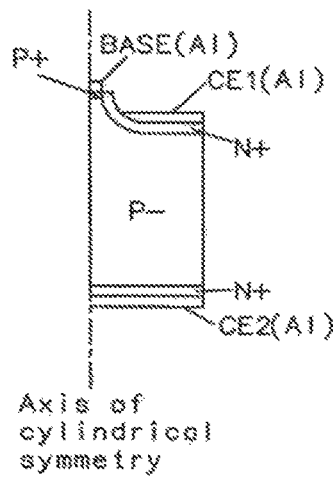
FIG. 4A illustrates cross sections of an alternative BJT structure.

[O 178] FIG. 4a shows the structure and the identified parts.

Figure 4B:
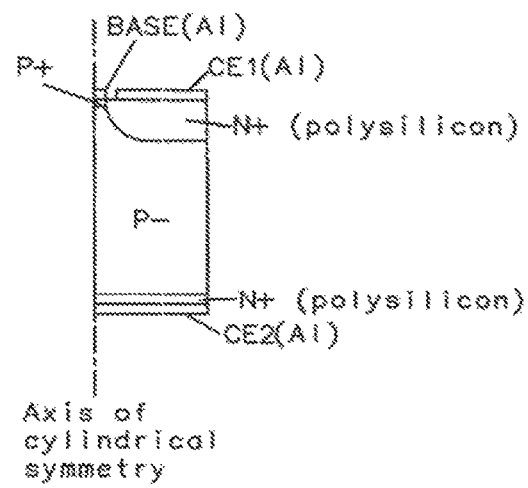
FIG. 4B illustrates a polysilicon emitter system of an alternative BJT structure.

Another option is a "Polysilicon Emitter" system shown in FIG. 4b in which a heavily doped N+ polysilicon is used to fill the trench forming the emitter. Similar N+ polysilicon emitter formed on the bottom side also. Polysilicon emitters have higher gain at higher current densities due to the barrier for hole injection (from the base into the emitter) formed by an inherent oxide layer which forms between the silicon and polysilicon.

Equivalent Circuits of the IBT Device (or the Bi-Directional BJT Device).

FIG. 5 is a schematic symbol of the bi-directional BJT device. Equivalent circuits are shown for the structures discussed previously. In the first case (in FIG. 5(a)), a P-channel JFET is effectively in series with the base terminal. This happens when the N+ does not diffuse all the way into the channel region under the base contact. In the second case (in FIG. 5(b)), where some donor atoms do make it into the channel, operation of the base drive does not immediately fail. Operation becomes that of a lightly-doped base PNP transistor in series with the main P− base region. Too much encroachment may reduce the operating efficiency of the device and can slow down turn-off somewhat but it remains operational (in FIG. 5(c)).

Figure 6:
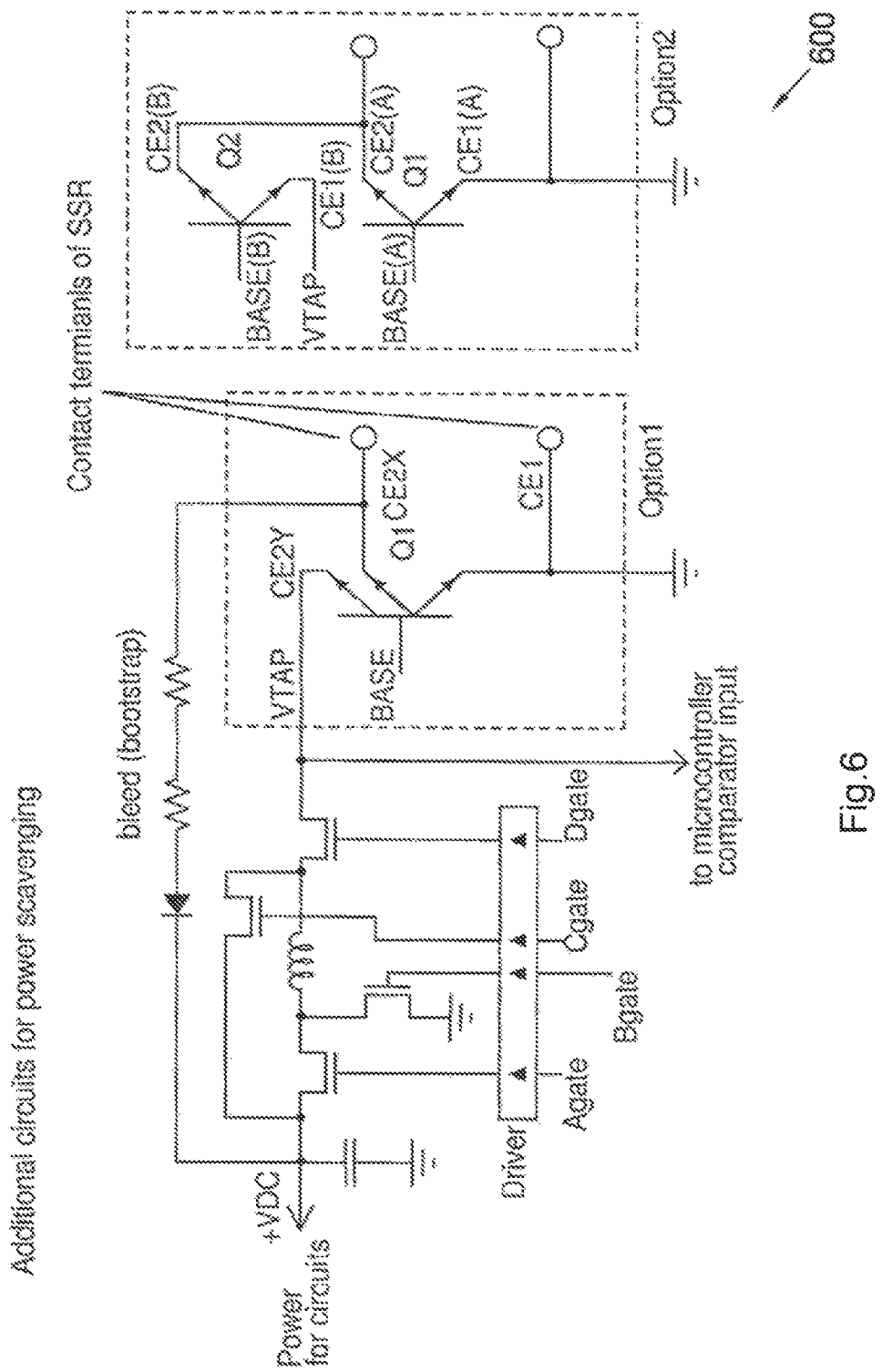
FIG. 6 illustrates a driver circuit.

Solid-State Relay Replacement (with Reference to FIG. 6)

FIG. 6 illustrates a driver circuit 600. The circuit 600 can serve as drop-in replacement of a standard solid-state relay. The circuit may be able to operate from just 2 power terminals, i.e. the contact terminals. The power available from the signal side of the relay (e.g. 5 mA@5 volts) is insufficient to power the IBT base even through a transformer.

A power scavenging system is required in lieu of another source of external power.

Referring to FIG. 6, when the IBT transistor is off, a high bleed resistance can tap a few micro-amps (which appears as slightly elevated leakage current into the load) to power an ultra-low-power microcontroller circuit which can boot up and run at a low Khz-type frequency.

A storage capacitor C on +VDC line has sufficient charge such than when the IBT is required to be turned on, there is enough energy to drive the base at least initially.

Figure 4C:
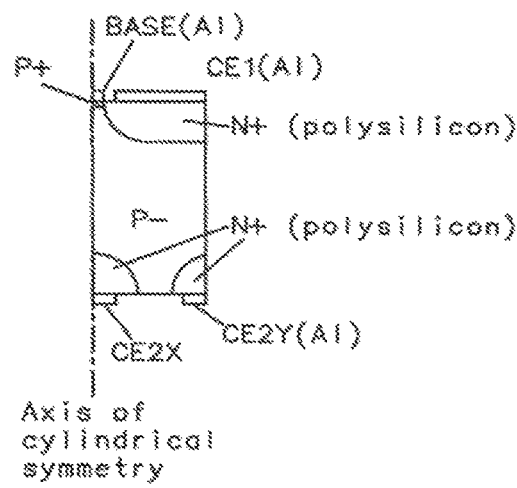
FIG. 4C illustrates an alternative BJT structure having a dual CE.

With the IBT turned on there is now a low voltage (the voltage drop) across the contact terminals CE 1 and CE2 in proportion to the current conducted multiplied-by the 'On' resistance of the transistor. This voltage-drop is a parasitic effect but it can be used to extract a source of power for maintaining base current in the IBT. There are two immediately apparent options for this. First there is a special dual-CE2 structure as shown in FIG. 4c. Secondly, an additional IBT operating at lower current density (and therefore low voltage-drop) can tap the CE2 voltage and conduct it onto VTAP as an input to the DC-DC converter.

An example of option 1: Device terminal CE2Y will also have a voltage of approximately CE2X (since the P− region is filled with minority conductive carriers). The voltage at CE2X can be boosted to give a continuous DC power source for powering the base.

Depending on whether the voltage drop is +Ve or −Ve (detected by a comparator in the microprocessor) the microprocessor activates the switches in the following logic sequence then repeats.

An example of option 2: If the main transistor has a gain of 25 at VCE1/CE2=0.1 V at 5 A/cm·sup.2 then it needs 0.2 amps/cm·sup.2@0.7V for the base which is 1.4 A/cm·sup.2 from 0.1V. If equal area is given over to the tap IBT it will be operating at 3.times. lower current density and proportionally lower voltage drop and higher HFE (gain) than the main transistor but still VTAP would likely be 70 mV instead of 100 mV. Iteratively solving this (and including the base current for the second IBT) it is anticipated that the IBTs can be self-powered with a 2.times. increase in total device area and 1.5.times. higher voltage drop. The voltage drop is still around 10.times. lower than comparable switching device on the market.

[OI 89] In both cases the circuit self-adjusts to the biasing conditions, for example that the current through the switch rises, then so does the voltage-drop over IBT I, this gives more voltage available to VTAP and more power to the base drive which in turn helps to lower the VCE1/CE2 saturation voltage.

+Ve voltage drop at CE2. Voltage needs to be boosted by .about. 10.times.

[OI 90] Phase1. Agate=O, Bgate=I, Cgate=O, Dgate=1. Duration=IOO uS example. [OI 91] Phase2. Agate=I, Bgate=O, Cgate=O, Dgate=1. Duration=10 uS example.

[OI 92] [repeat] −Ve voltage drop at CE2. Voltage needs to be inverted and boosted by I I.times.

Phase1. Agate=O, Bgate=I, Cgate=O, Dgate=1. Duration=I I O uS example.

Phase2. Agate=O, Bgate=I, Cgate=I, Dgate=O. Duration=I O uS example.

[repeat]

For option 2, the bases of the two IBT transistors could be driven by independently controlled PWM/Inductor circuits instead of both bases being driven together. This facilitates turn on of the Q2 independently which could be used in addition to the bleed circuit to gather larger currents via the load resistance by switching on around the zero-crossing times of the mains waveform. Low voltages could be efficiently gathered in this way and for many loads (e.g. heaters, large motors) the small additional 'leakage' would not affect them.

Low Cost Manufacturing

[OI 97] One possible starting material is P− high-minority-lifetime mono-crystalline solar wafers which can be readily sourced in a range of 50 u to 300 u thickness. The thickness and doping depend on chosen withstand voltage of the device (thicker, lower doped for higher voltage). At current prices, processed P− silicon wafer panels for solar panels having been through the following processing steps: Etch, Diffusion P and N, Contacting and Passivation retail for $0.02 per cm·sup.2. Operating at 2.5 A/cm·sup.2 for very low voltage drop and high gain, I O cm·sup.2 of silicon (20 cm·sup.2 for self-powered) might be used for a 25 A device. The high-volume target silicon cost could be as low as $0.50 c for a 25 A 1000V 0.1 W per amp loss SSR using these techniques.

[OI 98] A concept view of an IBT transistor comprising multiple parallel connected stripes and metallisation together with field-plate extensions for increased breakdown voltage is illustrated in FIG. 7

In order to accommodate the large silicon areas required for lowest loss, a 3D stacking technique would be used. Since each slice is only 0.2 mm thick, a 25 A SSR could be fitted into an area of 20 mm.times. IO mm.times.2 mm. No special additional heatsink (.about.$2 cost) would be required.

Figure 8A:
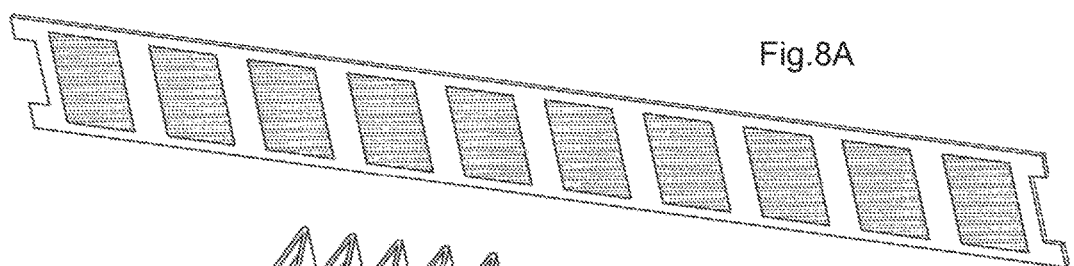
FIG. 8A illustrates an array of chips in which the chips are inter-wired using a flex-pcb and wire-bonded to the individual die.
Figure 8B:
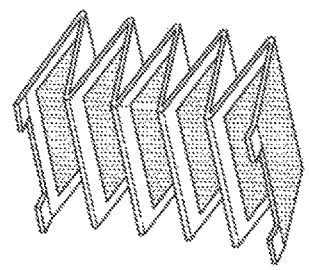
FIG. 8B illustrates the array of FIG. 8A folded.
Figure 9:
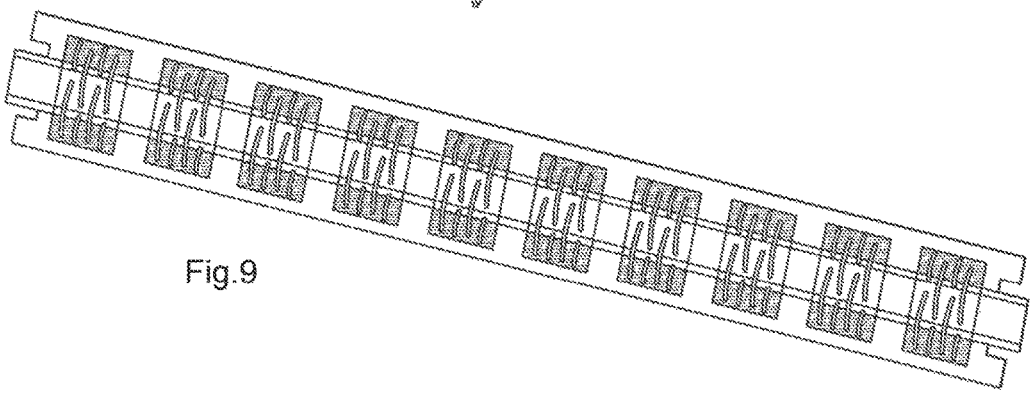
FIG. 9 illustrates a layout of a 3D stacking of devices (folding) with facility to increase surface area when even higher currents are required.

FIG. 8 illustrates a chip in which the chips are inter-wired using a flex-pcb and wirebonds to the individual die. FIG. 9 illustrates a layout of a 3D stacking of devices (folding) with facility to increase surface area in case even higher currents are required (inter-wiring omitted for clarity).

The package may be coated in encapsulant for environmental protection.

Minority Lifetime Choices

High minority carrier lifetime is important in the P− region to get high HFE (gain).

However, shorter lifetime could be a target for the N+ regions where high doping also tends to kills HFE at low current levels—this help to increase breakdown voltage.

Alternative Transistor Construction

Figure 10A:
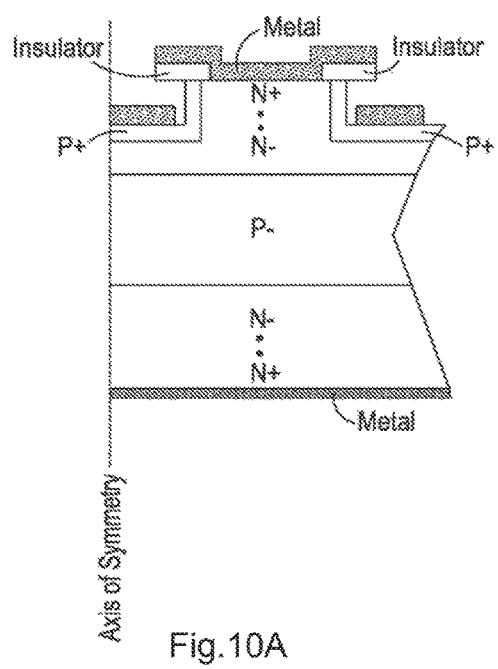
FIG. 10A shows an alternative route to a definite PNP input stage for the BASE compared to the arrangement shown in FIG. 5.

FIG. 10 shows an alternative route to a definite PNP input stage for the BASE (re. FIG. 5). This scheme can have lower charge-removal during turn off relative to JFET, but has some advantages in high-current density, and can allow a simpler 3D stacking system to increase current rating in a given footprint area. A typical process is given for an R&D lab. The illustration is a minimal unit drawn as a half (right hand half) cross-section of a cylindrical symmetric design.

Firstly a P− doped wafer has 20 u deep Phosphorous diffusion on both sides. This gives N+ doping levels near the surface and N− towards the bottom of the diffusion. A polysilicon layer or silicon-carbide hetero junction layer can be added on both sides to create polysilicon emitters for higher gain if desired.

Then an oxide layer is grown on the top side of the wafer (or an insulator layer is deposited)

Openings in the insulator layer are made using photoresist-expose-etch.

A silicon-etch (e.g. KOH) is performed to make a trench for the BASE electrode in the places defined by the previous openings. The insulator acts as a mask. Undercutting is helpful.

A boron diffusion is performed. The insulator acts as a diffusion blocking mask meaning that only a thin shell of P+ diffusion is made at the walls of the trench.

Now a second set of openings are made in the oxide in the regions where contact to the N+ is to be made.

Aluminium is sputtered from above. This gives mutually-unconnected metallisation connection to the BASE and CE1 regions. Lower cost alternatives such as metallic pastes could be used.

Figure 10B:
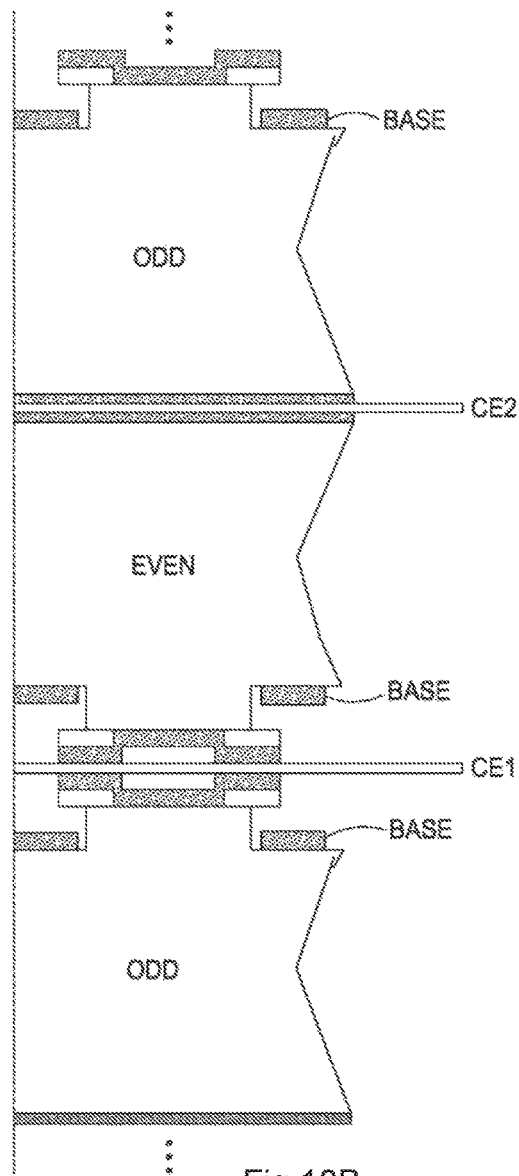
FIG. 10B shows an alternative PNP input stage in which devices are stacked back-to back.

For higher current such devices can be stacked back-to-back as shown in FIG. 10b. Inserting metal sheet between each layer in the stack can obtain electrical connection. The stack could be pressed and fired to make thermo-compression bonding.

Figure 11:
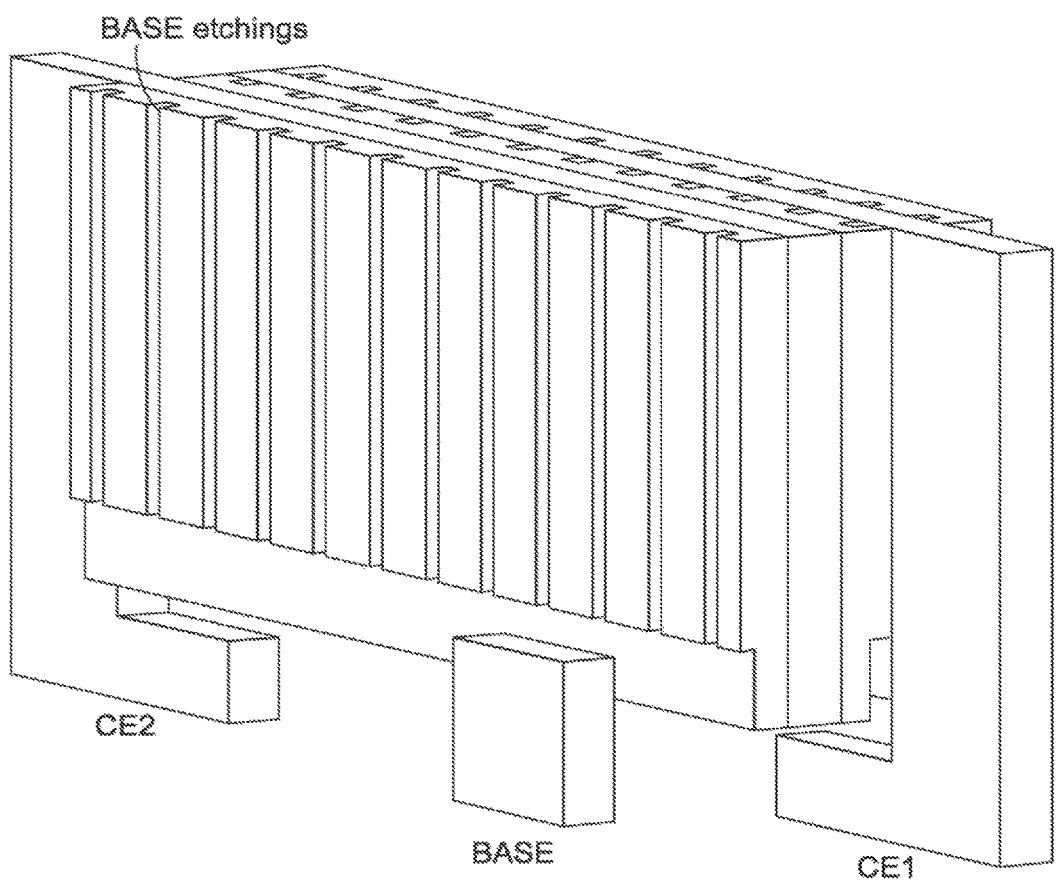
FIG. 11 is a 3D view of a minimal unit stack which can be scaled in X, Y and Z.

FIG. 11 is a 3D view of a minimal unit stack which can be scaled in X, Y and Z. A BASE connection will contact to two silicon die using solder, conductive paste or thermo/compression bonding. Similarly the CE1 and CE2 copper sheets will each connect to two different die using perhaps sintered silver powder or high temperature solder—on the CE1 side probably screen printed onto the copper plates in a pattern to match the CE1 openings.

The final connection scheme to the outside world is determined by the shape of the copper sheets which are stamped and bent to make a kind of lead-frame.

A thermo-compression process can 'sinter' the stack together at temperatures between 250.degree. C. and 400.degree. C. typically, or conventional high-lead solder can be used.

A final encapsulation with plastic (not shown) will allow a SMD electrical mounting of the device onto a PCB.

Alternative Signalling Scheme to Communicate/Power the SSR Modules

Bluetooth and Bluetooth Low Energy are examples of communication system for short range RF data exchange. This system could be used as-is to network multiple solid-state-relays (SSRs) of the type (described previously in this document) by using for example a Bluetooth capable SOC including Microcontroller from, for example, Nordic Semiconductor Inc or Texas Instruments as an upgrade for the system microcontroller mentioned previously. Normally an antenna at each end of such a communications link permits wireless connectivity. These antennas can be realised from a specific PCB trace pattern whose layout is specific and tuned to the radio frequency involved—typically 2.4 GHz. For industrial control networks wireless is not often used due to the possibility of interference and security issues. A wired network is used instead.

FIG. 12 illustrates structures which enable an either/or choice of wireless/wired and has an additional advantage of furnishing power to the attached device in wired-mode without having to break the wires when a node is attached to the network.

A twisted pair electrical wire 1210 (e.g. UTP or STP) is capable of transmitting 2.4 GHz RF signals for lengths of 15 meters with acceptable attenuation. Underneath this RF frequency can be a low-frequency power waveform e.g. .about.20 KHz created by a central generator.

On an intelligent SSR node which is to tap this power and the RF communications, the UTP cable is locally 'untwisted' to produce a larger than usual loop. This loop is placed inside a hinged magnetic transformer 1215 which is a type of planar transformer for the LF power frequency and forms the primary. The hinge 1220 is then closed to complete the magnetic circuit. The secondary side of the transformer is a PCB trace on the SSR module and has terminals labelled X I and X2. Rectifiers and filter capacitors on the secondary permit extraction of power from power waveform.

This configuration allows for solder-free insertion and removal items into the network and gives 100% electrically isolation. The ferrite used for the transformer needs to have high permeability to the LF and act as a transmission-line transformer for the RF.

If designed correctly, the PCB trace for the secondary of the transformer is also able to couple the typically 2.4 GHz RF signal from the UTP cable loop and into a Bluetooth RF chip on the SSR pcb 1225.

An inductor-capacitor network and rectifiers can separate the LF power from the RF frequencies.

Signals X I and X2 from the pcb-transformer become VDD, VSS and RF1, RF2.

With sufficient screening in the RF components and transformer, a network of many nodes would only be responsive to signals in the UTP cabling and not very sensitive to general external Bluetooth signals in the building. This allows high reliability signalling and no possibility of eavesdropping. It also means that bandwidth increases when running multiple independent RF-UTP networks which run without collisions.

At the end of the UTP network cable a terminator 1230 is added. This gives an LF return current path which effectively puts all the Nodes in series to the AC power generator. Higher number of nodes requires proportionally higher voltage LF power signal.

With the hinged PCB transformer open, the unit would operate in a normal Bluetooth wireless mode which is good for low-security networks and during development. In this mode power would have to come from a self-powered scheme as described previously.

Simulation of Bootstrap/Boost Circuit

Figure 13B:
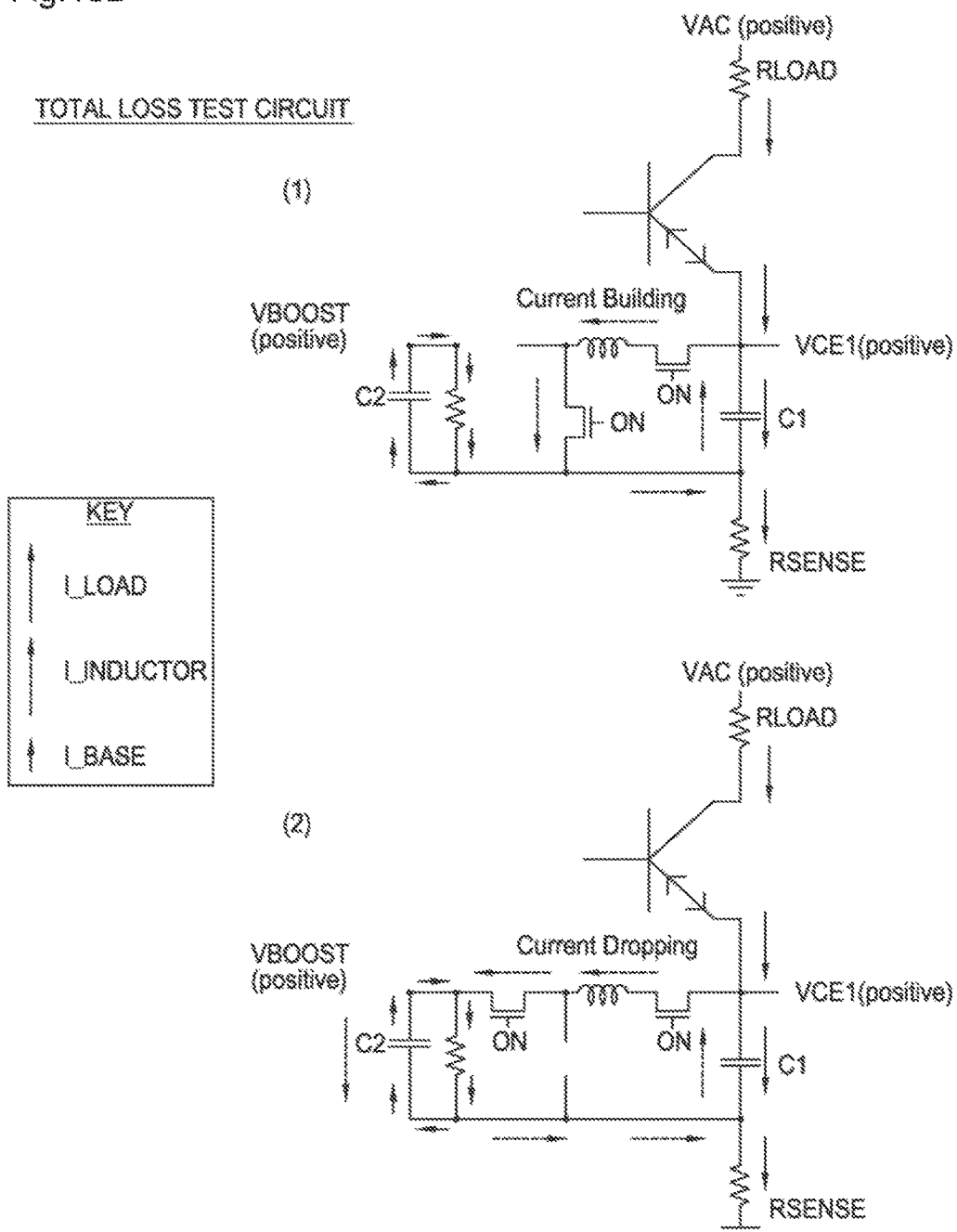
FIG. 13B is a schematic bootstrap/boost voltage circuit diagram showing the two time portions of the PWM cycle (1) and (2) feeding energy from VCE1 to a total-loss circuit.
Figure 13C:
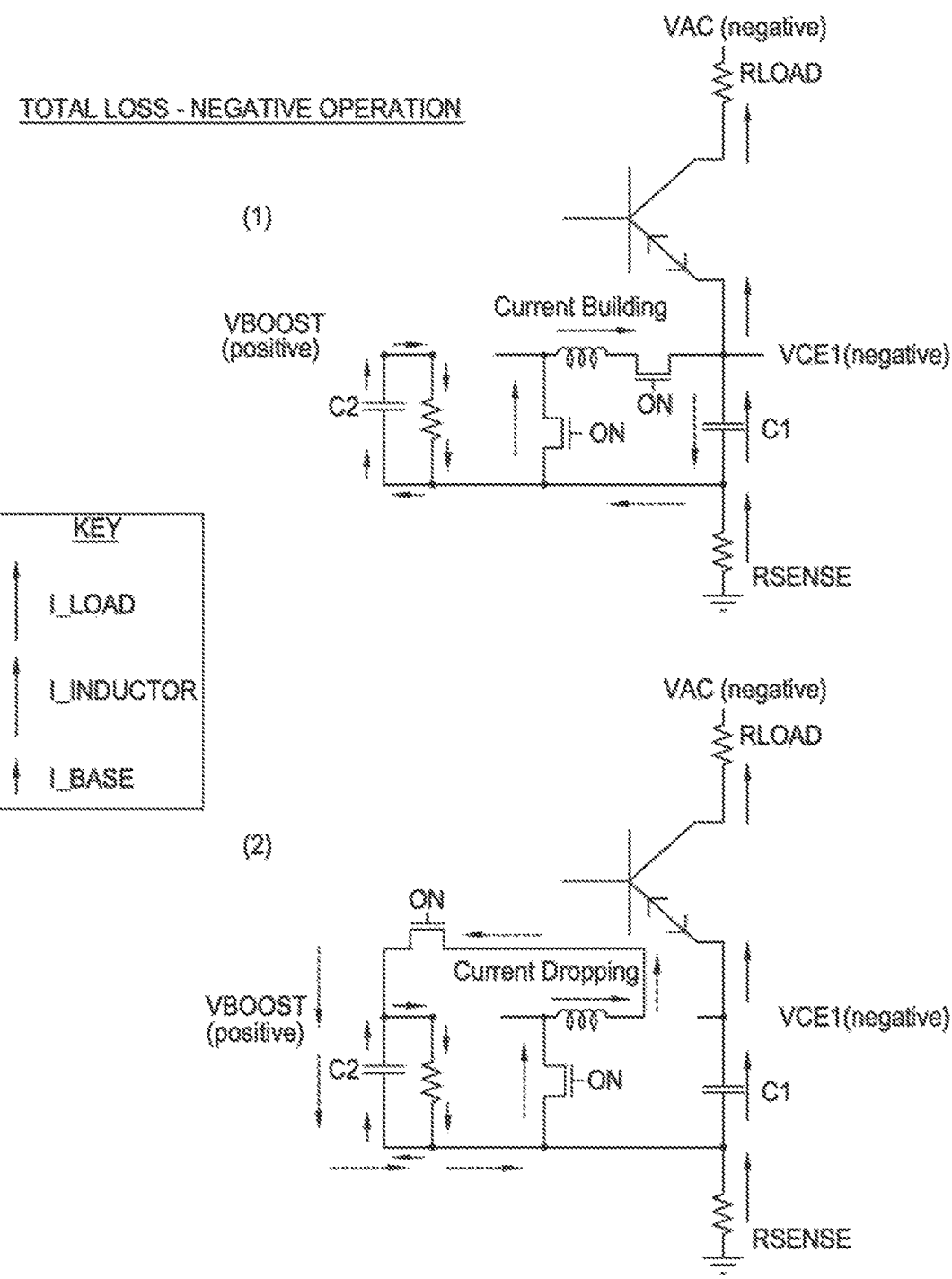
FIG. 13C is a schematic bootstrap/boost voltage circuit diagram which is operational when I_LOAD is negative.

FIG. 13 is a schematic bootstrap/boost voltage circuit diagram in which the current and voltages seen by the bootstrap/boost voltage circuit operating on CE1 terminal of the AC transistor is illustrated. The circuit is based on that described in FIG. 6.

FIG. 13(*a*) shows a +Ve voltage conduction of the AC transistor. VCE1 node has a capacitor C1 which is charged up by the I_LOAD current passing through the transistor. VCE1 works like a low voltage power source. All the power is extracted through the inductor and passed onto the BASE to replenish recombination and other losses in the base region of the AC transistor.

FIG. 13(*b*) simplifies the circuit to show the two time portions of the PWM cycle (1) and (2) feeding energy from VCE1 to a total-loss circuit (which in practice is replaced by the power supply load the control system—including microcontroller and the BASE drive). The arrangement of FIG. 13(*b*) IS for operational when I_LOAD is positive. FIG. 13(*c*) is operational when ILOAD IS negative which generally requires the voltage inversion necessary.

Closed loop regulation of the bootstrap/boost mode can be implemented by a digital algorithm operating with input ADC results from all the relevant voltages and current monitor points (of the kind shown in previous diagrams) and outputting to appropriate PWM control of base drive (similar to FIG. 2*b*).

Appendix 1 lists a python-code simulation which works with both+Ve and −Ve loads
  determined as per FIG. 6 (VTAP is same as VCE1 of FIG. 13). The algorithm first locks up the loop to achieve a current balance. When I_LOAD matches the average current in I_INDUCTOR then VCE1 voltage is stable (does not rise or fall).

An additional goal for the loop is regulation of the VCE1 to a target voltage. For example +0.1V or −0.1V is a good target. Given this voltage, the algorithm-locked DC-DC conversion process will extract power to provide to the BASE a current of approximately 1 Watt per 10-amps of I_LOAD current. Relating this to a typical VBASE of 0.75V gives a base current 1.333 A and corresponds to a "forced-beta" of about 7.5. The system automatically gives a base current in proportion to the load current without algorithm intervention but the VCE target voltage can be algorithmically changed dynamically if the transistor is seen (through ADC using circuits explained previously) coming out of saturation.

Digital Fuse/Circuit Breaker

The current-limiting and self-bootstrap power allow the complete intelligent device to operate as a two-terminal device. The unit can initially scavenge deliberate leakage current and periodically wake-up the microcontroller as has been described previously. When switching to "On" conduction mode it can run from the boost/bootstrap power and maintain very low total losses compared to a standard fuse. The boost in voltage is sufficient to power normal control circuits even though the measured voltage across the two-terminal 'Fuse' would be 100 mV or less.

Such a fully programmable digital fuse can stand in for a traditional fuse in any application and has superior 'clearing' speed if needed or can be programmed to emulate any type of slow, medium or fast fuse type with a programmable 'trip' point. Obviously it has the advantage over a standard fuse in that it is not destroyed when activated and could self-reset with time, or power cycling events etc.

TABLE

-US-00001 APPENDIX I Source code for DCDC +/− converter simulator
!/usr/bin/env python # # - this one tries to close the loop # - can do +VE or −VE # with INVERTED_MODE # # In inverted mode simulates the proper mosfet sequences. # All currents are the right sign. # INVERTED_MODE : # Only thing that gets done is to VBOOST which remains positive # and to cope with that, the switches are simulated. # the opposite sign of VBOOST is used in all the calculations # relating to how it affects the change in currents. Plus the current into C2 gets swapped. L= 1Oe-6 IL=0.0 VCEI_NOM = 0.1 VBOOST_NOM = 3.3 VCE1 = 0.0 ;#- voltage drop to work off VBOOST = 3.3 ;#- running voltage on C2 VZENER = VBOOST RZENER = 0.5 fpwm = 30000.0 tcycle = 1.0 fpwm ;#- cycle time time=O #-work out initial pwm TABLE-continued ratio for no net current accumulation PWM_ratio_NOM = 1.0 - (VCEI _NOM/VBOOST_NOM) ;#- doesnt need the + 1 because current calculated later as ramp down is from difference between VCE and VBOOST print "PWM_ratio_NOM=",PWM_ratio NOM Iaverage_VBOOST=O IL_peak_max=O IL_peak_min=O C 1 =1OOOe-6 ;#- VCE I capacitor C2 =1OOe-6 I_CEI = 10.0;#- amps coming from the switch I_BASE=O.O ;#- actually the current running around the zener in this case #- ------------------------------------------- def run_for_secs( seconds) global time,IL,Iaverage _ VBOO ST,IL_peak_min,IL_peak_max,PWJVI_ratio,tcycle,VCE 1,VBOO- ST,IN VERTED_MODE tend = time + seconds while True : print "" ton = tcycle * PWM_ratio toff = tcycle - ton #Ramp up in current IL += ton * VCE I I L; #- current increased during the on time IL_peak_max = IL #- work out the average current during the buildup phase Iaverage_VBUILDUP = ((IL_peak_max + IL_peak_min) I 2.0) * (ton I tcycle) ;#- with ton=O, this will be zero VCEI += (I_CE I - Iaverage_VBUILDUP) * tcycle I CI ;#- recalc capacitor voltage #if VCEI <O : VCEI =O.O #Ramp down in current if INVERTED_MODE == True : #invert mode, ramp down rate given only by VBOOST (other side switched to gnd) IL -= toff * -VBOOST I L else : #normal mode, VCEI reduces the I ramp down speed because it subtracts from VBOOST IL -= toff * (VBOOST - VCEI) I L #NOTE, IL is allowed to go negative --- using a switch, not a diode - it can pump current both ways IL_peak_min = IL !average_VBOOST = ((IL_peak_max + IL_peak_min) I 2.0) * (toff I tcycle) ;#- average current through the boot (diode) portion print PWM_ratio print "uS=",int(time/1 e- 6),"VCEl =",VCEl,"VBOOST=",VBOOST, "toff nS=",int(toff/1 e-9) print " IL_peak_max=",IL_peak_max," IL_peak_min=",IL_peak_min, "I_CEI ",I_CEI ,"!average_VBOOST=",Iaverage_ VBOOST,"Iaverage_ VBUILDUP",Iaver- age.sub.-- VBUILDUP if VBOOST > VZENER : I_zener_loss_on_C2 = (VBOOST - VZENER) I RZENER else : I_zener_loss_on_C2=0.0 ;#- no current if havent passed zener threshold if INVERTED_MODE == True : VBOOST -= Iaverage_VBOOST * tcycle I C2 ;# simulate the switches and swap ba else : #normal VBOOST += !average_VBOOST * tcycle I C2 #add the resistive drop VBOOST -= I_zener_loss_on_C2 * tcycle I C2; #in inverted mode, I doesnt continue from C 1 when boosting, comes from GNU instead if INVERTED_MODE == False : #Only for normal mode is VCEl affected during the boost time VCEl - !average_VBOOST * tcycle I C 1 ;#- the boost current also comes out of C 1 time += tcycle ;# move time on if time >= tend : break #------------------- #gets the PWM which would bring about a delta current change - based on current conditions of C1 and C2 voltages (VCEl and VBOOST) # - positive delta current is an mcrease current for the inductor # def calculate_pwm_for_a_delta_I (delta, scaling) #see .med global L,tcycle,VBOOST,VCELINVERTED_MODE if VBOOST == 0.0 : VBOOST = 1 e-6 ;# avoid /0 #See .med for slightly different formula if INVERTED_MODE == True : PWM_ratio_for_no_I_change = ( ( (0 * L) + ( tcycle * -VBOOST) ) I ( tcycle * (-VBOOST + VCEl ) ) ;#-so can scale +/- around the zero point PWM ratio cancelling = ( (delta * L) + ( tcycle * - VBOOST) ) I ( tcycle * (- VBOOST + VCEl ) ) ;#- which would be usable if no scaling else : PWM_ratio_for_no_I_change = ( ( (0 * L) + ( tcycle * VBOOST) - (tcycle * VCEl) ) I ( tcycle * VBOOST) ;#so can scale +/- around the zero point PWM ratio cancelling = ( (delta * L) + ( tcycle * VBOOST) - (tcycle * VCEl) ) I ( tcycle * VBOOST) ;#- which would be usable if no scaling relative_PWM_from_nochange_position = PWM_ratio_cancelling - PWM_ratio_for_no_I_change ;#- normalise scaled_relative_PWM_from_nochange_position relative_PWM_from_nochange_position * scaling ;#- scale returnval scaled_relative_PWM_from_nochange_position + PWM_ratio_for_no_I_change ;#- then put back again #clamp if returnval > 1.0 : returnval = 0.999999 if returnval < 0.0 : returnval = 0.000001 return returnval #------------------- #Iterate with various currents ~~~~#SET THE TARGET VOLTAGE on VCE 1 VCEl _target 0.15;#- can be + or VCEl_tune_resistance_ohm = 0.2 ;#- effective if VCEl_target < 0.0 : INVERTED_MODE = True #VCE 1_target = 0.0 - VCEl_target ;#- Put it back to being a positive one else : INVERTED_MODE = False PWM_ratio = PWM_ratio_NOM old_VCEl = VCEl #Keep I_CEl as positive number, will use INVERTED_MODE (when VCE 1 is negative) to send currents the other way for I_CEl in [10] : if INVERTED_MODE == True : I_CEl = 0.0 - I_CEl for cycle in range (450) : #Can work out what the I imbalance in C 1 is by rate of rise of voltage on it delta_I = C 1 * (VCEl - old_VCEl ) I tcycle ;#- If new voltage greater than old voltage then cap is risign from not enough juice taken out #So work out a duty cycle which will send towards zero #- see .med delta_I_gain = 0.75 #Think this an integrating effect. Result gives the delta to change the current by in each cycle based on the voltage error VERROR = VCEl - VCE 1_target CHANGE = VERROR / VCE 1_tune_resistance_ohm ;#- if VCE 1 is too high, this gets positive print "ICHANGE",ICHANGE PWM_ratio_cancelling calculate_pwm_for_a_delta_I (delta_! +!CHANGE, delta_I_gain ) print "cycle#",cycle print "delta_!", delta_!, "PWM_ratio_cancelling",PWM_ratio_cancelling PWM ratio PWM_ratio_cancelling old_VCEl = VCEl run_for_secs(tcycle) print "--------------------------------- ------------------------------- -------------------------------------- ---------" print "- RESULT @ I CEl = " I CEl print " VCE 1 = " VCE 1 print "--------------------------------------------------------------- - ------------------------------------- ---------"

Detailed Fabrication Techniques

The diagrams and notes are example methods of manufacturing the bi-directional BJT device.

The processes will mostly be with reference to a PNP input (main) transistor but the same techniques are applicable for the JFET version.

Figure 14:
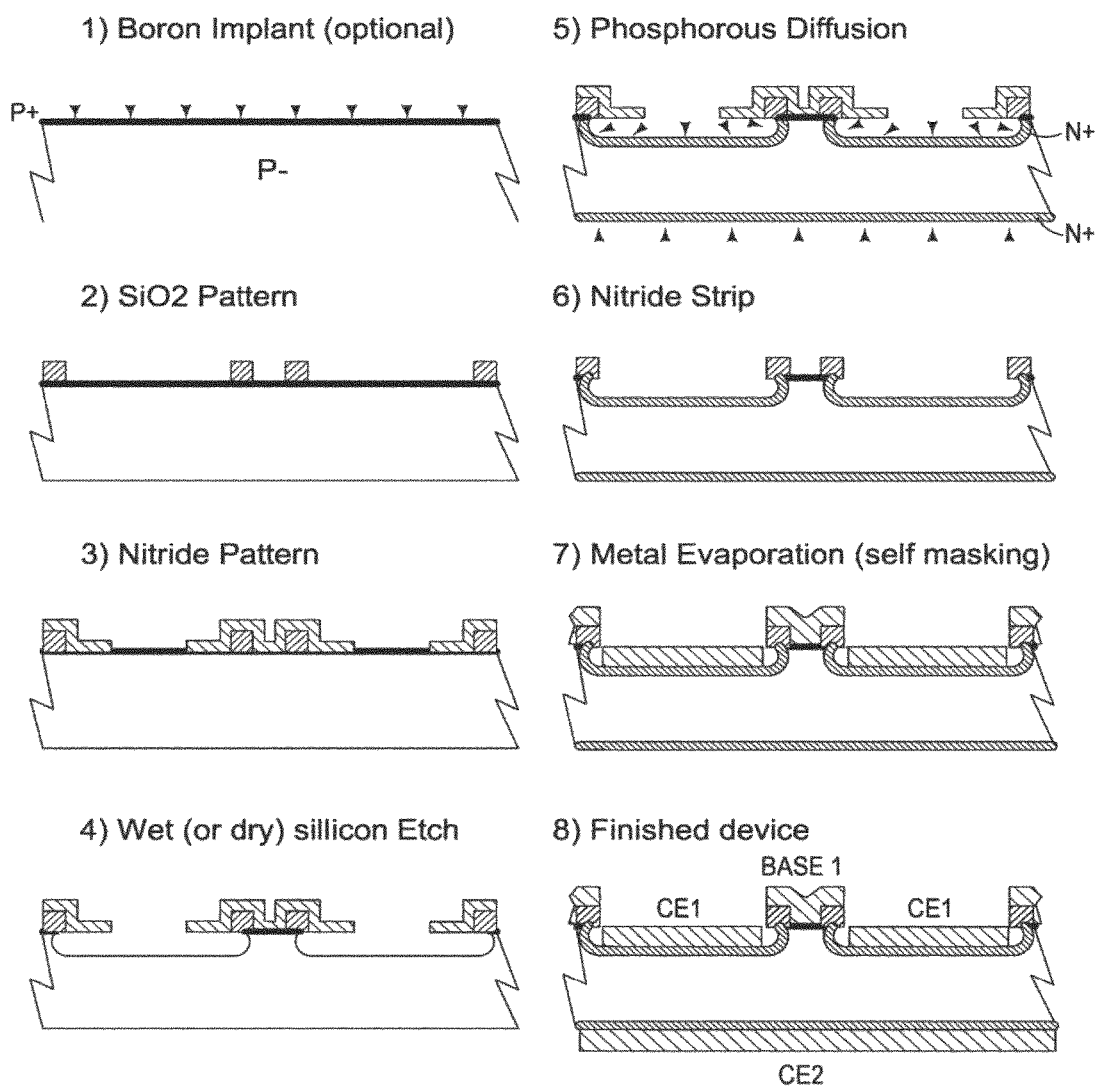
FIG. 14 illustrates process steps of a bi-directional BJT device (JFET-base transistor) using Nitride.

FIG. 14 illustrates the process steps of a bi-directional BJT device (with a JFET second transistor) using Nitride. These steps use a combination of Silicon Nitride and Silicon Dioxide as masking/insulating materials. One advantage of these steps is that the lithography for two masks can be done prior to the etching processes and the wafers do not need to be returned to lithography part-way through production.

FIG. 15 illustrates the process steps of a bi-directional BJT device (with a JFET second transistor) using oxide only. As to the steps of FIG. 14, these steps do not use Nitride but with the 2 oxide masking/etch steps at different point in the manufacturing process.

FIG. 16 illustrates the process steps of a bi-directional BJT device (with a BJT second transistor) using oxide only. In these steps 2 oxide masking/etch steps are needed FIG. 17 illustrates the processing steps of manufacturing the bi-directional device (BJT base transistor) using a single mask in {100} and {110} etching methods. In these steps, one oxide masking/etch step is used. This is advantageous since there is no need for a second mask layer and it also provides alignment accuracy. The process relies on the anisotropic wet chemical etching of crystalline silicon using KOH, NaOH, TMAH, EDP or similar solutions. The contact holes for CE 1 are small openings whose edges are controlled by the {111} planes to make 54 degree inverted pyramids whose sidewalls can be calculated to come to a point at a precise depth below the initial silicon surface. After this, etching stops which gives a controlled depth independent of further increases of etch time. The trenches for BASE are oriented on the {100} direction and etch downwards at the same rate as laterally and give vertical sidewalls with 100% undercut ration. Etching is not self-limiting and is controlled using time.

Figure 18:
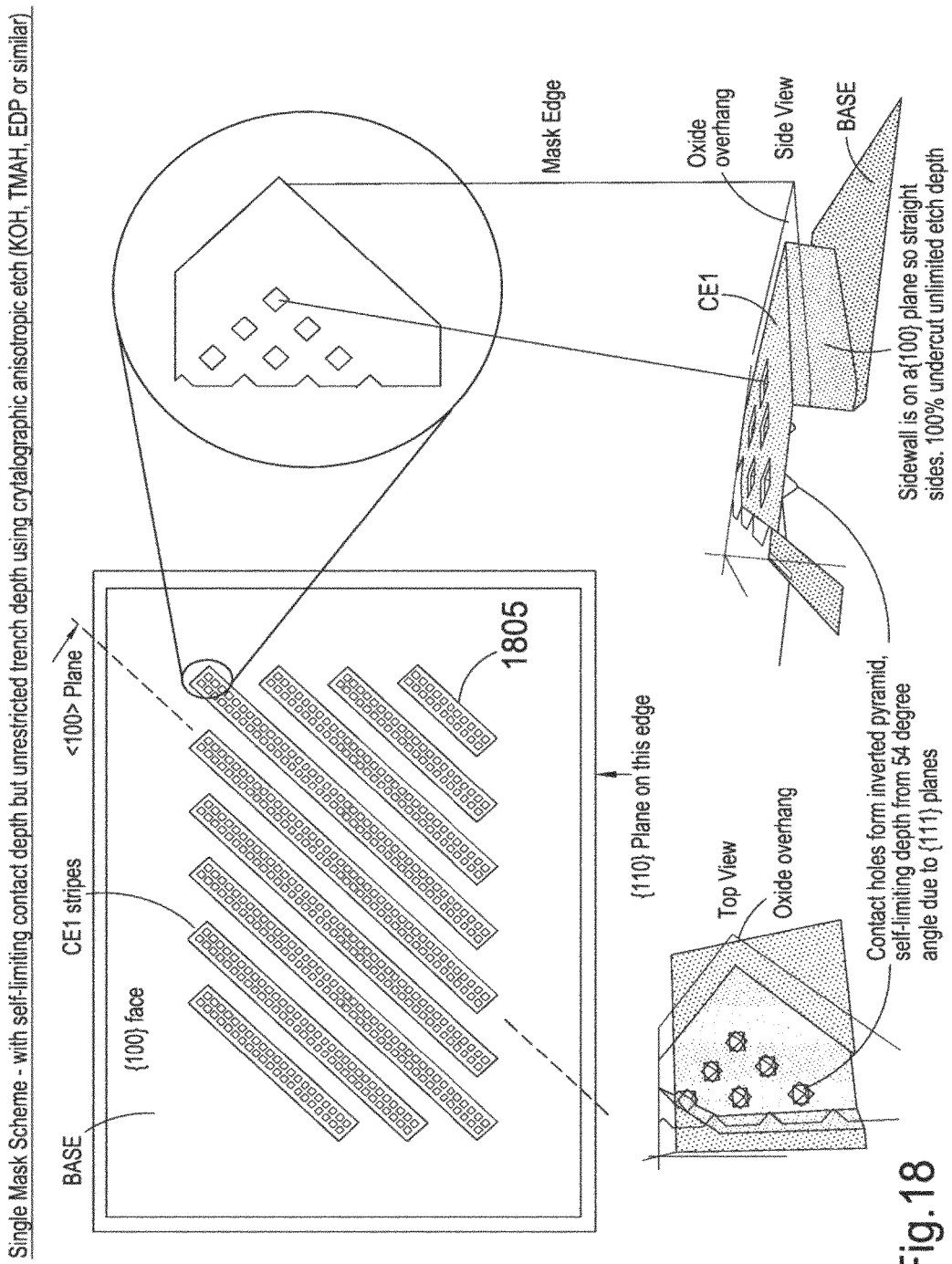
FIG. 18 illustrates an alternative single mask scheme with self-limiting contact depth.

FIG. 18 illustrates an alternative single mask scheme with self-limiting contact depth. In this scheme unrestricted trench depth using crystallographic anisotropic etch is used. This has the 2D mask artwork for forming a PNP-BASE transistor 1805 on a standard {100} oriented silicon wafer. The wafer flat {110 plane} is aligned to the bottom edge of the layout. Provided that the CEI contact openings are small relative than the desired trench depth then the CEI contacts will only penetrate into the very heavily doped top region of the N+ CEI diffusion. A 3D result from an etching simulator is shown for KOH as the etchant. From the cutaway view the underside of the etched pyramid profile can be seen.

The trench depth is not limited for CEI because the 2D outline forms a convex shape bounded by {100} vertical planes (due to the 45 degree rotation of the artwork). This allows independent control of the trench depth determined by (etch-rate*time), and this BASE trench depth is chosen to cut into the phosphorous diffusion to a lower-doped region where functionality of the PNP transistor is improved (see doping profile below). However, when Boron diffusion is applied to form the BASE of the composite device (i.e. the emitter of the PNP) it also dopes the CEI contact openings to .about. 1 e20/cm3 with boron atoms. This may not sufficient to over-compensate the previous Phosphorous diffusion of .about. 1 e21/cm3 so the contact remains ohmic and only the nature of the N+ is seen in CEI terminal. The next step would be to apply thermal Aluminium evaporation where the oxide overhang (resulting from the undercut) makes independent contact to the CE I and BASE regions. If the gap between CEI stripes is minimised it might be possible for the aluminium to bridge over the small gaps in the oxide to form a single CEI terminal with no additional wire-bonds.

FIG. 19 illustrates singulation/bevel/passivation steps for the bi-directional BJT device. To obtain a high breakdown voltage in a semiconductor material, it requires careful control of the edges of the device. At the edges and along the surfaces of the depletion region leakage currents can arise which lead to much lower than expected breakdown voltage of the junctions. These issues have been solved m many ways in the past but for AC devices there are complications m that the method 1 s likely to be symmetrical. Reference "double_bevel_edge_termination_for_bidirectional_devices.sub.—1974.pdf" is a paper from 1974 outlining the method of double-positive-bevel edge termination where it was achieved using sandblasting. This same profile can be achieved here with an anisotropic etch technique.

First the wafer is held by the front surface using a special vacuum chuck with rubber sealing strips. Then X and Y deep grooves are sawn with a diamond-coated grinding wheel from the rear—almost the entire way through the wafer. This is followed by anisotropic etching again from the rear side of the wafer to yield the required double-positive-bevel profile in about 20-50 minutes of etching with 15% KOH at 100.degree. C. Following the {111} planes up and down reveals a very smooth double bevel angle which is ultimately intersected and terminated. The bevel exists around whole outside profile of the die, including corners. To smooth the facets, a final isotropic etch can be used. Etching stops at the SiO.sub.2 layer. At the end of etching process, the devices are held together by just a thin SiO.sub.2 oxide layer and an aluminium layer which are on the front-side of the wafer and can be easily singulated—but first a passivation layer is needed to cover the side profiles of the device. This passivation seals out contaminants, controls the electrical charge on the layers and reduces surface recombination. For P-type silicon, use can be made of a commercial of alumina (Al2O3) passivation technique from solar wafer production called atomic-layer-deposition machines (ALD).

So-called spatial-ALD involves sending the wafers forwards and backwards down a line of alternative precursor gas chambers to rapidly build up monolayers of material.

FIG. 20 illustrates electric field distributions in the bi-directional device. The two lower pictures are the electric fields modelled with Silvaco Atlas tool of +1400V and −1400V applied between CEI and CE2 terminals with BASE at 0 v. The simulation has cylindrical symmetry around the X=O line. When the simulation is run without the double-positive bevel, breakdown voltage occurs below 900V due to the electric field exceeding 2e5 V/cm at the surface of the silicon.

Figure 21:
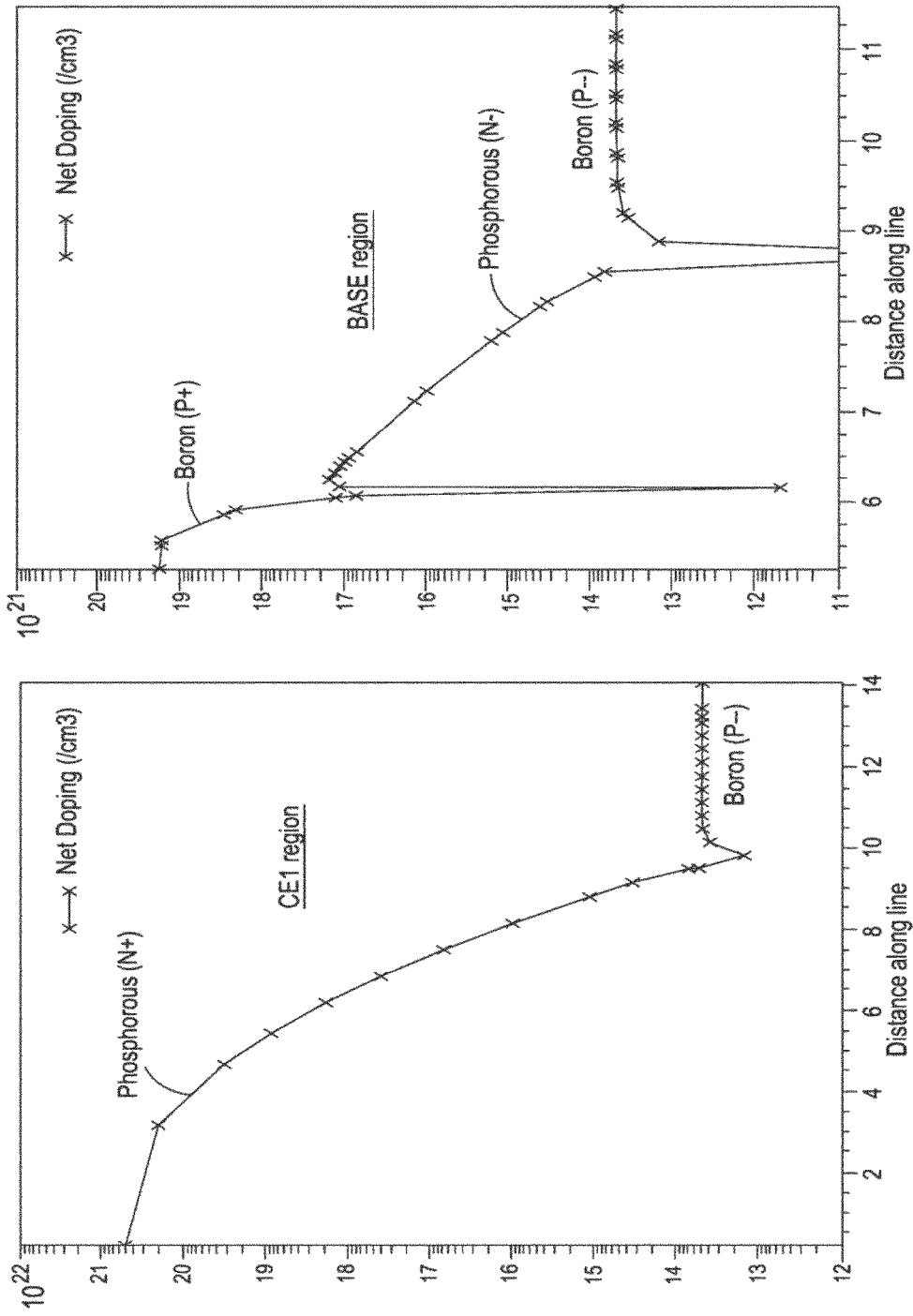
FIG. 21 illustrates the doping concentrations in a bi-directional BJT device.

FIG. 21 illustrates the doping concentrations in the bi-directional BJT device. The doping concentrations are taken in the Y direction in a line straight-through the wafer, missing the BASE region. The right-hand trace is the doping profile at the BASE region.

Base Resistors On-Die.

Figure 22A:
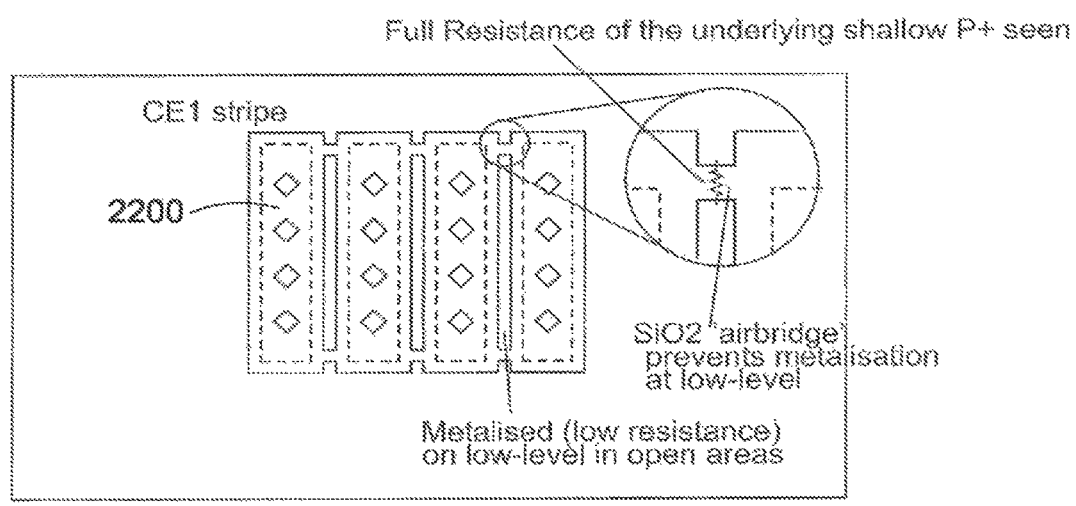
FIG. 22A illustrates an array of CE1 stripes.
Figure 22B:
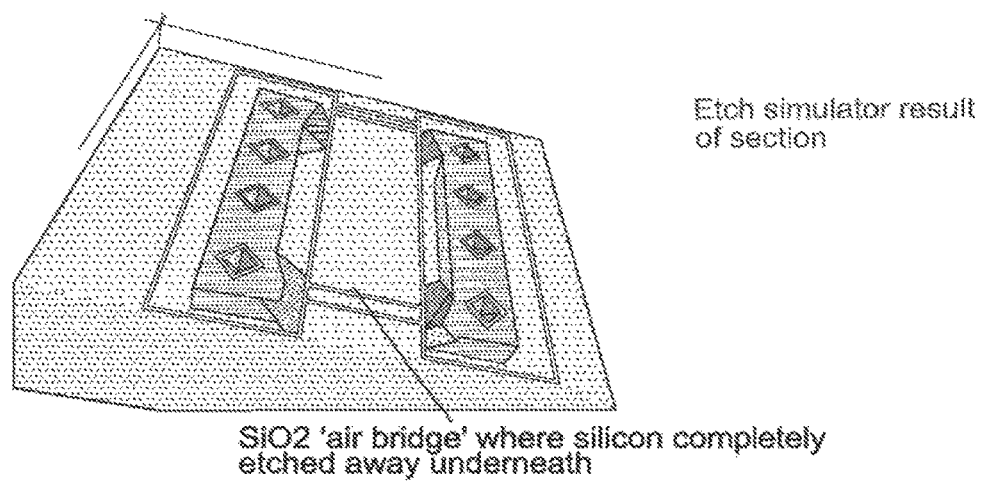
FIG. 22B shows an alternative view of the array of CE1 stripes in FIG. 22A.

FIG. 22 illustrates an array 2200 of CEI stripes. On-die variations of doping levels, junction thicknesses and recombination lifetimes can prevent even a monolithic device acting as a single ideal device even when the arrays of CEI stripes are hardwired together. Instead it will act as a parallel collection of slightly mismatched transistors. This mismatching can result in current crowding in certain regions of the device, hot-spots and generally lower than calculated performance. For the BJT type devices operating with a voltage mode base-drive, a 2:1 mismatch of base current between any two stripes can arise from about a 25 mV (kT/Q) offset in locally-process-dependent BASE voltage of the two stripes.

To reduce this effect, series resistance can be added to the BASE of each sub-device in the parallel array. This has the effect of more equally sharing the common BASE input drive current amongst the sub-devices despite VBASE differences.

The required series resistance can be obtained by use of the P+ diffused regions which themselves are shallow and quite resistive. FIG. 22 illustrates how an air-bridge can be created by defining a narrow sliver of $SiO_2$ which upon etching is fully undercut and left suspended in mid-air.

$SiO_2$ Air-bridge concept can also be used on the JFET-base device in order to link up the multiple bases electrically to one another.

Slab Inductor for Bootstrap System.

It is known that adding bootstrap circuitry gets over one of the older drawbacks of BJT technology, namely that a not-insignificant current drive has to be found to drive the BASE of the device. Thyristors and Triacs although bipolar technology, actually self-power the BASE currents from the through-currents (inherent 0.7 to 1V drop however), but the end user does not have to create a continuous current drive. Therefore Thyristors and Triacs are still very popular for AC power switching applications.

Figure 23:
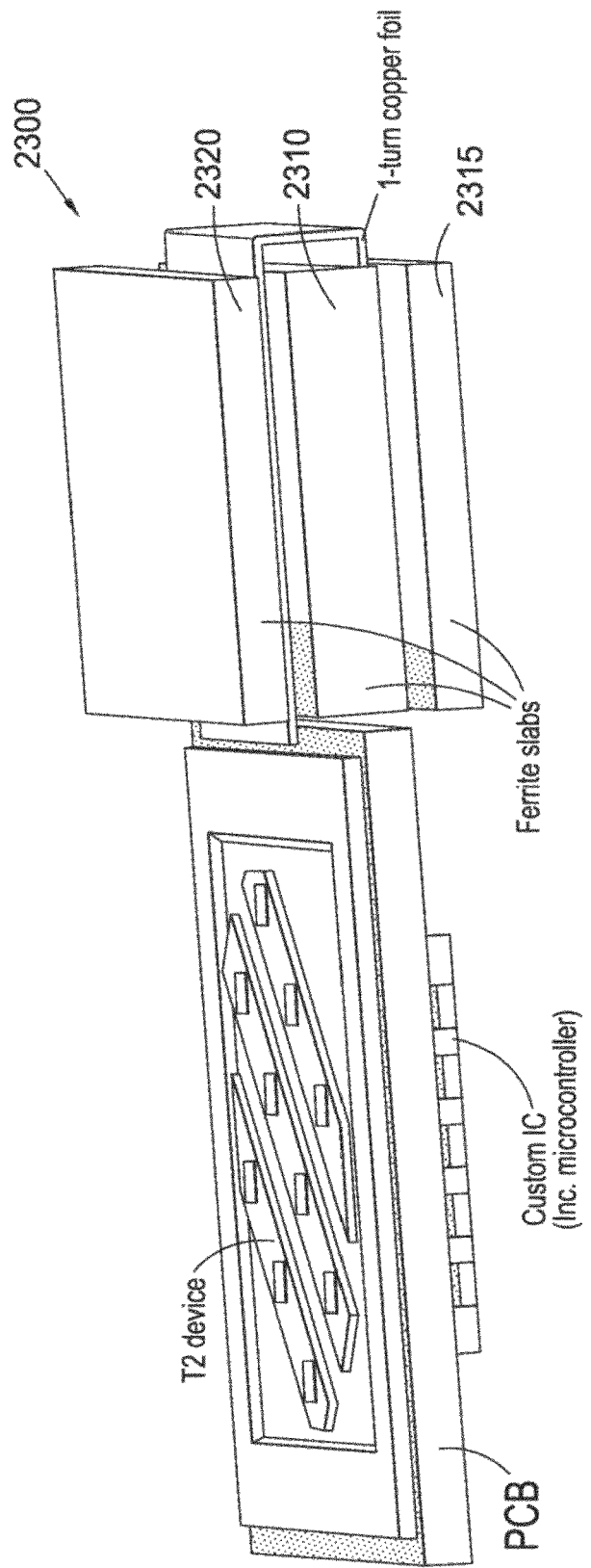
FIG. 23 illustrates a solid state relay module including a 'slab·type inductor for bootstrap DC-DC.

FIG. 23 illustrates a solid state relay module 2300 including a 'slab' type inductor for bootstrap DC-DC. It is effectively a I-turn 'E' core. The centre plate 2310 is twice the thickness of the top and bottom plates 2315, 2320. Flux is split 2-ways exactly like a standard E core. An air-gap default of the copper-foil thickness is apparent to allow high current operation without saturation.

The complete module 2300 is an intelligent power switch/relay/fuse able to power itself from the through-current of the switching element when on, and from leakage current when off Bi-Directional BJT Device Theory of Operation and Drive Systems.

Operation of the different regions of the device follows the principles of bipolar junction transistors and/or junction field effect transistors. Primary conduction path is formed when minority-carrier injection causes conductivity modulation of an otherwise lowly-doped, voltage-sustaining, "bulk" region. This path is similar to that in a standard Thyristor and is therefore well proven. In terms of conductivity it is preferable to use a P-type semiconductor for the bulk where the minority carriers injected are electrons which have at least 2.times. higher mobility and diffusivity versus holes. Another reason for using P-type semiconductors is that solar-cell P-type wafers, which feature an optimised high minority-carrier lifetime, are available at extremely low cost.

For the highest voltage operation (typically >2 kV) an N-type conductivity-modulated region is commonly used due the availability of nuclear-radiation doped silicon (radiation mutates silicon into phosphorous at a very well controlled rate).

A driver circuit is described later which supports both P-bulk and N-bulk devices and has facilities for bootstrap.

Description of the Operation:

FIG. 24 illustrates the off-state and on-state operations of the bi-directional BJT device in accordance with the present invention. The diagrams attempt to show a coarse-grained doping level using circles to represent electrons (filled) and holes (unfilled). The same symbols are used to show moving carriers during conduction. The diagrams show a half of a device symmetrical about the X=O line. In practice many 'stripes' are arranged in parallel to form a large device. All diagrams are for P-bulk devices. N-bulk devices would have all voltage polarities reversed and NIP doped regions reversed.

Off State Operation of a BJT PNP-Type Base Device

FIG. 24(a) is an illustration of a bi-directional BJT device (BJT PNP base) with zero bias on all the terminals (CE1, CE2 and BASE). A small depletion region 2405 exists around each junction of the device.

FIG. 24(b) is an illustration of a bi-directional BJT device (BJT PNP base) with a large positive voltage on CE2 with the other two terminals still at zero volts. A large depletion region exists between the CE2 and the bulk, drift region.

FIG. 24(c) is an illustration of a bi-directional BJT device (BJT PNP base) with a large negative voltage on CE2 with the other two terminals still at zero volts. The area of the sunken base region 2415 is much smaller than the CE 1 region 2420 with the N+ doping and this doping combined with the N− doping under the base helps to ensure that the P− bulk region 2425 is fully depleted giving much the same voltage breakdown characteristic as a uniformly N++ top region would give.

On-State Operation of a BJT PNP-Type Base Device:

FIG. 24(d) is an illustration of a bi-directional BJT device (BJT PNP base) with CE2 at +0.1V, CE1 at 0V and BASE at +0.6V. The main current flows when the device turns on under a condition where CE2 terminal which is slightly +Ve (e.g. +0.1V). This represents the condition after fully switching of a load has been achieved (prior to this there could have been over 1000 volts over the switch) and now just an 'ohmic' characteristic is seen across the switching terminals of the device. In the PNP base region 2415, where the N part is part of the CE1 terminal, holes are injected and diffuse through into the P-bulk region 2425 of the main conduction NPN region making a low-voltage-drop connection between BASE 2415 and P Bulk 2425. Although both CEI/P-bulk and CE2/P-bulk junctions become forward biased, the larger forward bias exists to CE I/P-bulk (0.6V applied verses 0.5V applied over the CE2IP bulk) and so more electrons diffuse into the P-bulk from the CEI end than the CE2 end. Also, more holes drift to that end of the device to provide the 'base' (recombination) current of the main NPN transistor.

FIG. 24(e) is an illustration of a bi-directional BJT device (BJT PNP base) with CE2 at −0.1V. This is generally the case after fully switching a negative voltage to a load. In this case a nominal 0.6V Vbe is achieved with only 0.5V of base voltage. The extra 0.1V is provided by the −0.1V CE2 voltage. For the reasons given previously and as seen in FIG. 24(e), hole current flows more down the CE2 where electrons are being injected more rapidly.

Note on Doping:

For efficient operation of the integrated two-transistor system it is useful that the built in voltage of the PNP base/emitter junction is higher than the NPN base/emitter junction of the main input transistor. When this is done the PNP acts as a switch whose emitter hole current mostly runs usefully to the bulk region 2425 instead of through diode-action to CEI. The built in voltage depends on the doping according to the following equation.

$$V\ builtin := VtIn(NaNdNi2) \qquad \#\#EQU00001\#\#$$

Here Ni is intrinsic carrier concentration at temperature and Vt=k*T/q. This is usually the case when the doping of the bulk region is very low to support a high voltage but it sets a minimum doping requirement for the base 2415 of the PNP (and hence a maximum etch depth of this feature).

Operation of a JFET-Type Base Device

It should be stated first of all that the JFET input circuit does not give the device a high input impedance. This is because the JFET operates in a 'common-gate' mode where the input terminal of the bi-directional (T2) device is effectively the source of the JFET.

Off-State Operation of a JFET-Type Base Device:

FIG. 25 (*a*) is an illustration of a bi-directional BJT device (JFET type base) with a zero voltage condition. The N+ and N regions abutting the BASE will fully deplete the short vertical channel region 2510 of holes. Construction of this normally-off JFET type base normally requires very tight control of doping and geometry. Even the maximally doped N+ region is only able to deplete around 3 microns of a typically doped P- bulk material. This means that the vertical JFET channel 2510 will tend to be less than 6 microns in the X direction (assuming N+ is on both sides of the channel).

In FIG. 25 (*b*) the channel is still depleted when BASE=0V but in this case this may not have an effect since the high voltage drop is supported at the CE2 end 2520 of the device and there is no tendency for current flow in the channel 2510 of the JFET type base.

FIG. 25 (*c*) shows that the CE1 and JFET depletion regions are joined together. As the JFET region is only a very small area relative to CE1, there is negligible loss of ability to form a high voltage withstanding depletion region in the usual way.

On-State Operation of a JFET-Type Base Device:

FIG. 25(*d*) and FIG. 25(*e*) show the on-state operation which is very similar to the PNP base type device as illustrated in FIG. 24 (*d*) and (*e*). The only difference here is that holes flow directly from the BASE to the bulk whenever BASE is higher than the pinch-off voltage of the JFET that was formed. Holes do not need to diffuse through a region of opposite doping as was the case for the PNP-type base in FIG. 24. An advantage of the JFET type base over the PNP type base input is that none of the BASE current of the T2 device is lost to base current of the PNP input stage which saves about 5% of the input drive current. A further advantage comes from the fact that the pinch-off voltage at about 0.3V is generally less than 1.times.Vbe and could allow a driver circuit to remove charge from a saturated device without a reverse biased junction preventing it.

Improved Bootstrap Circuitry

Figure 26E:
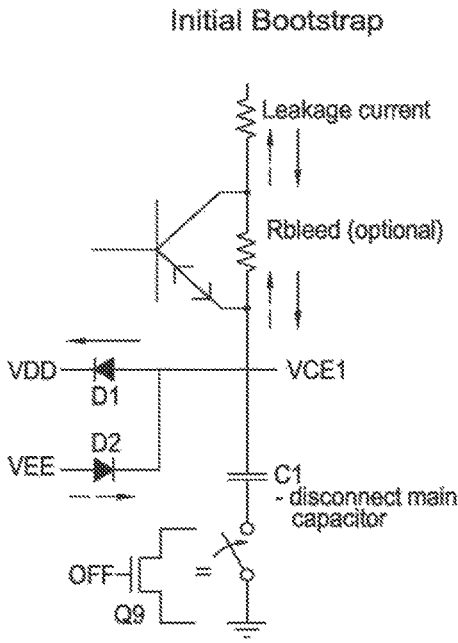
FIG. 26E illustrates the arrangement of FIG. 26A initial bootstrap circuit.
Figure 26F:
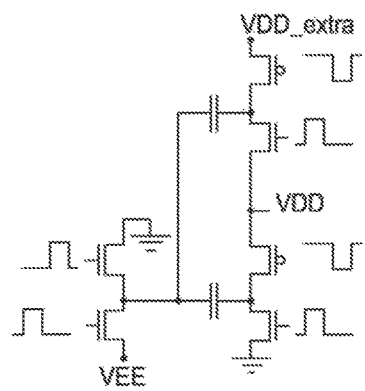
FIG. 26F illustrates the arrangement of FIG. 26A charge pump circuit.
Figure 26G:
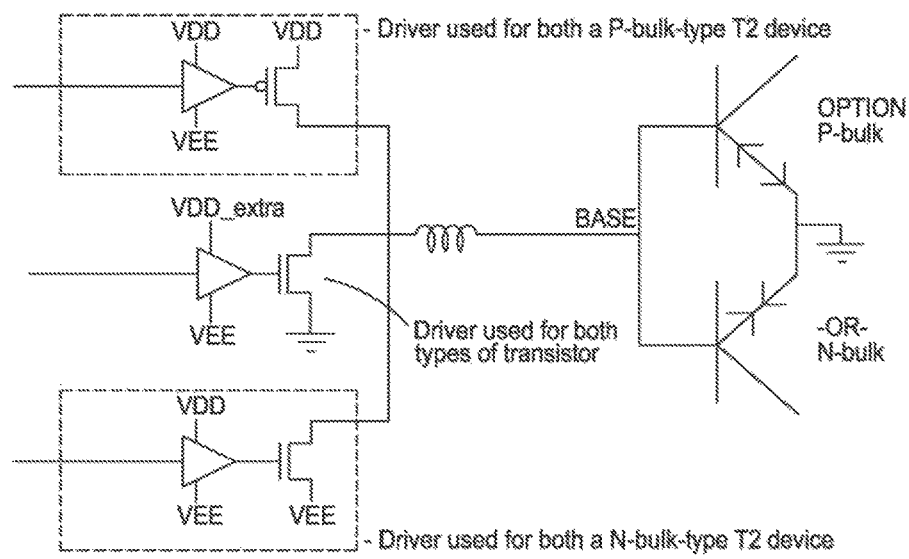
FIG. 26G illustrates the arrangement of FIG. 26A base drive circuit.

FIG. 26 illustrates improved bootstrap circuitry m accordance with the present invention. Unlike a standard Thyristor or Triac, the T2 devices do not have a mechanism for self-sustaining turn on. For Thyristor or Triac this mechanism comes at the price of approximately 1 W of loss per amp of switched current. The T2 device can reduce this by a factor of around 10 by exploiting the inherent current-gain of the BJT structure. However this may use additional circuitry.

FIG. 26 A, B illustrate an arrangement of switches which operate in two phases to multiple a low voltage at CE1 of typically <+0.1V to VDD voltage of typically +1V. The MOSFET switches (Q1, Q2) are controlled by a PW1YI controller within a microcontroller. Q1 switches to charge the inductor 2610 with flux with C 1 acting as input filter capacitor. Q2 switches the positive boost current to VDD and onto C2. Voltage boost is set by the duty cycle.

FIG. 26 C, D illustrate arrangements in which CE1 is negative (as it would be when an AC load current reverses). The current build-up in the inductor is of the opposite polarity. When Q1 disconnects in this case, Q3 is switched to VEE to generate a negative voltage of typically -1V. A different switch Q3 steers the negative boost to C3. There is a standby mode where this DC-DC converter can be shutdown to save power.

FIG. 26 F) is a self-explanatory charge pump circuit. This can bi-directionally couple +VDD to -VEE transferring energy from one rail to the other under the microcontroller command. This means that +1V and -1V (2V total) is available to power the microcontroller whether or not the T2 device is switching is positive, negative or AC.

Drive Circuit Improvement

FIG. 26 G) is a base drive circuit which works with VDD, VEE and GND and is again driven by a PWM within the micro-controlled chip. This can be controlled to produce a positive base current for a NPN type T2 device (P-bulk region) or a negative base current which would drive a PNP type T2 device (N-bulk region). In discontinuous mode, the PWM ratio sets the BASE current.

At 100% PWM the maximum voltage available to the base is either +VDD or -VEE.

Initial Bootstrap Circuit

Prior to the Inductive DC-DC switch on, and prior to the switch on of the charge pump the circuit must accumulate enough energy to be able to successfully start-up. FIG. 26 E) illustrates a circuit which can take either positive or negative leakage current and store it on VDD (C2) or VEE(C3) via the diodes D1 or D2. Circuitry inside the control chip e.g. low frequency microcontroller mode, can start up on just 1.2V from either VDD or VEE.

Providing that C2 and/or C3 are large enough there would be sufficient energy for a self-sustaining boot up of DC-DC and charge pumps when the T2 device is commanded to turn on. Until a command to turn on the device, an ultra-low power standby mode can be maintained which supplied only from leakage. If the inherent T2 leakage current (thermally generated semiconductor leakage) is present, then a bleed resistor in parallel (shown) can ensure sufficient current. Q9 is an NMOS switch which is able to isolate capacitor C 1 during the start up, since C 1 might be of such a high value that during 60 Hz AC operation its voltage does not swing sufficiently to allow the diodes D 1, D2 to operate.

Controller Chip Construction

Many of the MOS switches used in bootstrapping operate at high current (same current as going through the T2 device) but because they are low voltage switches they are fabricated on the same die using the same deep-sub-micron transistors as the microcontroller. "On" resistance for NMOS FETs built on a 0.15 u process are approximately 0.0005 Ohm*mm·sup.2. It therefore only needs several mm·sup.2 of die area to implement those MOS Switches.

T2 Devices as being a Replacement of IGBTs

BACKGROUND

This document expands on the driver circuits for the T2 device (previously called IBT in the text—particularly but not exclusively to the JFET input transistor device). It notes that a re-think is needed for the role of current-mode transistors in modern electronics. It also looks at how to make a functional equivalent to the ubiquitous IGBT transistor at less cost and with better performance.

Comparing Current-Mode to Voltage-Mode Drive of Power Semiconductors in General: Voltage Mode Gate Drive:

MOSFETs and IGBTs have a voltage-mode on/off control where a voltage sufficiently high (10V typ.) on an insulated-gate causes an inversion channel in the underlying lowly-doped semiconductor switching it from off to on. Once this voltage has been established on the gate then no more current is needed to maintain the switch in the on-state. In theory, the driver circuit need only be a low current circuit and is simple to make. In practice, when switching quickly, many amps of current are needed to allow fast charging of the gate for efficient turn on and off of the device. The average gate power consumption is still very low but even so, MOS devices require a high voltage (typ. 15V rated) control driver process able to supply several amps of pulsed current. Historically, when the power MOSFET and IGBTs appeared in the 1970s, 1980s most control systems used +/−15V supplies so the high voltage gate was not seen as a problem. Today it is rare to see analogue control circuits operating above 5 volts and logic ICs operate at less than 3.3V.

Current-Mode Base Drive:

The bipolar junction transistor (BJT) is the archetypal current-mode device which requires a current drive into its base to turn it on. The voltage level is low, generally less than 0.9V for a silicon device over temperature. Initially the current goes to charge the junction capacitance but continuous current flow is required thereafter to maintain the switch in the on condition. The continuous base current resupplies the injected carriers which are lost due to recombination in the device. The higher the 'Beta' current-gain of the transistor, the lower the continuous base current needs to be.

Base current power loss is often seen as non-negligible, yet it is generally overlooked that this reaps disproportionate gains in efficiency elsewhere in the device. For example a 25 A collector current BJT with a Beta of 10, needs 2.5 A of base current to stay fully on. Assuming a base voltage of 0.75V this equates to 1.9 W of power. To make a fair comparison between various MOS and BJT type devices, (and in the base of bootstrap base-current generation where this base power is not seen externally), it is useful to consider this loss as an effective addition to the 'On' resistance of the devices. The example loss just mentioned equates to 3 mOhms of on resistance which for a high-voltage MOSFET is an impossibly low figure to match.

For efficient operation, a BJT device should be driven with 'just-enough' base current to maintain the collector current at low Vee (sat). With the technology available in the 1970s, base drive circuits to achieve dynamic control of saturation were bulky, expensive and non-optimal. Therefore BJTs were quickly displaced by power MOSFETs at least in the low voltage application area.

Today however where a single chip microcontroller is able to fully control a BJT in real-time (32-bit microprocessor including FLASH, RAM, 12-bit ADC, Quad PWM, Serial ports can be bought for .about.$0.50) the situation is completely different.

Furthermore, low voltage, high current systems such are now common—a typical server microprocessor is powered over PCB traces at 150 amps at 1 volt, and inductor based DCDC modules to supply these needs are small (recently this entire system including inductors are integrated on-chip on the Intel Haswell microprocessor).

Advantages of Current-Mode Low Voltage Drive can be implemented in standard logic process with PWM, adc and drivers (low voltage .about.0.9V maximum needed for a P/N junction in silicon)

possible to integrate the with microprocessor with driver for system-on-chip reverse base current can turn off devices quicker than without (compare to IGBT)

Adiabatic recovery of a much of base charge (inductor versions)

Inductive Base Drive Circuits for Current-Mode Power Transistors

Figure 27D:
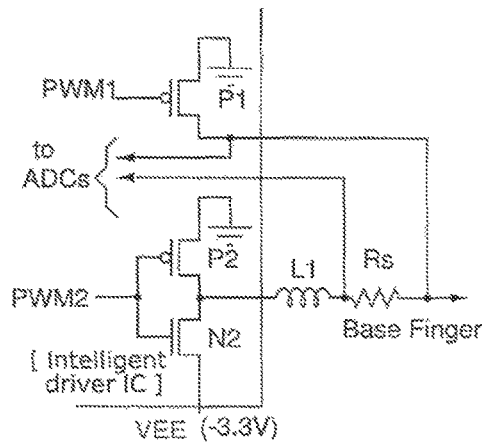
FIG. 27D illustrates base finger driver for use with the driver circuit of FIG. 27A.
Figure 27E:
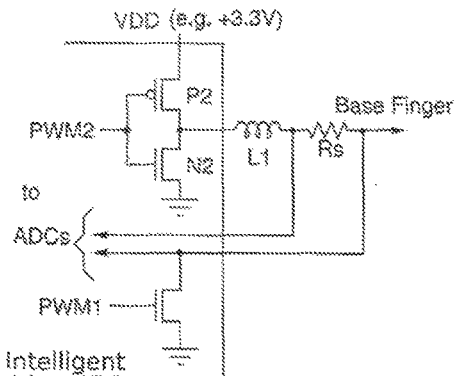
FIG. 27E illustrates alternative base finger driver to that shown in FIG. 27D.

Previously the benefits of having multiple base current balancing resistors have been discussed to ensure matching of the BJT fingers (see the description with reference to FIG. 22). Should there be a problem with uniformity of silicon characteristics within the die of a single device. The same balancing effect can be achieved by modification of the previously described inductive buck-mode PWM driver to split the output into multiple inductance branches of the base current driver. This is shown in FIG. 27a for matching on-die but could also be used to match multiple die which are operated in parallel. Again this feature is optional. An advantage of using inductors to match currents is that there are lower losses than using resistors. The variation of current from one device to the next is proportional to the difference between VBE and the peak drive voltage to the inductor.

During the 'On' period, the average base current can be controlled using a discontinuous-current inductor drive. Base current is proportional to the PWM ratio 2.

Discontinuous operation occurs when the off-time is long enough for the inductor current to drop to zero before the next positive pulse. The discontinuous nature will not cause switch-off of the T2 device if the PWM frequency is sufficiently high. When the PWM period is short the amount of charge given in the PWM period is much less than the saturation charge accumulated in the BJT junctions of the T2 device which act as a capacitive filter to the base current.

Figure 28:
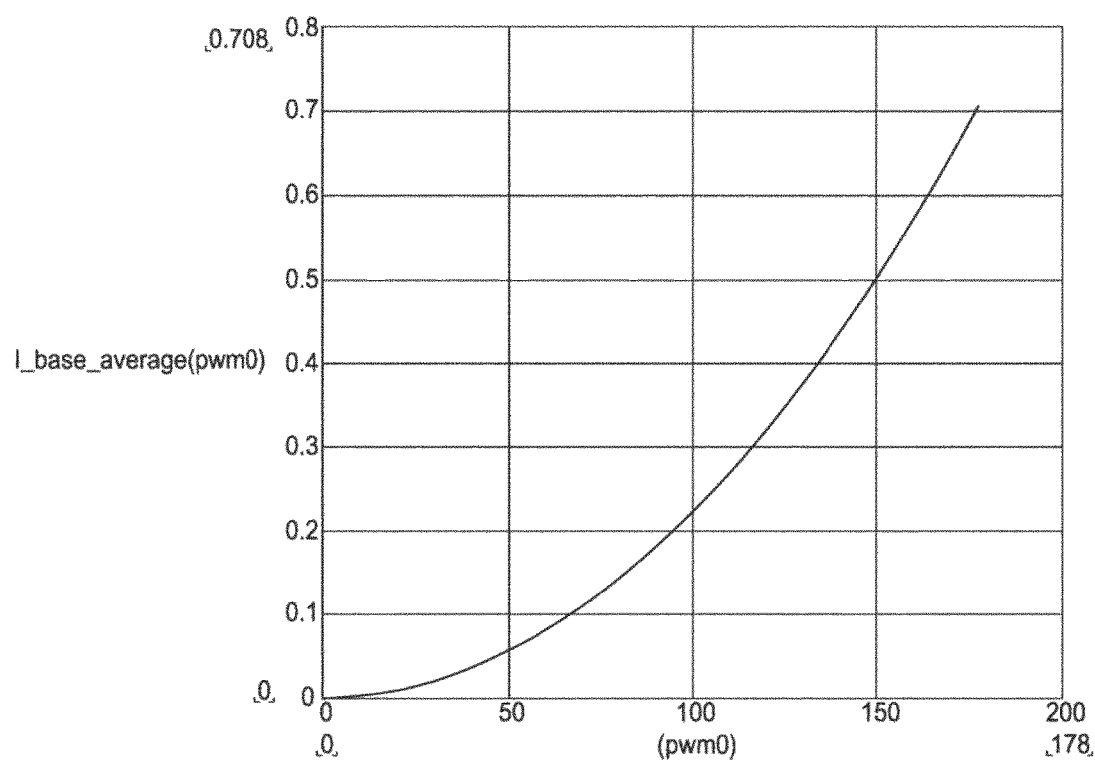
FIG. 28 illustrates a transfer curve of current vs. PWM value (0-255 range) for one path showing that discontinuous current drive is highly non-linear.

FIG. 28 is a transfer curve of current vs. PWM value (0-255 range) for one path showing that discontinuous current drive is highly non-linear.

Advantageously, if the PWM inductive paths are split and independent, it gives an opportunity to add multiphase operation.

FIG. 27b suggests that the same PWM duty cycle is given to each of the paths or advantageously the waveform of each path may also be phase-offset between each other to help to reduce switching noise and reduce ripple current.

Using ADCs, the microcontroller can be aware of and command the positive or negative current build-up (turn-on, turn-off respectively) by holding the output positive or negative until the desired current is calculated or measured to exist. Or it can set a level which is good for continuous conduction—just sufficient base current to keep the voltage drop over the device at the ideal point based on saturation detection ADC result from the CE2.

Figure 27F:
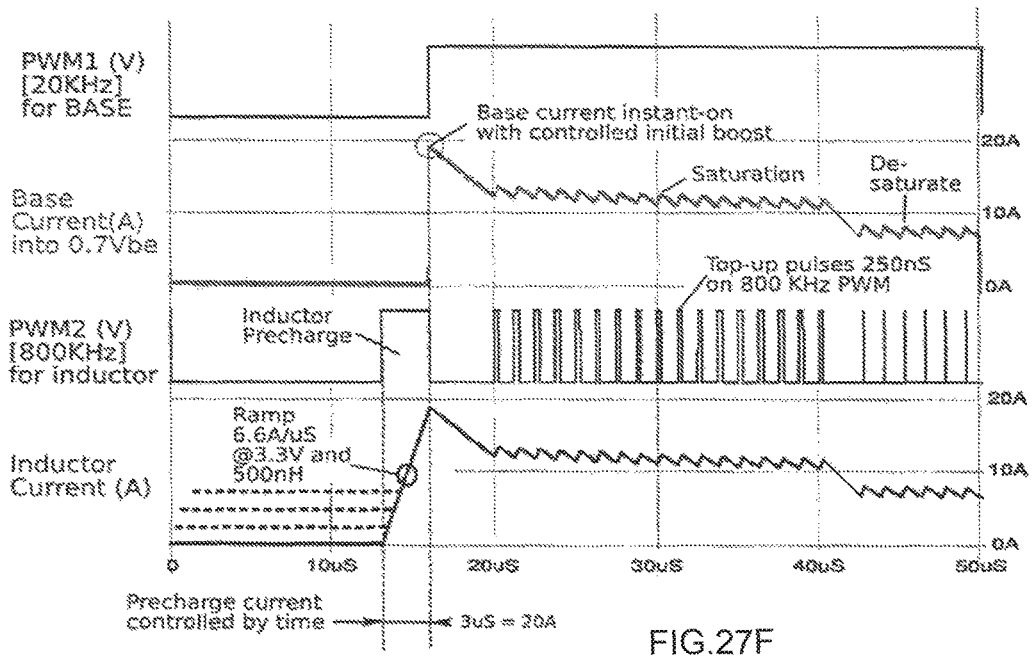
FIG. 27F illustrates inductor driven base waveform for use in the driver circuit of FIG. 27A.
Figure 27G:
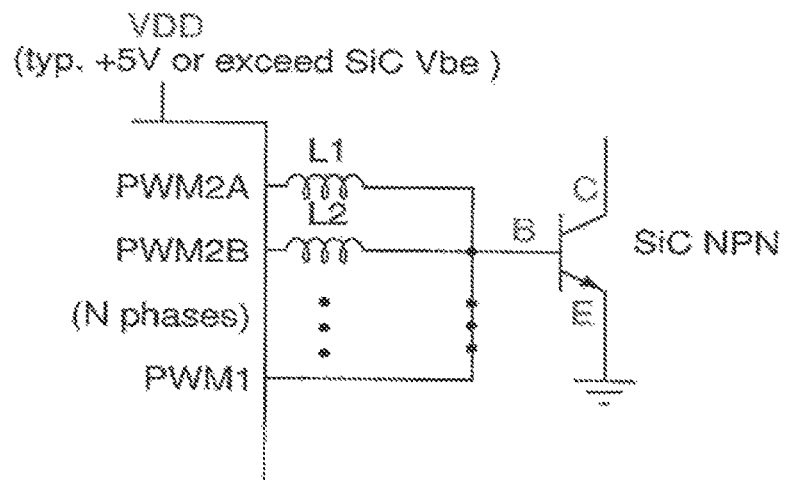
FIG. 27G illustrates multiphase operation single-base connection.
Figure 27H:
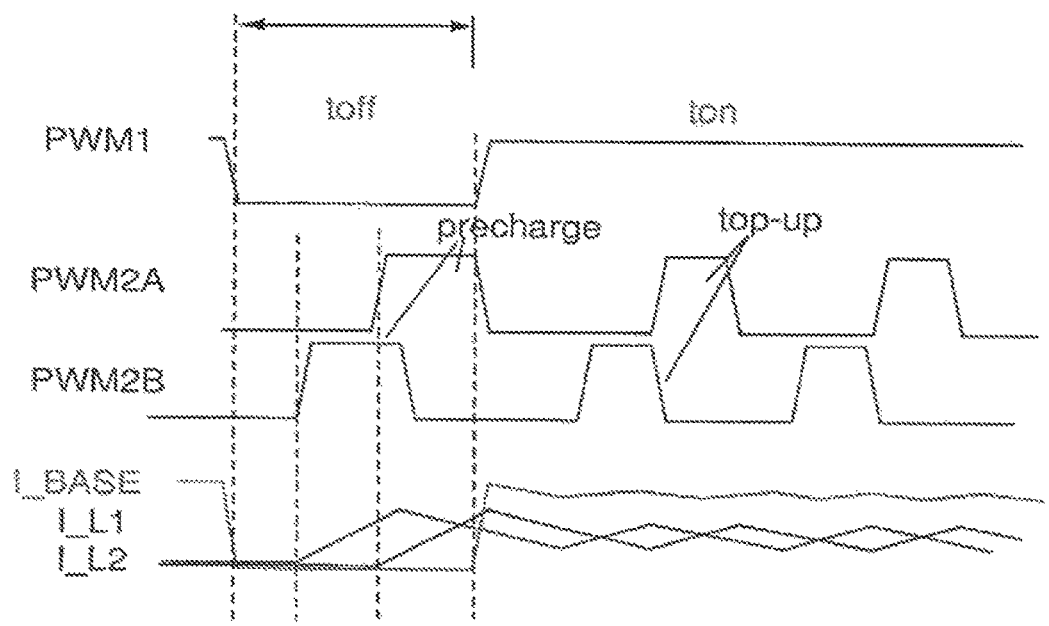
FIG. 27H illustrates base on/off controlled by PWM 1.

Fast Turn on Scheme with Inductors:

One downside of series-inductive base drive is that it limits the rate-of-rise of base current (by definition of inductance) and this might increase the turn-on time of the power transistor and therefore its switching losses. For most applications, and with say a 1 MHz+PWM frequency and low value base inductors (<1 uH), the fact that the main T2 junctions will not turn on strongly and immediately (until a P/N junction charge has been established) lets the base inductive current build up strongly so that it ultimately pushes through the loss-dominant turn-on stage very quickly (less than 2 uS). If higher turn-on speeds are desired, then the IC transistor driver topology shown in FIG. 27A or 27F can sidestep the normal delay in base current build-up using a pre-charge scheme. Since the driver IC is intelligent and digital, and the time of the positive drive current is known in advance, a pre charge period can be deployed to get the inductor current up to the required level before applying the current to the base.

FIG. 27 C has the turn-on scheme waveforms. The current is applied to the base only after it has fully ramped to the desired level.

Turn Off:

Turn-off can be done using opposite-voltage opposite-current drive. Storage time (time before all the charge is removed with the transistor still conducting well) allows the current build-up without the need for special measures as used to turn it on. But, a more complex drive scheme could be envisioned where the inductor is electrically 'swapped' [DPDT MOS switches] to instantly reverse the base current keeping its magnitude and this would afford a very quick turn off.

Alternatively, an intelligent driver is able to reduce base current ahead of the known time that the transistor is to be switched off, letting it come out of saturation, and this will speed the transistors passage through the turn off region reducing toff losses.

Adiabaticity:

During turn-on and turn off much of the charge transferred to the base is adiabatically stored/recovered by the inductor/supply capacitor systems. This allows use of very large +ve, −ve currents to be deployed during turn-on, turn-off of the device giving high switching speed and lowest switching losses.

Capacitive Speed Up of on/Off:

Of course capacitor-base conventional BJT drive circuits could be used.

Figure 29:
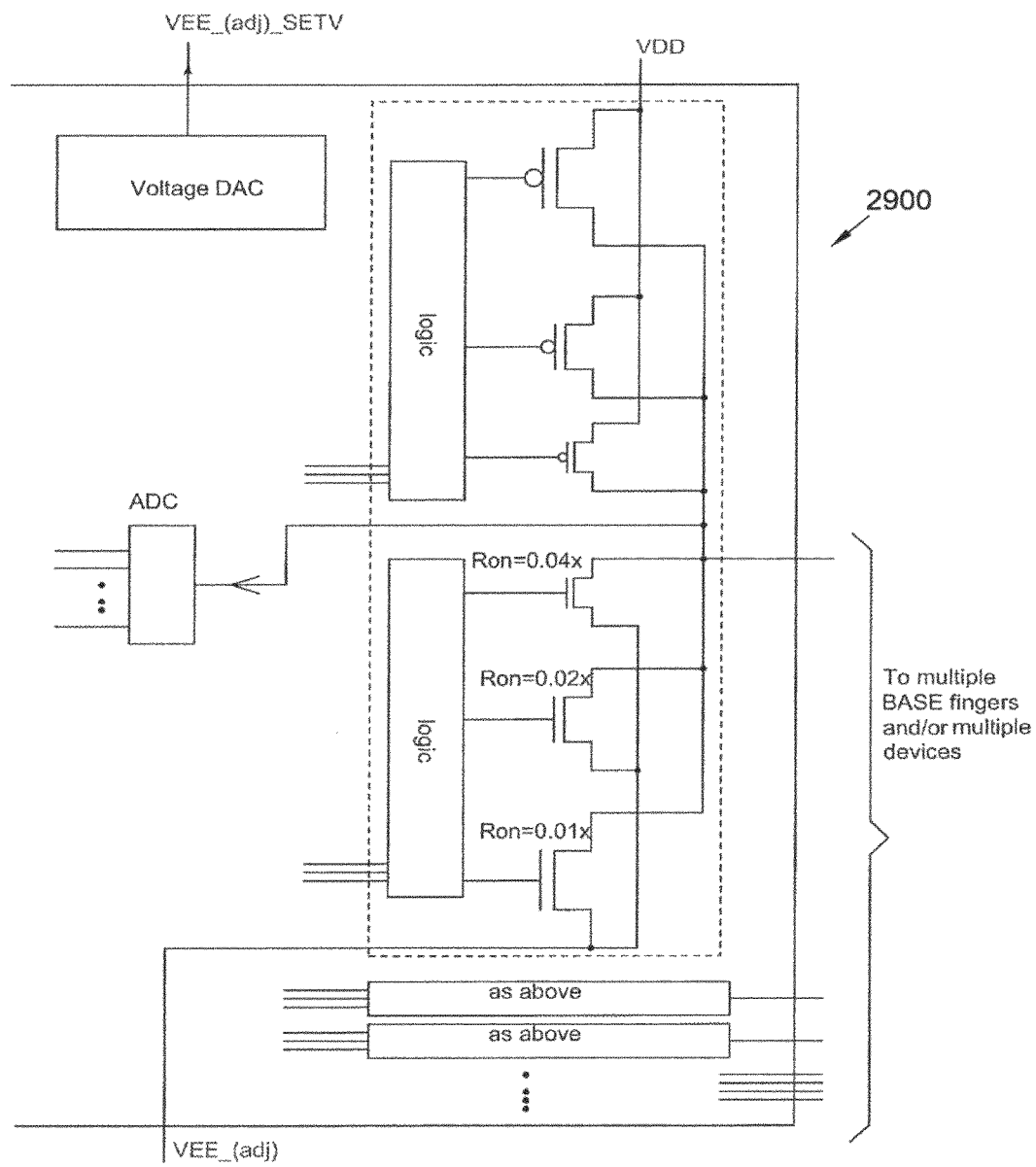
FIG. 29 is a schematic diagram of a digital current mode driver.

Fastest Digital on/Off Current-Mode Driver for High Speed IGBT-Type Applications FIG. 29 is a schematic diagram of a digital current mode driver 2900. Multiples of these can drive base fingers or die. The example is for an N-bulk T2 device such as the NIGBT structure (described later) where the main transistor is PNP and the base is either an NPN or N-JFET needing a −Ve polarity current to turn on.

The power source VEE_(adj) typically −0.9V comes from a DC-DC converter made using a single inductor in the normal way (could be the bootstrap DC-DC) and is programmable by the VDAC set sufficient to drive the Vbe of the highest-voltage finger plus some margin to account for FET voltage drop. Feedback from the ADC information can be used to fine tune this voltage which could be set higher just prior to turn-on of the T2 device for speedup.

This scheme is non-adiabatic but the current build-up does not depend on inductor ramp-times.

Fully digital 'DAC' control of individual BASE current outputs. Resistance between the BASE (VBE) of the device and the slightly greater VEE (adj) (typically a 0.1 to 0.2V difference) sets the BASE current Digital size-weighted FETs form an array (3 bits shown, could be 8 or more) making effective binary setting of this resistance (formed of the FET 'on' resistance) connecting VEE_(adj) to the BASE of the T2 device finger(s) and gives an overall DAC function for current.

Multiple units of the above can independently drive multiple base fingers and/or multiple die.

Turn-off of the T2 device is by the JFETs in this example. Unlike a standard IGBT it is possible with the T2 device (especially the JFET version which has .about.0.3V barrier potential) to actively remove charge from within the junctions and the bulk of the device during turn off Advantageously this shortens the turn-off time and reduces switch-off energy loss.

Because a low-voltage, current-mode base drive is used, the system can be implemented fully within in any standard deep submicron CMOS ASIC. To get an idea of the area needed, a 0.18 u CMOS process (1.8 volt) has NFET on resistance of less than 0.001 ohm*mm2. For example, a 100 A base current driver requires only 1 mm·sup.2 of silicon NFET area in the ASIC to switch this current (in practice getting the current in and out of the die takes up more space as does the buffers but the cost is still low).

Digital control permits 'on-the-fly' adjustment of drive at multiple points in the output power cycle. For example, at turn-on a very high current could be given and during the cycle the base current can be regularly trimmed to keep the T2 transistor at the optimum point of saturation. Close to the end of the on-period, the current could be reduced to minimise the stored charge prior to finally an opposite current used to turn the device off A more advanced version could programmatically trim out mismatches in the various characteristics of large transistors through pre-programmed offset and gain currents between finger drivers determined by calibration. This would give more uniform current density in the T2 devices.

It may be more desirable to mount the ASIC on top of the T2 die and wire bond between the die.

Combination Drivers

One or more of the approaches mentioned can be combined for optimum effect.

It might be possible to integrate some or all of the control electronics onto the T2 transistor die.

I2 Device: A Combination of T2 Device and Driver Replaces IGBT with a NIGBT "Non Insulated-Gate-Bipolar-Transistor Review of Structure and Operation of the Standard Planar IGBT FIG. 30 (*a*) illustrates a cross-section of a standard planar IGBT. When the gate terminal is taken to typical +10V, an inversion sheet forms on the P region under the gate giving an N− type connection from the N+ emitter to the N− base region. This feature does not in itself inject minority-carriers which instead are injected from the collector P+ region when the collector is positive. This has three sub-optimal effects. 1) The On-state voltage can never be less than 1 diode drop. 2) Although the device is otherwise capable of AC voltage blocking, it cannot be switched on for the reverse polarity direction. 3) There is no externally available contact to the N-region which might be used to remove charge to effect a rapid switch-off The equivalent circuit for an IGBT is often represented as a PNP transistor with its base switched by a NMOS transistor. This is a good model for those devices where the PNP beta is designed to be relatively high (>4). In those devices the 'base' current flows as electrons through the NMOS while a much larger current of holes diffuses from C to E as minority carriers in the base.

Another model that of a PIN diode in series with an NMOS devices is appropriate where the beta of the PNP<.about.2. In these cases, recombination is so high that most injected holes do not make it from C to E but are present in enough numbers to reduce the resistance of the N− layer like a PIN diode. Current in the NMOS is a higher proportion of the total switched current in this case with less aid from the transistor Beta action.

Structure of the I2 Devices Used to Replace IGBT

Figure 30A:
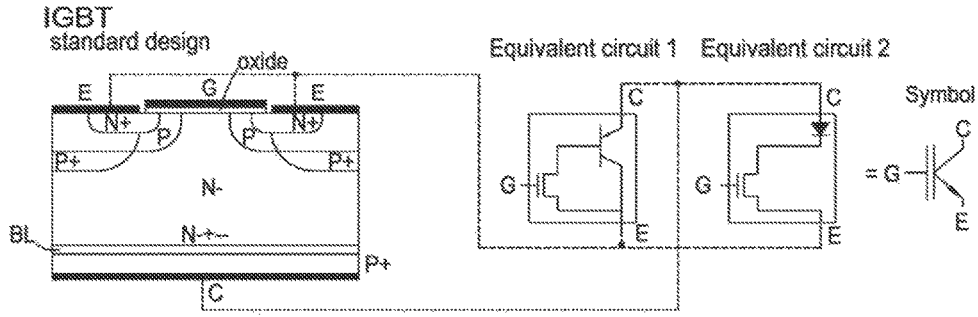
FIG. 30A illustrates a cross section and equivalent circuit of a standard IGBT.
Figure 30B:
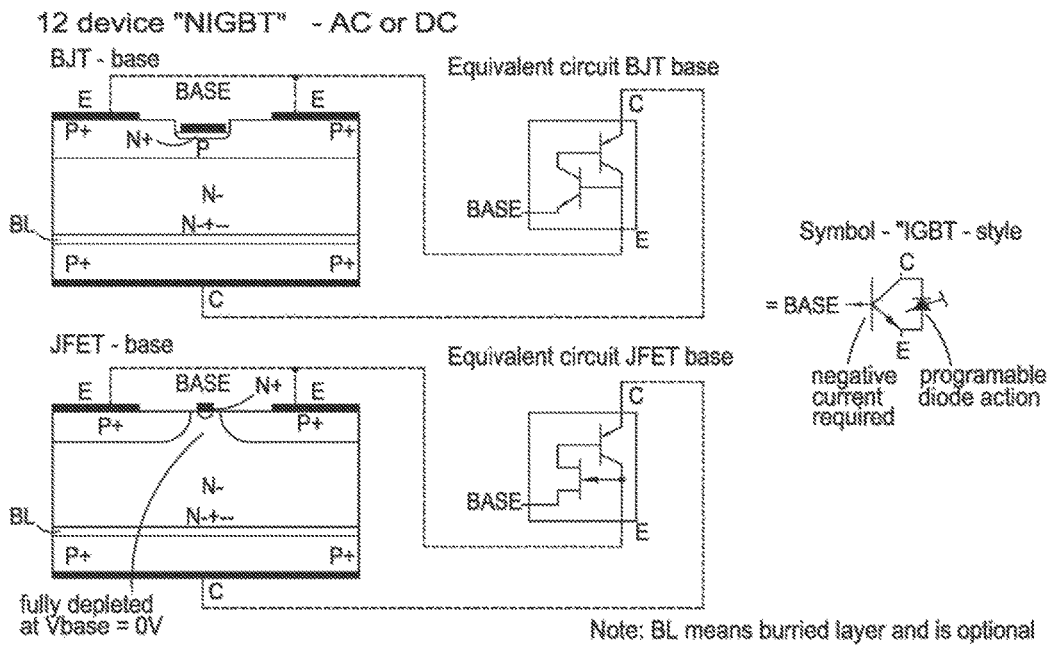
FIG. 30B illustrates a cross section and equivalent circuit of two alternative BJTs.

A N− bulk version of a I2 device see FIG. 30B made with either a BJT base (in this case an NPN base) or a JFET base I2 device each operate in a similar way by injecting electrons into the N− base and are just reverse-doped versions of I2 structures already described. Polarities and current flow directions are reversed relative to a P− bulk T2 device.

Whereas in an IGBT, J-FET regions are considered 'parasitic' and lead to the development on the trench IGBT to avoid them; in the I2 JFET-base device the JFET region is encouraged and essential for the off-state. In the on-state the depleted channel disappears to be replaced with a minority-carrier-injected channel orders of magnitude higher conductivity than a :NIOS inversion channel.

Operationally, the main current-carrying PNP transistor is virtually identical to the IGBT PNP mode (and for that matter to that of a Thyristor), but in this case it can operate without a built-in diode drop in the C to E (CE 1 to CE2) main conduction path.

The gate/base arrangement is very different. All of the insulating gate material and contact of an IGBT are no longer present and there is no N+ region connecting to the E any longer. This eliminates the possibility of NPNP latch-up because the N+ contact is not to a potential or permanent low impedance capable of sustaining latch-up.

For these N− bulk I2 devices, a negative base voltage of −VBE at current of Ibase gives BETA.times.Ibase of current through C to E terminals. In cases of low BETA of the PNP, the PIN action will also be present (like a PIN-mode IGBT) and the base will have to take most of the switching current of the device. In the limit, with if there is no PNP action, the efficiency of the I2 device will not much exceed the IGBT except for the elimination of the MOS resistive channel voltage drop of an IGBT.

Punch-Through/Non-Punch-Through/Electron Irradiation Options:

The same set of design optimisations used for IGBTs such as punch-through/N+ buffer layer can be applied to the I2 devices making it asymmetric and not able to support (much) reverse voltage.

The region label BL can be N−, N+ or something in between, exactly like standard IGBT processing for Field-Stop, Soft-Punch-Through, Controlled-Punch-Through, Light-Punch through etc. Electron irradiation can be applied to the T2 type devices as it can to traditional IGBTs for lifetime control.

Transparent Emitters/Collectors:

There also seems to be no reason that a transparent emitter or collector could not be achieved also if desired. This occurs where the doping is so shallow that the carriers can pass right through and recombine on the high-surface recombination velocity metal contacts.

Inherent Inverse Diode Possibility

For any version of the I2 device the AC conduction ability of the structure can give 'for free' a programmable inverse-parallel diode feature (whereas the IGBT has no way of turning on the thick-base BJT when the collector goes negative). When the I2 driver IC detects a negative collector voltage it can optionally drive the base current in which case holes will be pulled out of the top P+ junction turning on the transistor and clamping the negative excursion. This clamping action is ohmic (saturating) so can be as low as 0.1V at moderate current densities.

I2 "NIGBT" Advantages Over IGBT much simpler fabrication process (does not need oxide, fewer masks, less diffusions).

much more efficient free of the PIN diode drop

'ohmic' like saturation 'on' resistance, or non-saturated under program control.

Direct control of the internal charge of the main base junctions

Possibility to do fast switch off by actively removing charge from the base

AC or DC switching inherent anti-parallel diode action (ohmic) with special driver (whereas IGBT needs an external diode or extra processing steps to fabricate one)

Example Conversion of IGBT to NIGBT I2 Device

To illustrate the process of converting an IGBT to a I2 device, we took the planar IGBT example distributed with Silvaco's Atlas TCAD drift-diffusion simulator.

See http://www.silvaco.com/examples/tcad/section40/example4/ for the example.

With the same doping and geometry, stripping out the MOS part and rearranging the terminals, and contacts, an I2 version reduced the simulated on-voltage from 1.75V to 0.15V at the cost of (equivalent VCE loss) 0.5V due to base current. This cost dropped to 0.2V equivalent when the lifetime was increased from 1 uS to 5 uS (still well within standard CZ wafer specifications).

The overall benefit is a 2.5-5.times. reduction of conduction losses, improvement in switching performance, a driver that can integrated on a CMOS chip, and 2 fewer manufacturing masking steps.

AC Current Conduction Paths

When considering the AC operation of an I2 device, FIG. 31 helps to visualise the main current paths in each direction of operation. In this circuit, the Beta of the device overall device is 10.

(Note: Beta=Alpha/(1−Alpha); Alpha=Beta/(1+Beta))

The I2 device can be further simplified for a DC application in which case it does not require a second transistor element such as a JFET. See FIG. 30 C in which a lateral version of the I2 device is illustrated). The construction techniques mentioned before are usable but the etched base feature could be deep enough to cut right through the CEI phosphorous diffusion.

Matrix Converter Application

Possibly the single largest application for medium voltage, low/medium frequency power switching is in variable-frequency motor drive applications—currently $18 Bn per year for these inverter drives.

Roughly 50% of all electrical power used in the world goes into electric motor applications where a variable frequency drive can reduce this by around 18% typically (source http:!/en.wikipedia.org/wiki/Variable-frequency_drive).

Currently, motor applications which have been converted to variable-frequency operation are claimed to save over 1 billion tonnes of carbon per year in emissions.

Variable-frequency drives represent 3% of the installed base and are only fitted to 40% of new motors entering the market (the rest are directly connected to 3 phase line power) leaving a huge untapped potential carbon saving.

The biggest reason to the low adoption rate is cost of the inverter electronics and secondary problems caused by increased input harmonic power from standard switching electronics such as IGBT AC-DC-AC based drives and reduced reliability due to DC bus capacitor failure.

The well-known and extensively researched Matrix Converter AC-AC converter can circumvent all the known issues and has the following advantages for motor drive applications.

Very low input harmonics

Good power factor

High reliability by exclusion of DC capacitors

Bi-directional energy flow—breaking, regeneration possible (Matrix converter topology is actually a general AC-AC power conversion topology not restricted to motor driving).

FIG. 32 shows a Matrix converter system topology for very low cost and high reliability using 12 devices and driver techniques already outlined in this document. An array of 3.times.3 AC switches is fundamental to the operation of direct Matrix converters and the I2 devices are suitable for this application.

When grouped in arrays of 3.times.12-devices they can be driven locally by 3-output driver IC containing 3 copies of any of the various drive circuits discussed. A central control circuit can coordinate the switching of the 3 banks of triple-devices.

Device Naming Conventions:

T2 device—non-punch-through design with almost symmetrical forward and reverse conducting and voltage withstand ability. It has a 2 transistor structure and also has high voltage, high current main BJT power structure—NPN or PNP. In addition, T2 devices have an input base transistor of either JFET or BJT construction, for example, T2 NJ—an NPN with a JFET input transistor, and T2 PB—an PNP with a bipolar input transistor. It will be appreciated that the T2 devices are previously referred to as an IBT device, particularly but not exclusively, designed for an IBT JFET transistor version.

I2 device—punch-through, or field-stop device to compete with IGBT and also known as "NIGBT" (non-insulated gate bipolar transistor). This device is the same as the T2 but the addition of a field-stop or other buried layer reduces the voltage withstand ability in one direction to around −20V while the current capability of both directions is preserved. The I2 device have a two transistor structure—same options as T2 (see above). I2 devices operate in "Emitter follower" configurations and are useful even when the main transistor Beta drops below unity.

B2 device—usually but not necessarily punch-through, or field-stop device to compete with IGBT so another kind of "NIGBT". Like I2 device the voltage withstand ability is low but now—0.6V max. 1 transistor structure—a vertical BJT. When operated with correct driver it has an inherent reverse diode which comes 'for free' and can be conductivity modulated by reverse saturation by the base for very-low forward voltage. B2 devices operate in common-emitter mode.

Field-Stop (FS) Devices.

A Field-stop is no different in principle to a punch-through design discussed before where there is a buried layer of extra-high doping within the voltage sustaining base (drift) region of the device.

Figure 30C:
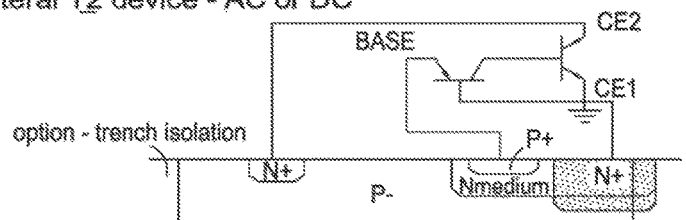
FIG. 30C illustrates a cross section of an alternative BJT.

(See FIG. 30, where BL is the buried layer). The field-stop is often just thicker and less highly doped than a buried layer but to the same purpose. Referring to an NPN (P-base) device, when the reverse bias of the high voltage junction exceeds a certain limit, the depletion region fully extends through the P-base layer 3015 and only the higher P-doped Field-stop layer 3010 prevents the depletion region from reaching the Emitter N+ diffusion 3025 and causing breakdown. The device has a much higher breakdown voltage for a given die thickness in its preferred direction but is no longer a symmetrical AC switch, since in the reverse direction the field stop layer's doping has the effect of dropping the breakdown voltage considerably. Nevertheless DC switches are preferred in many applications.

The effect of the field-stop on the T2, I2 and B2 devices is similar to that in an IGBT or PIN diode where punch-through operation also helps to speed up the device turn-off without needing additional lifetime control measures.

FIG. 30D illustrates a schematic diagram of a B2 device including a vertical thick-base BJT with a Field-Stop layer 3010. This design is a fully planar version but anisotropic-etch versions are also possible. A half-section of 20 u width is shown.

The field-stop layer 3010 for an NPN B2 device will be a P diffusion of typically 9 u thick and doping levels of around 1 e15 to 1e16/cm·sup.3 can be formed with either Boron, Aluminium or Gallium impurities, the latter two having fast diffusion speed and can possibly be co-doped (co-fired) with the phosphorous impurities for a single furnace diffusion process yielding the desired junctions. A suitable reference for this process can be U.S. Pat. No. 3,681,155A.

SiO.sub.2 can be used as the mask material against phosphorous to form the junction patterns.

FIG. 30 G illustrates a top view and bottom view of a full die made according to the scheme (before metallisation). Field rings on the bottom side are for edge-termination and reduce the electric fields at the border of the die (unlike an IGBT, in the B2 device, the depletion region starts at the collector (bottom) 3020 side).

Because the device operates in common-emitter mode, the Beta graph of FIG. 30F is particularly important because at Beta less than .about.O.75, the device becomes less efficient than an IGBT. At the intended operating point beta is around 2.5 with an effective Vee (sat) effective of .about.0.5 volts and even lower at lower current densities.

Driver IC Improvements

It will be noted that the description here refers to multiple base fingers of a single power transistor die but applies just as well to fingers spread over multiple power transistor die. It assumes always that there is a microcontroller or other sophisticated digital machine acting through a control algorithm to make PWM and other outputs based on information received from ADC channels (See for example FIG. 2B). Also PMOS transistors are used for positive switching which could be substituted by NMOS with the appropriate bootstrap or auxiliary power circuits. The drivers here are useful for all kind of current-input devices such as Silicon Carbide BJT, GTO Thyrisors, Standard BJT devices and BMJFETs (bipolar-mode JFETs)

Inductive Base Drivers

FIG. 27 A, B, C illustrate drivers which are able to drive NPN or PNP devices because of a +/− output stage;

FIG. 27 D, E are base finger drivers which can also be built with standard CMOS low cost process but simplified for one polarity drive or the other, not both at the same time;

FIG. 27 F graphs the Spice simulation of the drivers and indicates the design features needed of the PWM mechanism to implement a flexible, efficient and very fast base drive response.

Dual PWM Per Base-Finger Driver

The key idea for a fast on/off current at the base is the dual-PWM system where the PWM1 is implemented with a fast low voltage on-chip transistor (since it only sees Vbe) and gates the inductive current into the base. It can also rapidly discharge the stored charge of the base.

PWM1 is just like a standard type PWM control signal for the transistor (although the PWM positions can be controlled in a specific way and independent from one base finger to another as will be outlined below).

PWM2 is a faster-rate PWM which controls a synchronous buck-type arrangement on the inductor L1 which converts from a higher DC power supply voltage to the Vbe voltage.

As indicated in the waveform, PWM2 can be used to pre-charge the inductor current within PWM1's off-time before it is gated onto the Base outputs at high speed and full strength.

During the 'On' period, the PWM2 can by dynamically adjusted e.g. for dynamic saturation control based on the instrumented readings of the transistors operating conditions from ADC channels like FIG. 2B. Keeping the transistor just within saturation prior to complete switch-off gives the lowest E.sub.off (energy off) figure.

FIG. 27 D, E have ADC take offs at the base finger itself and from a current sense resistor ahead of the base. This permits a measurement of actual base current and base voltage.

Independent/Semi-Independent:Multi-Finger PWM Drivers

Each finger-driver has its own PWM1 and PW:NI2 generator driven under software control to control the On-Time, Off-Time independently of the other finger drivers. This ability can be used in software correct for non-uniformity over large power-transistor die.

Figure 33A:
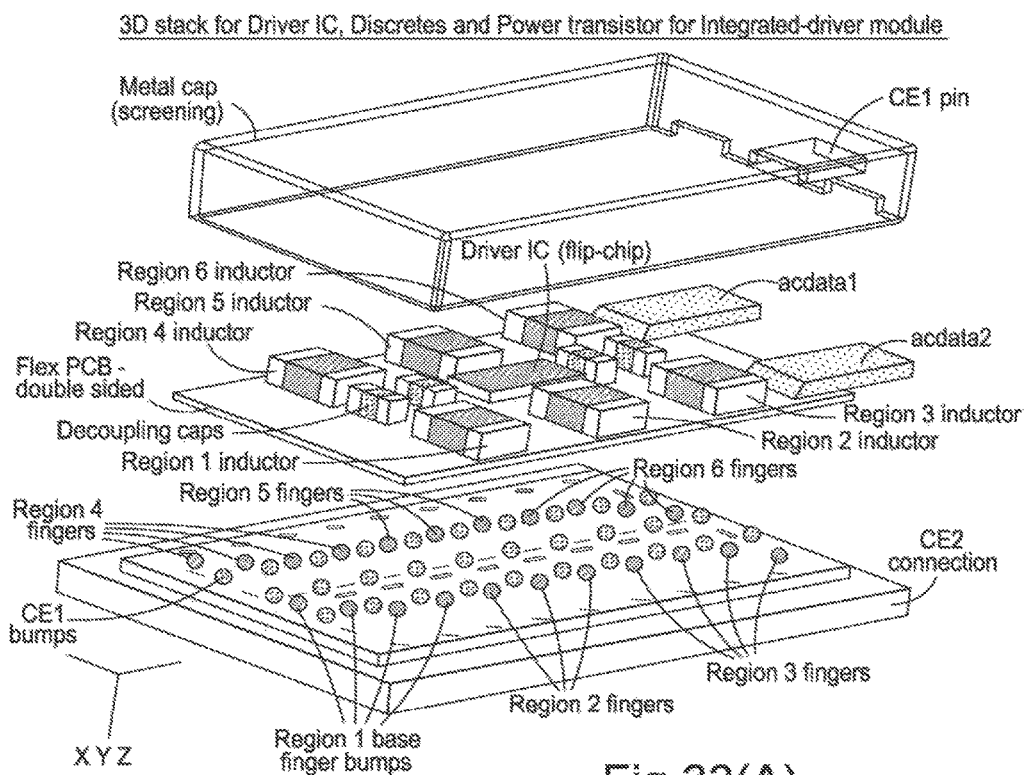
FIG. 33A illustrates an example of a driver chip mounted to a power transistor using an interposer flex-PCB.
Figure 33B:
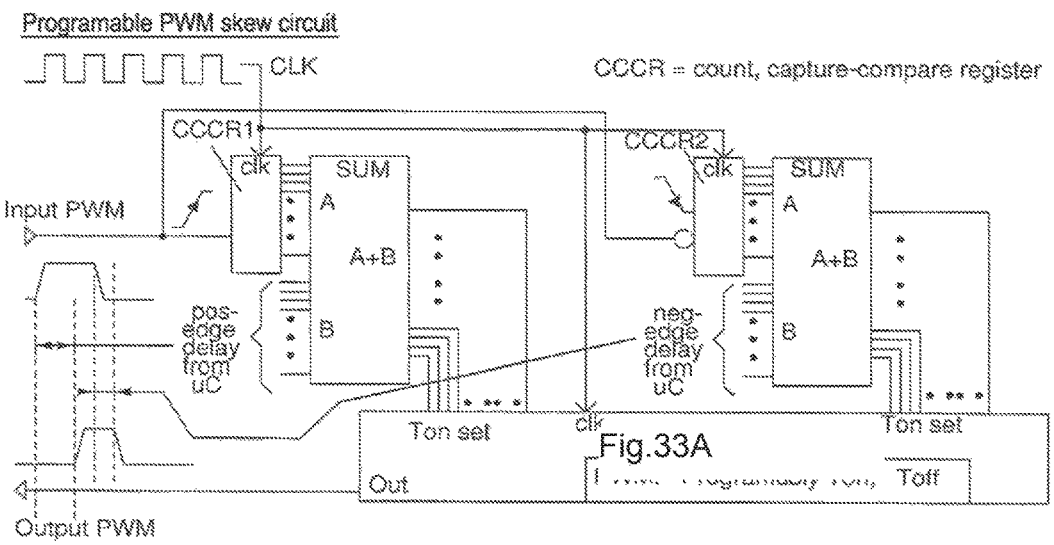
FIG. 33B illustrates an example of a programmable PWM skew circuit.

FIG. 33(B) shows a logic circuit which is able to re-time an existing PWM signal from say an existing PWM control IC. By tuning the final on and off position independently any mismatch between transistor regions can be tuned out (mentioned before) but also any transistor Storage-time delay, which increases the off time, distorting the PWM signal, can be hidden with a corresponding extra delay to the turn-on position—the final switching waveform will be a delayed but overall faithful reproduction of the PWM input. Most analogue feedback control ICs will not notice this slight delay. Combining Multi-Phase Drivers for Ripple Reduction on a Single Output:

FIG. 27 (G) gives another other option for multi-phase multi-finger base current generators feeding into one terminal—good for standard transistors e.g. silicon-carbide BJT devices. Multi-phase operation of each driver can smooth out the base current ripple as can be seen from FIG. 27 (H) while still maintains the very fast On/Off base current control. It has the net effect of a higher PWM2 frequency but maintaining the low losses of the lower frequency. 3D Driver/Power-Transistor Stack:

The physical construction shown in FIG. 33A which has a driver chip permanently attached to a power transistor (T2, I2, B2 or other) using an interposer flex-PCB. Inductors, capacitors and other surface mount components can be added. An intelligent driver IC is solder mounted to the PCB from above flip-chip style (WLCSP (Wafer Level Chip Scale Packaging)) using bumping technique. The power-transistor device is solder mounted from underneath again using wafer-scale bumping technique.

Other options could see the interposer made from a silicon substrate to eliminate any CTE (coefficient of thermal expansion) problems between the die. Or, the main transistor die can have formed upon it additional patterned dielectric (e.g. polyimide)/metallisation layers to effectively build an equivalent of the interposer directly on the power transistor where the inductors and driver die could then be soldered.

On-Die Temperature Sensing of the Power Transistor at Multiple Sites:

Each base finger represents a PN junction and as such has a well defined forward-voltage (Vf) vs. temperature. Rather than taking the absolute voltage measurement of Vbe which is one option, it is more accurate to take a Vf measurement at one current level and then another measurement at a different current level. The difference in readings varies with temperature and eliminates a large unknown initial Vf voltage.

The inductor-driven base waveform (FIG. 27F) has within it varying current levels and so by sampling at intervals where base current is high and again where base current is lower using a different ADC channel for each finger driven then a reasonable map of die temperatures is always available to the control software. This is without needing to add specific temperature sensors to the system or driver die (another possibility).

Figure 35A:
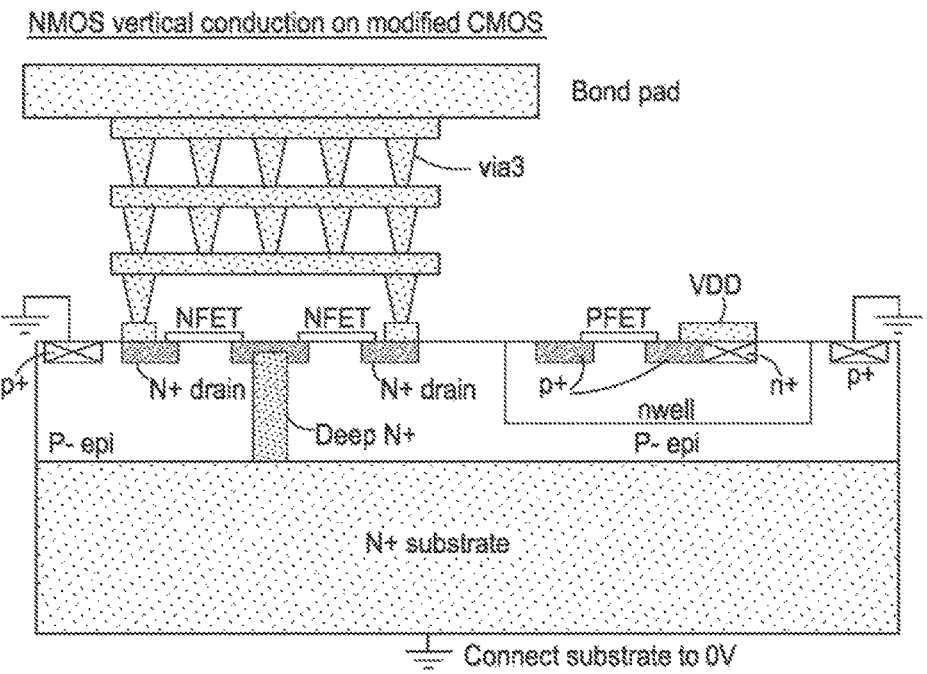
FIG. 35A illustrates an alternative scheme to a standard CMOS process to optimise it for the role of driver especially of NPN versions of the power transistor where most of the PWM conduction current is via NFET devices to/from 0V.
Figure 35B:
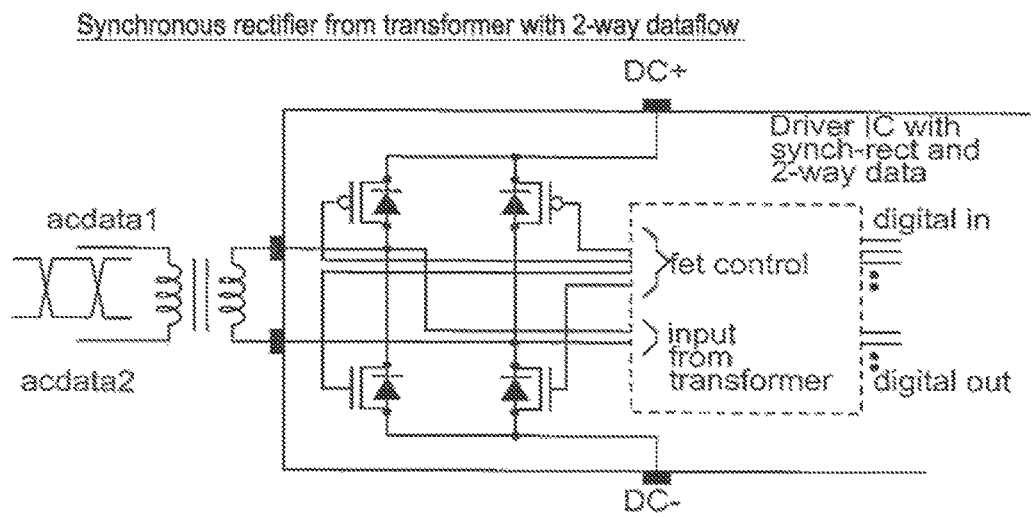
FIG. 35B illustrates a simplified synchronous rectifier system for isolated power and data to/from driver IC using the CMOS chip.

FIG. 35 (A) is a small modification to a standard CMOS process to optimise it for the role of driver especially of NPN versions of the power transistor where most of the PWM conduction current is via NFET devices to/from 0V. The N+ source diffusions have extensions deeper than normal to connect directly to an N+ substrate which in turn can be solder bonded to the metal lid of FIG. 33.

The process modification is small—similar to a deep N-well procedure common on CMOS processes.

The resulting NMOS devices have fully vertical current conduction paths—between substrate and the bond pads. This means that no lateral current is taken through the normally thin metallisation of CMOS chips so avoiding the issue of electro-migration which tends to limit current to a few mA/micron width. Having the bond pads over the active silicon area means they do not add to the active area consumed.

FIG. 35 (B) illustrates a simplified synchronous rectifier system for isolated power and data to/from driver IC using the CMOS chip. Phase modulation of the edges of the AC switching by first the master (Driver) then the Slave (CMOS driver chip) can pass digital information in each direction along with power transfer.

Software and Firmware:

When the features described above are combined with a microcontroller with on-chip non-volatile (NV) memory there exists an opportunity to finally fix several problems which have plagued minority-carrier devices such as GTO Thyristors and BJT devices in the past.

These problems include:—

Current crowding on large die leading to premature failure of those parts of the transistor
with higher gain, higher temperature or higher carrier lifetime than the mean.

Part-to-part variation of current gain—where replacement parts do not function identically to the original.

Turn-off, dynamic breakdown hot-spots—leading to failures in GTO Thyristors.

After manufacture of the Driver/Transistor stack, a calibration routine can be performed on the complete device.

One such test the Open-Circuit Diode-test which gives an approximation to the minority carrier lifetime and can be done even without a specialised test fixture. The driver can turn on a Vbe junction and simply measure the rate of droop of voltage with the Vbe junction after letting it float.

Results of the calibration are stored in non-volatile memory on the driver IC e.g. Flash/OTP or fuse memory.

Calibration routines can performed in a dedicated test fixture sequentially exercising each of the finger driver channel and determine performance of only that area of the power transistor die. As well as calibration data, the non-volatile memory can hold defaults such as temperature trip points.

The calibration values are later used during normal operation of the device to compensate for the inherent variations within the power transistor and external components (e.g. inductance variations) so that from the end-users view every device operates correctly and nearly identically to any other device of the same type.

For example, if the driver chip software accepts a digital input for current limit in mA it can use its own lookups of Beta scale factors of each finger driver for the X and Y region of the device (with 2D lookup table), and by controlling On time and Off time at independently of each PWM finger driver channel to meet the commanded current.

Current crowding on a large die will be reduced and inter-changeability is realised with easy series/parallel connections of devices.

Parameters which vary with temperature can be tuned out given the temperature measurement from the particular region of the die and known parametric variation of transistor parameters with temperature.

Timing variations over large die are known to cause dynamic breakdown failures of power devices during turning off especially those which rely on long minority-carrier lifetime to maintain low switching losses. For example GTO Thyristors (PNP wide-base transistor at the core) have relatively good turn-on characteristics but during switch off, variations of carrier-lifetime, resistivity and doping levels over the die area during dynamic breakdown makes the turn-off process uneven. This can mean that finally a small region which happens to be last to switch off must momentarily conducts all of the switched current and can burn out. This problem can be solved with the smart driver using independent pre-calibration timings applied via PWM for each finger-driver to offset for the turn-off time variations.

Finally with a digital interface there is the opportunity to hide the unavoidable Storage Time parameter of BJT type devices where it takes a set amount of time to remove the charge from the base before the device can turn off. If the smart-driver accepts PWM turn-on and turn off times as digital words, the already-known storage-time can be subtracted from the given turn-off time to position the turn-off edge at the correct point in time.

Matrix Converter Boost System

The AC version of the T2 device seems ideal for Matrix converter applications compared to standard DC-only switches. Only one big drawback remains for the Matrix converter motor drive in that it can only create an output of approximately 86% of the input voltage. This stops the matrix converter working as a drop-in replacement for standard DC-bus 3-phase inverters.

A simple solution for this would be to boost the AC input voltage by 14% using auto transformers.

However with 50 or 60 Hz transformers these would be bulky and eliminate most of the advantages of the matrix converter. To address this limitation a high-frequency AC-AC power converter is proposed in FIG. 32. Unlike an AC→DC-AC based high frequency transformer, it has inherent bi-directionality so it does not lose the inherent advantage of a matrix converter with regards to braking and regeneration.

The AC-AC transformers are not large being only 14% of the power of the matrix inverter.

Conventional 3-Phase Motor Inverter

Figure 36:
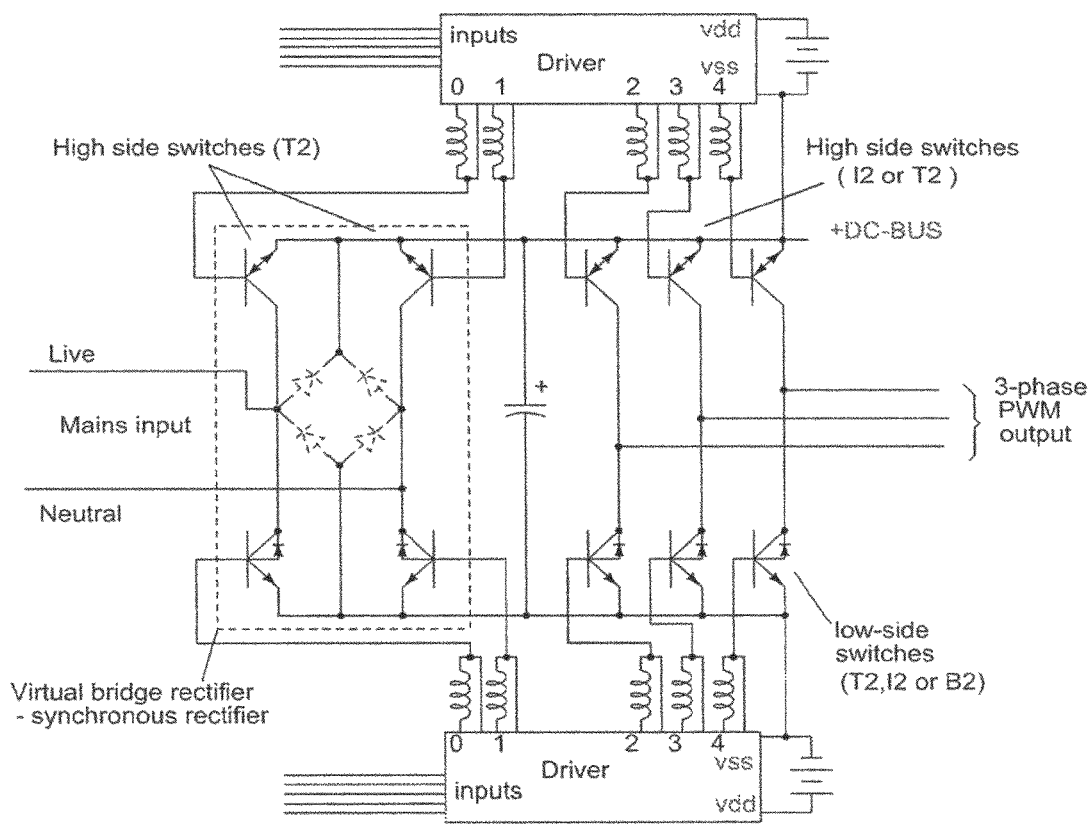
FIG. 36 illustrates an example of a 3-phase inverter using DC bus and synchronous mains rectification.

T2, I2 and B2 type devices can still be applied to reducing power losses and cost in standard AC-DC-AC topologies like FIG. 36. Here the devices can perform mains-voltage rectification and output switching at effective forward voltages of around 0.25V reducing the power loss by a factor of around 4. The I2 device is particularly suited as a high-side switch and a single driver can activate many switches with a common supply rail—unlike NFET or IGBT high-side switching systems which require separate floating supply and driver chip for each driver.

Low Leakage Relay Contact

Compared to electromechanical relays, the on-resistance of the T2 switches can be made equally low by increasing the device area. Leakage current can increase in proportion to the area of the device and even when switched off there could milliamps of leakage—enough to cause problems for some loads.

Figure 34:
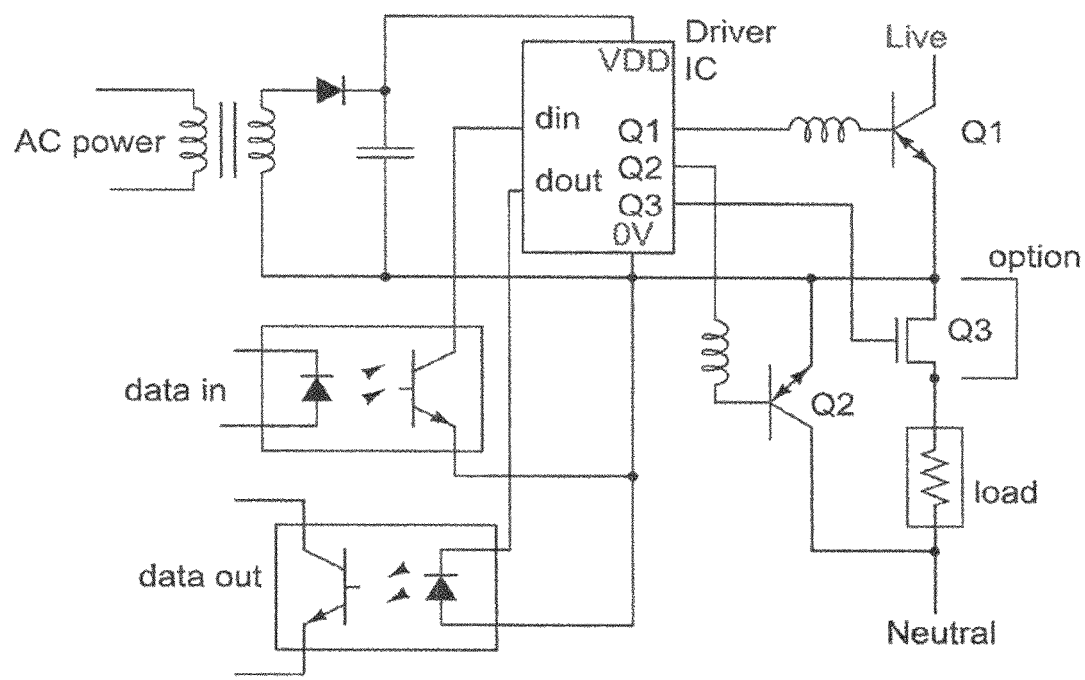
FIG. 34 illustrates an example of a low leakage relay switch.

FIG. 34 proposes a solution using a shunt element Q2 device to bypass this leakage current around the load when QI is switched off and where QI is much lower on-resistance than the load resistance this solution will work well.

To take the leakage current to Pico-amp levels even with very low impedance loads, Q3 can be added and it turns on and off with QI. When on it has to take the full load current but when off only has to support under IV typically and so could in fact be built onto the driver chip where ultra-low on resistance FETs occupy only a few mm·sup.2 (1.5 mOhm*mm in 0.35 u CMOS).

Active Self-Powered Switching Devices and Circuits

These embodiments relate primarily but not exclusively to the driving of Bipolar Junction Transistor devices coupled to control circuits which may use BJT, MOS or other FETs. Descriptions here are generally further embodiments of ideas described in the embodiments above and especially relevant background materials are FIG. 2C, FIG. 6, FIG. 13A, B, C, FIG. 26, FIG. 27, FIG. 30 B,D. FIG. 33A, and FIG. 36, which are described above and which are applied often in relation to Circuit Breakers.

BJT devices require a Base current which is a fixed proportion of the Collector current to maintain saturated (low loss, ohmic) conduction mode. In this saturated conduction mode minority-carriers conduct by diffusing from the Emitter to the Collector terminal with the Base supplying carriers lost to recombination and at potential sufficient to overcome the built-in PN junction potential—typically 0.7V in silicon, and up to 3V for high-band-gap semiconductors such as Silicon-Carbide.

For a BJT transistor whose typical characteristic "Beta" [ratio of collector current achieved vs base current given] is 20, a circuit design point of 10:1 Collector:Base operating current might be chosen. This gives sufficient extra base current to account for part-to-part variations and ensures the transistor will be fully saturated to a low VCE (sat) voltage when turned on. In the example just given it is deemed that the transistor is operating with a "Forced Beta" of 10.

In the literature there are very many application circuits to give a forced-beta for a transistor but generally these are not dynamic. If a BJT base is driven at fixed 1 A but the collector load varies from 1 A to 10 A, only at 10 A collector-current is the forced-beta equal to 10. At lower loads the forced-beta is lower and power is being wasted in the base (=Ibase*.about.0.7V). If the load happens to exceed 10 A the transistor might be liable to turn off (insufficient base current) and could easily overheat as it VCE rises dramatically.

Historically, BJT devices began to fall out of favour in the 1990s, not because of the switching efficiency—which is unmatched amongst high-voltage devices—but because of the cost involved in providing a (relatively) high base current which has to dynamically adjust in proportion to the instantaneous collector current. This proved problematic, especially compared to power MOSFET and IGBT devices which have no such requirements.

It is one object of the present embodiment to provide a simple and automatic means of dynamic base drive of BJT-style devices.

One device of the BJT era which is still prevalent in the market is the Thyristor. This device 'scavenges' Base currents (recombination losses) directly from the current in the circuit in which it operates and does not need dynamic base control. In a Thyristor the full load current passes through a PNPN junction stack, or equivalently a PNP/NPN cross-coupled-and-merged transistor (the NP junctions of the PNP are merged with the NP junctions of the NPN transistor). The Base currents are provided naturally from the larger flow of full current carriers through the device. Unfortunately the silicon thyristor must have a voltage drop of at least 0.7V in the full load-current path to overcome the remaining PN junction voltage and this voltage drop is at the full load current. Also once the thyristor is turned on, it is difficult to turn off since the base currents come directly from the through-current.

It is another object of the present embodiment to furnish base drive current from the circuit current but overcome the usual 0.7V voltage drop and a further goal to make non-latching devices possible.

More recent prior art devices which seek to 'scavenge' power from the load to maintain their turn-on are based on MOS technology which have essentially zero gate current making it easy to use a charge pump or similar to extract operational gate voltage from across the terminals of the 'closed' switch. This approach however has three drawbacks:

It requires a disconnect-circuit to decouple the driver from the high-voltage side of the switch at switch-off time.

The present embodiment aims to eliminate this by using only low-voltage (<5 volt) devices and capacitor operating on the low-voltage side of the main transistor with no need to touch the high voltage side of the main transistor at all.

Extracting driver power from a boosted version of the voltage over the 'closed' power switch means that the switch can never be fully turned-on for if it were, there would be no operating voltage with which the driver circuit can operate.

The present embodiment theoretically allows the main switch to turn on to zero-volts and no control needs to be applied to maintain a particular switch voltage drop.

MOSFET devices are very large, inefficient and/or expensive when designed for high voltage operation.

Bipolar high-voltage device technology is the only option to compete on cost in most applications.

Embodiments Diode
D2-Device

The features of the method are described by way of an example, the simplest embodiment being that of an active rectifier. Externally this is a two terminal device and acts as a low-forward-voltage, high reverse blocking voltage diode. Four such devices can form a bridge-rectifier.

FIG. 37 shows the circuit and structures for producing a 2-terminal 'diode' device with a forward voltage of the order of 0.1V and a reverse blocking voltage of >1000V at very low leakage current. This performance contrasts with traditional high voltage silicon rectifier diodes which exhibit a forward voltage between 0.75V to 1V and cause a significant power loss especially on 120 Vac mains rectification applications (2 diodes conducting) of around 2 W per amp which equates in monetary terms to $2 per amp, per annum wasted on electricity per bridge-rectifier.

Silicon Schottky-type rectifiers are not useful at high reverse voltage because a) the reverse leakage current is very high and b) a Schottky device designed for high reverse voltage unavoidably results in a high forward voltage.

Figure 37B:
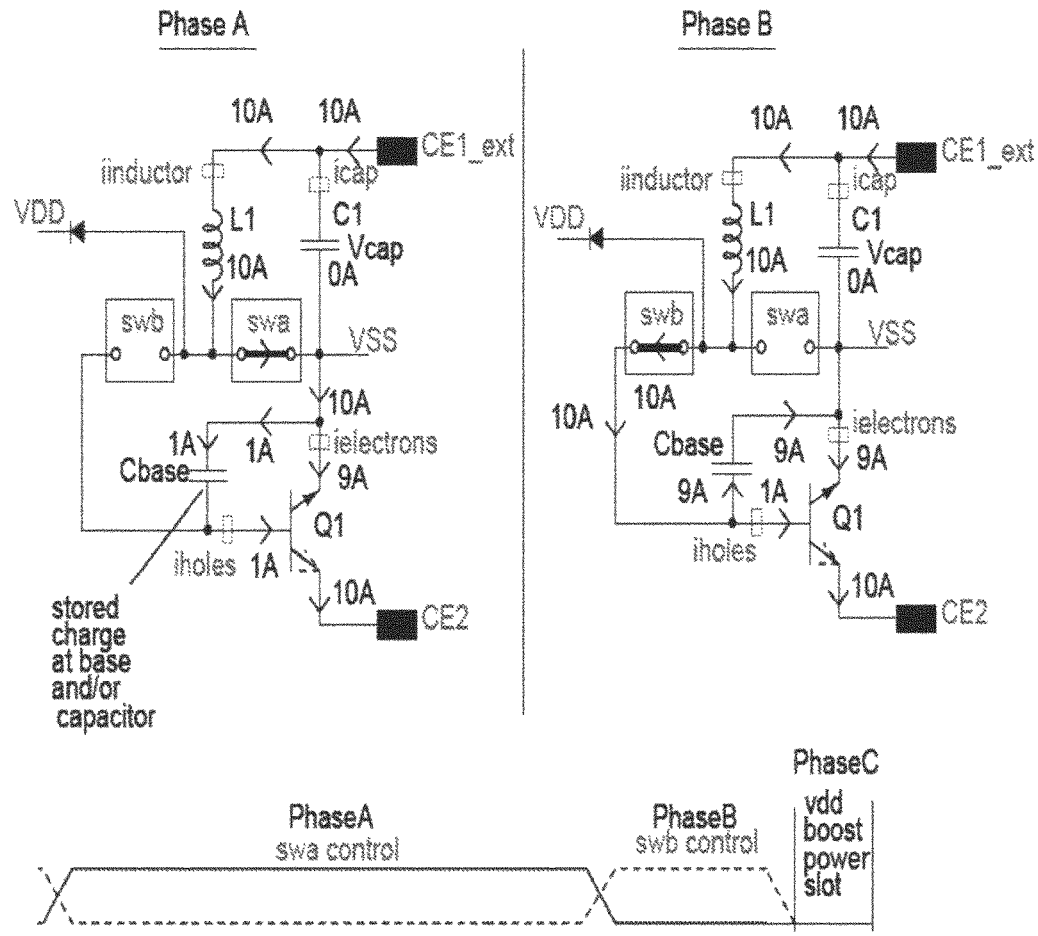
FIG. 37B illustrates an example of 10 amp forward conduction (ignoring inductor and C 1 ripple current)

FIG. 37B shows the operating principle given in context of a 'diode' but equally applicable when driving true transistors such as an I2 device (as described in relation to FIG. 30 above).

An inductor LI, a capacitor C1, main switching transistor QI are controlled by the operation of two switches SWA and SWB operating at high speed of the order >I 0 KHz<I 00 MHz in two phases called Phase A and Phase B. There is also a period where neither switch is activated called Phase C. The numerical example here has F=2 MHz, a diode through current of 10 A t(Phase A)=450 nS:t(Phase B)=SO nS ratio i.e. forced-beta of 9.

QI is either a standard high-voltage BJT device operating in reverse-beta mode, or an optimal transistor structure such as the B2 device. SWA, SWB can be BJT, Mosfet or Jfet or other low-voltage type devices.

The node VSS is a convenient internal circuit node relative to which other voltages are to be measured and can be one terminal of an auto-generated power supply for internal control circuits, the other being VDD.

We assume that the start-up process is complete, the D2-device is forward biased by the circuit current and Inductor current is flowing at all times in LI i.e. continuous conduction mode (discontinuous mode is also possible) and this current steered by switches SWA or SWB onto either the CE1 terminal (i.e. VSS) or the Base terminal of the transistor. The inductor path is in the only DC conduction path through the 'diode' so it is generally apparent that its current must equal, on average, the load circuit current.

During phase A where SWA is on, the inductor current in LI builds up with a delta-I component at a rate set by V(C 1) voltage (which is of order 70 mV)/L 1, and will exceed the load current by the end of Phase A time. FIG. 38C has some illustrative waveforms.

In phase B, where SWA is switched off and SWB is switched on, the inductor current generally continues but voltage will instantaneously boost to a voltage set by the BASE of Q I typically 0.75V (plus a little for the voltage drop of SWB). The inductor current droops during this time at a rate set by (VBE-V(C1))/L1, dropping below the load current value. Transistor QI has high, current-controlled, stored charge represented by Chase and slow turnoff speed such that these discontinuous BASE current pulses are averaged into an effective base current within the transistor. It can be seen that there is no net charge given to Chase in a cycle where I A*450 nS=9 A*SO nS.

The time-slicing of the inductor current between SWA and SWB paths into CEI and BASE terminals respectively gives a precise 'Forced-Beta' ratio to QI of t(PhaseA):t(PhaseB)

This ratio is maintained over all load currents without need for control system intervention and thereby keeps the transistor optimally driven.

It was noted that the inductor sees a ripple current exceeding then dropping below the load-current value during the switching cycle. Since the load current value doesn't change over the short switching cycle, it follows that the L 1 ripple current must be balanced by an equal ripple current to/from C 1. C1 is therefore critical and is scaled up in proportion to expected inductor ripple current (which itself is inversely proportional to the chosen L 1 inductor value), scaled up to reduce voltage ripple at the external terminals of the D2-device, and scaled down as the operating frequency increases.

Typical values for a 10 A 'diode' switching at 1 MHz are L1 =10 nH, C 1=47 uF, Cbase=22 uF (using standard BJT). Chase is generally not needed when using a B2 type device typically operating at 100 A/cm2 current density and a forced-beta of 9. It is important to note that C1 only has to be rated at a few volts and can be a very small ceramic type capacitor. Inductor L1 is of such small value that it can occur naturally from ' parasitic' bond-wire inductance or PCB trace and need not use additional magnetic materials.

Effective Vf of the 'Diode':

The object of this embodiment is to make a diode with a much lower forward voltage than a standard PN junction diode.

Ignoring the small losses from parasitic resistances, the effective forward voltage of the 'diode' are made up of two components. 1) the average voltage over C 1 plus 2) VCE(sat) of Q1.

The first component can be calculated from the voltage boost ratio between V(C 1) and VBE of Q1. The voltage boost ratio is (t(Phase A)/t(Phase B))+1, because of what is essentially a boost converter operating with L 1, SWA, SWB and the +1 resulting from the fact that V(C 1) is additive with the inductor boost voltage for driving VBE. Since VBE is typically 0.75V, and if the t(Phase A):t(Phase B) ratio [i.e. forced-beta] is chosen to be 9:1 then C1 will settle to 75 mV when the converter reaches equilibrium i.e. no net change of inductor current over a complete cycle. Adding the typical 50 mV VCE(sat) of Q1 gives a total 'diode' Vf drop of 0.125V in this example.

Vf can be reduced further by running with higher forced-beta settings (requires higher Beta of the transistor) and lower VCE(sat) which comes from using larger transistor operating at lower current density. Thinned-wafer B2 devices designed for 650V breakdown exhibit Betas of between 30 and 10.

Reverse Blocking Characteristic:

In reverse-bias, and with C 1 discharged, Q 1 acts as a high voltage 'off' NPN transistor with its Base biased to its Emitter by the leakage resistance of the active circuitry, or extra 'pull-down' resistance added if required. The reverse breakdown voltage is fully that determined by the design of Q1.

Self-Oscillating Version:

FIG. 37 D,E,F describe a working system which uses self-sustaining oscillation provided by the addition of coupled-inductor L2 and two low-voltage discrete BJT devices Q2, Q3 to implement SWA and SWB. An LC oscillator is formed from the coupling of L 1 and L2 where a typical 9:1 turns ratio can in principle produce a 0.75V Vbe to turn on Q2 base when V(C 1) is only 75 mV. This circuit has positive feedback and oscillates naturally between Phase A and Phase B operation as voltage C 1 ripples up and down at a rate set by L 1. L3 here is used to reduce the forward voltage of Q3 which is acting as SWB and could equally be replaced by other rectifier means such as Schottky diode, PNP with grounded base either of which method would no longer require L3. If VBE of Q2 is similar to VBE of Q 1 then the PWM duty cycle is similar to the L2:L1 turns ratio.

Integrated SWA, SWB and Power transistor for self-oscillation version.

Figure 37C:
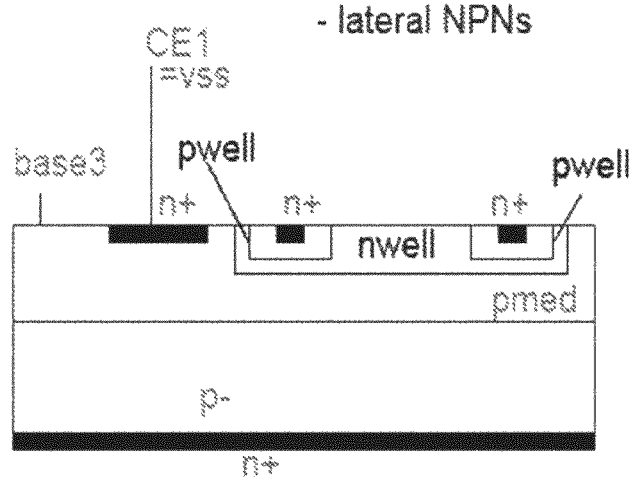
FIG. 37C illustrates an integrated version of a vertical B2 device.

FIG. 37C is a cross section of a device which incorporates Q1 as a vertical high voltage power device with Q2 and Q3 as low-voltage lateral/vertical devices giving a monolithic semiconductor solution.

NMOS Vs. BJT for SWA, SWB

Using BJTs for SWA and SWB limits the ultimate forward voltage of the D2-device to around 200 mV because BJTs do not quite saturate down to 0V as do MOS devices. Using NMOS devices, perhaps in another die to Q1, and using more accurate pulse timing than can be achieved with self-oscillation can bring the total loss to around 100 mV at low cost.

Driving SWA and SWB from a more sophisticated control circuit than a simple oscillator has advantages for the 'diode' application, but particularly for Transistor/Thyristor type applications and especially for smart-power devices.

C2-Device

Figure 38A:
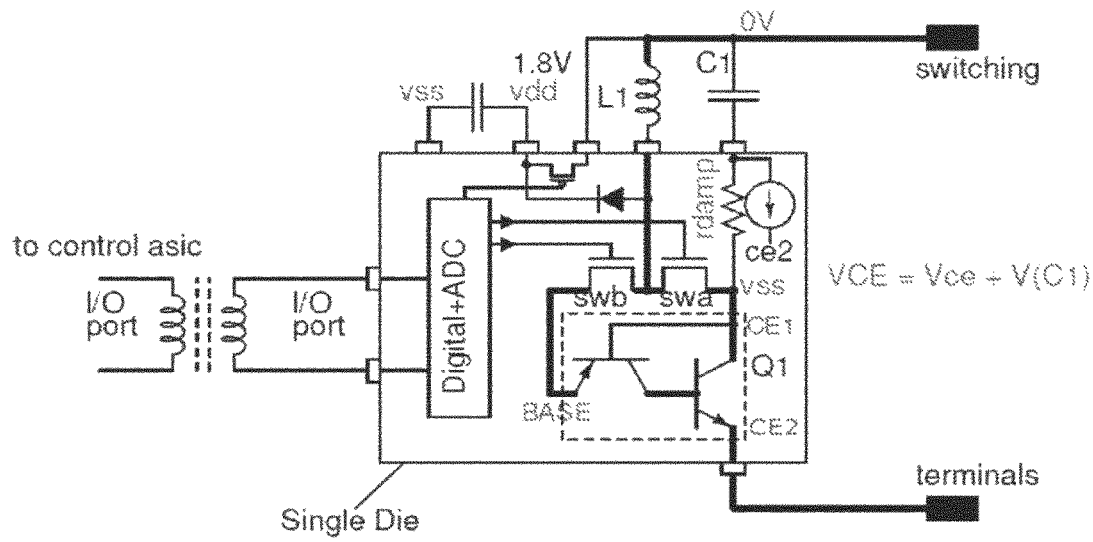
FIG. 38A illustrates a C2 device circuit.

FIG. 38A shows the concept of a device called C2 with the C referring to CMOS processing which would be typically used although NMOS process could be used for lower cost.

Figure 38B:
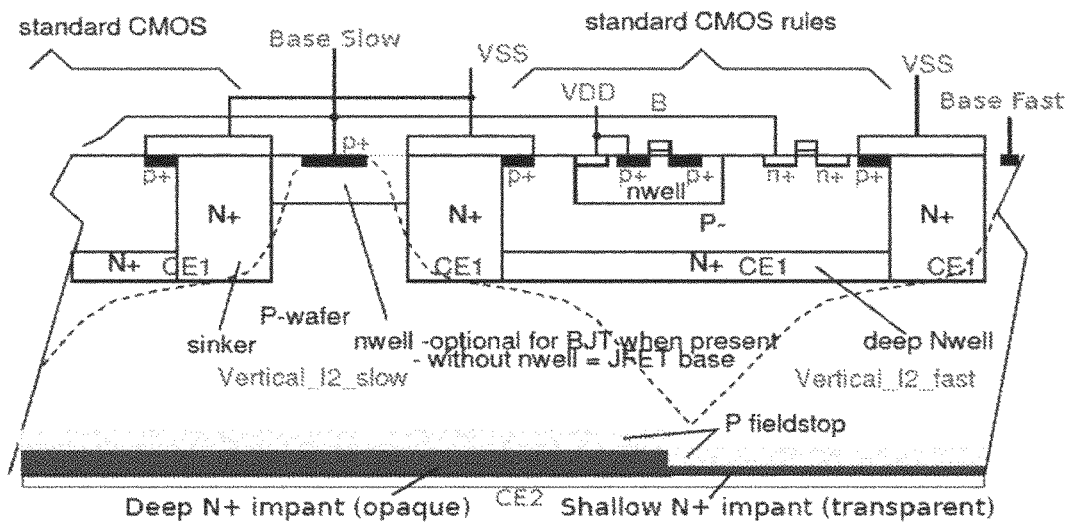
FIG. 38B illustrates CMOS integration of an I2 device resulting in C2.
Figure 38C:
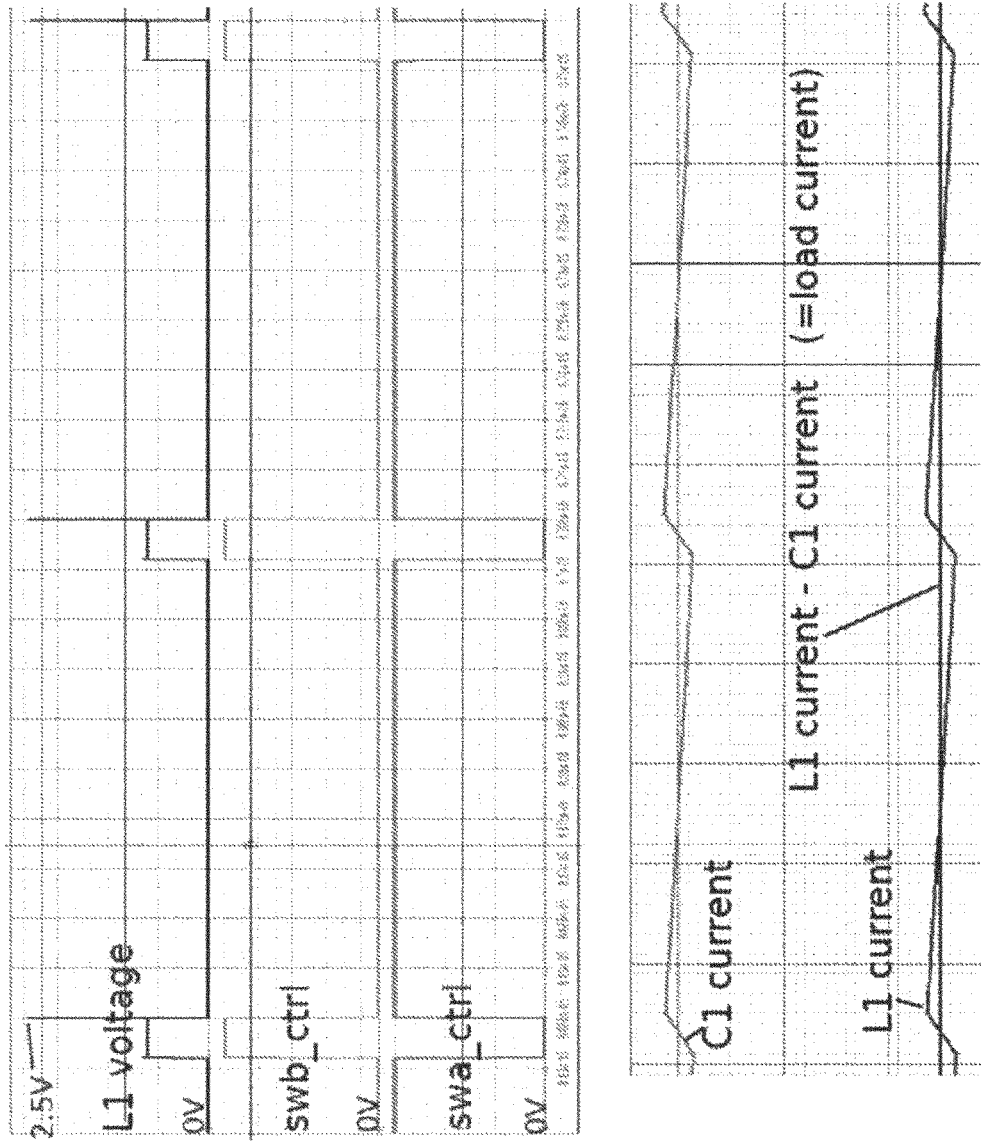
FIG. 38C illustrates drive waveforms.
Figure 38D:
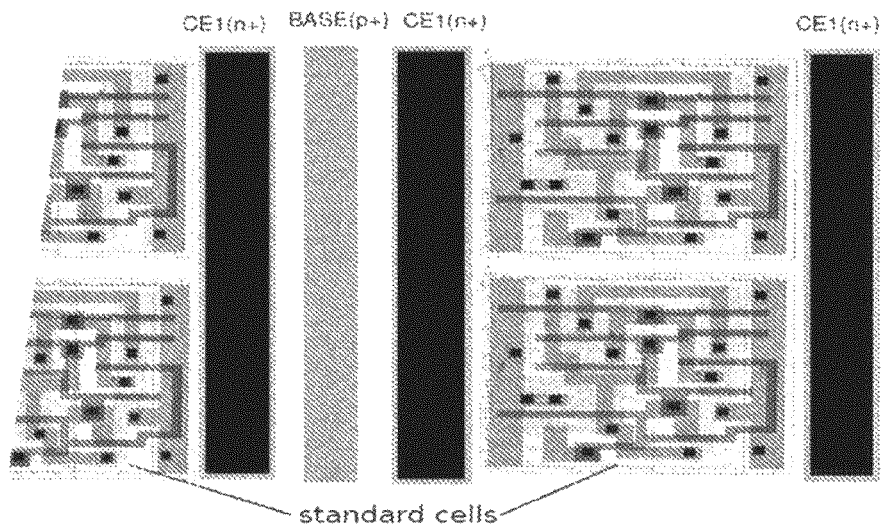
FIG. 38D illustrates a plan view of a standard cell of C2 device.
Figure 39A:
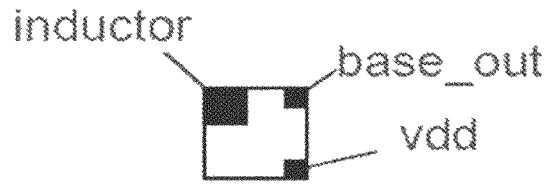
FIG. 39A illustrates D2-control CMOS basis arrangement.
Figure 39B:
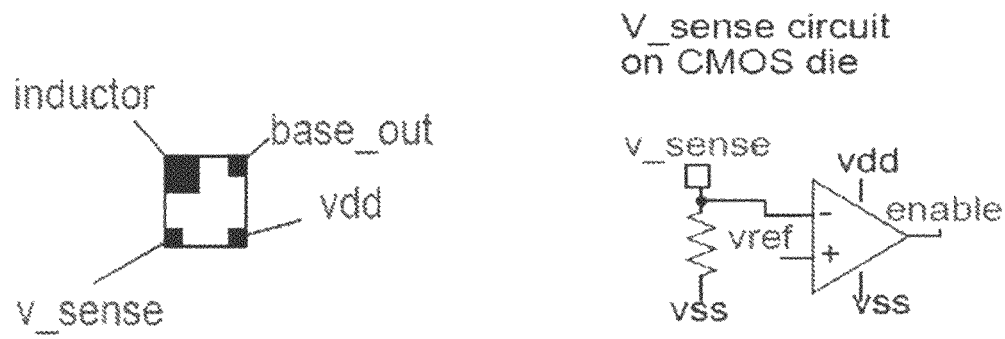
FIG. 39B illustrates D2-control for T2 transistor.
Figure 39C:
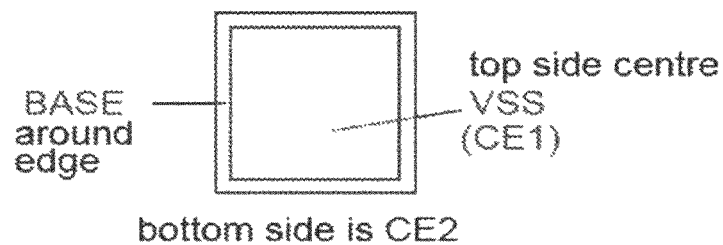
FIG. 39C illustrates B2 or T2 die having 3.3 mm.times.3.3 mm dimensions.
Figure 39D:
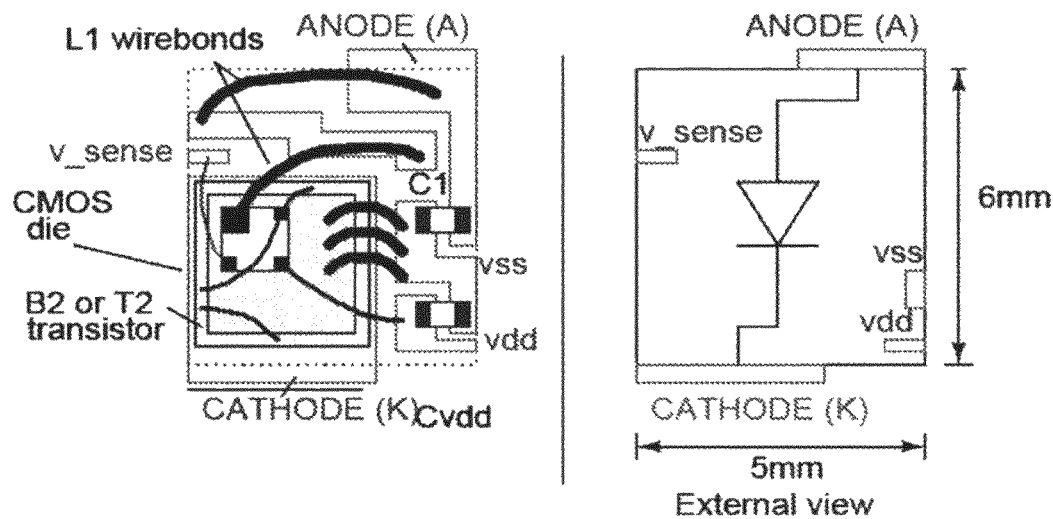
FIG. 39D illustrates a stacked die on printed-conductor substrate.
Figure 39E:
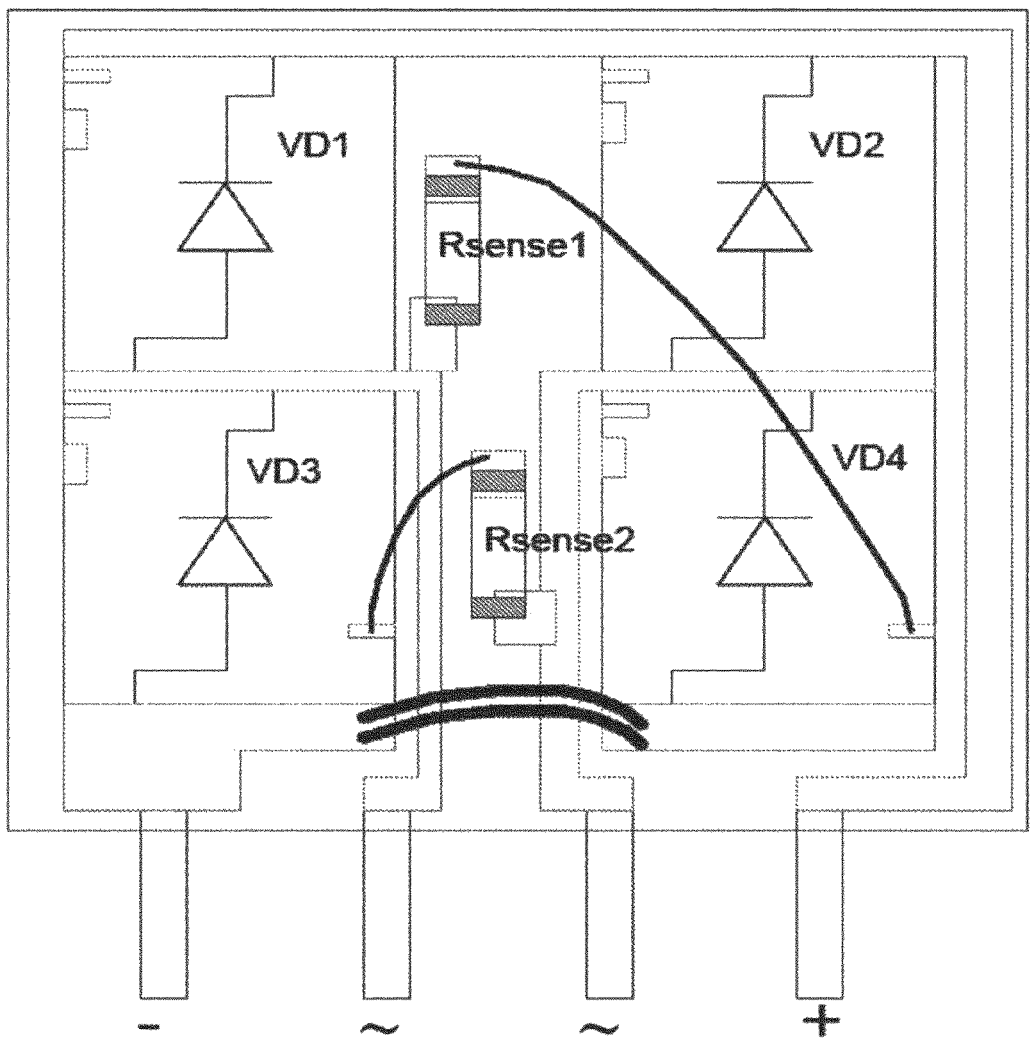
FIG. 39E illustrates an encapsulated bridge rectifier design.

Although this could be built from two separate die—a CMOS controller IC mounted on top of or alongside an I2 switch, FIG. 38B,D have the preferred embodiment where the 12 devices if formed underneath true CMOS structures on a monolithic wafer. This means that all types of circuits and IP blocks can be used to make a self-powered, smart-power transistor with fully built-in driver electronics e.g. ADC, DAC, Flash Memory, RAM, Microprocessor. An isolated control interface can be added using an off or on-die transformer making an easy to use smart transistor.

SWA and SWB are NMOS devices which on a typical 0.18 u CMOS process have a specific on resistance of 0.5 mOhm*mm2. To handle 10 A, only I mm2 of silicon area is needed to give a negligible 5 millivolts of DC voltage drop in SWA A digital controller drives the gates of SWA and SWB running from a VDD supply of typically 1.8 volts and switching at around 2 MHz. VDD is generated readily using Phase C period shown on the waveforms of FIG. 38C as the short spike on the LI voltage trace. A VDD voltage regulator function can be completed by control loop using on-chip components to adjust the time period or occurrence rate of the Phase C period.

Rdamp is the combination of real and parasitic resistance designed to dampen oscillations as the PWM forced-beta ratio is changed.

Further Refinements to the Control Techniques:

First order BJT base current control is automatic—the base current is always a fixed fraction of collector current over all possible collector current range—set precisely by the PWM ratio giving the Forced-beta.

It is possible to add a second-order loop which increases the PWM ratio in proportion to the measured collector current. This can account for the roll-off in Beta with increasing collector current of some transistor types. For high-speed low-loss turn off it has been found best to reduce the force-beta to a value below the sustaining value and only shutting of base current when the VCE ICE2 voltage is seen to rise, rather than simply cutting off base current immediately.

Refinements Made Easier with CMOS Integration:

With multiple stripe construction and very fine granularity of transistor formation a C2-device can contain vertical I2 transistor formations of different characteristics on the same die. Dramatically different characteristics result from changing the backside emitter from being opaque to being transparent to holes using multiple masked implants at the rear of the device. FIG. 38B shows a slow device beside a fast device.

NMOS devices SWB can be doubled-up to give independent Base_slow and Base_fast destinations for the base current. This technique will combine the best of high-Beta, low VCE(sat) characteristic of the slow device with the low Eoff losses of the fast device by arranging for a two-stage turn-off where first the slow transistor is turned off, handoff is passed over by first turning on the fast transistor before this is turned off to exploit it very low Eoff characteristic.

In practice there would be larger segregation distances between the fast and slow devices—ideally the carrier diffusion length to reduce cross-coupling. Also, the extremes of fully opaque and fully transparent might not be used.

Figure 37D:
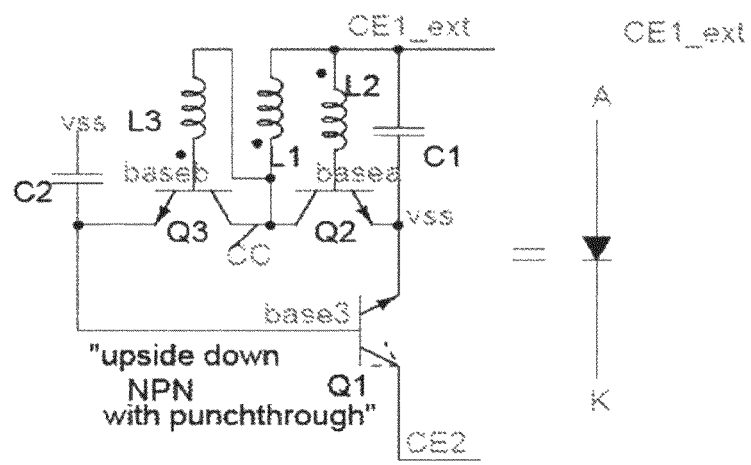
FIG. 37D illustrates a hand-made demonstration of self-resonant circuit.
Figure 37E:
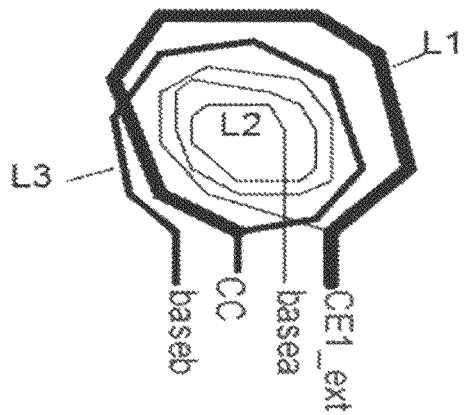
FIG. 37E illustrates an air-core or ferrite inductors.
Figure 37F:
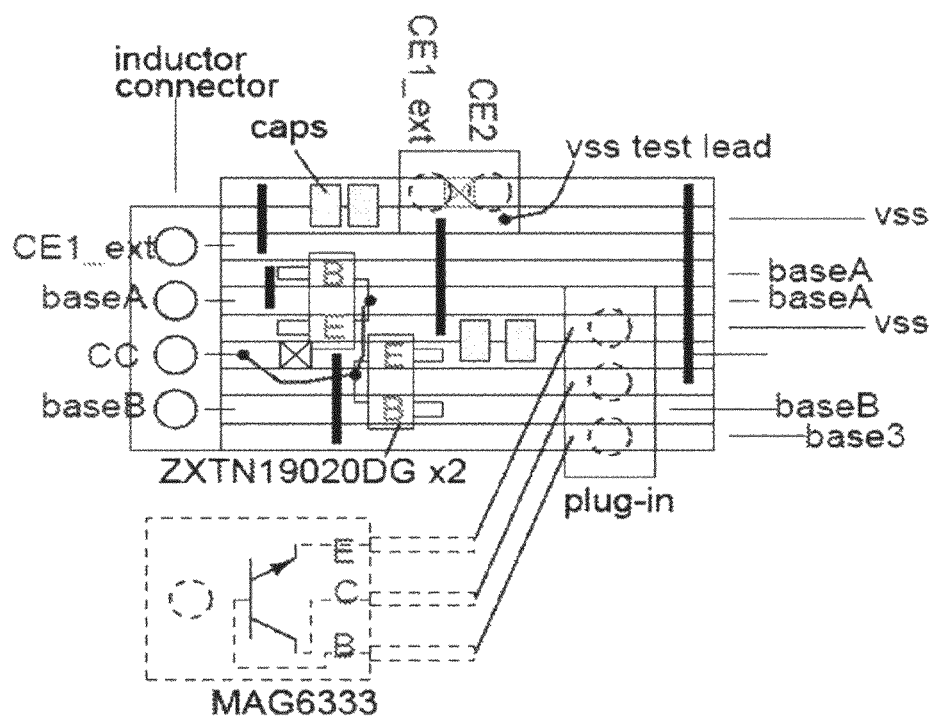
FIG. 37F illustrates a Veroboard construction.

Start-Up Operation:

The self-oscillating 'diode' of FIG. 37D starts up within 10 uS of being driven in the forward direction once Q3 and QI PN junction voltages are exceeded (1.5V approx). Then C1 is quickly charged to around IV and oscillation begins strongly. This initially higher forward voltage persists for such a short time relative to the 1000.times. longer 50 Hz half-cycle time that it can be ignored for mains rectification application C2-Device Start-Up and Standby:

The C2-device must operate at up to 100 KHz but an initial delay of even a few seconds from system power-up is acceptable. Using either the transistor's inherent leakage current or deliberate leakage path as formed by high-voltage JFET structure can charge capacitor CI from this tiny current. With the extremely low standby power consumption inherent in CMOS, V(C 1) can ramp to 2.5V which will give an initial VDD of 1.8V (one diode drop—see FIG. 38A).

This represents a standby condition where the energy stored on C I is enough to begin which the device is ready to come into operational mode as soon as an input signal is received. Operational mode is as described earlier with Phase A, B, C and self-powering technique. Dropping back into standby mode means the device is ready to turn on again whenever required without delay.

Advanced Bridge Rectifier with Value Added Features:

FIG. 39 shows ideas for combining active diodes and together to produce first a basic low-loss bridge rectifier then an more advanced version with several added features 1) Overvoltage protection for downstream components. In the version of FIG. 39B, an on-chip comparator on the C1VIOS die detects a mains overvoltage and where the controlled transistor is a T2 device (as described above), it can be tuned off, protecting any downstream electronics including electrolytic capacitors and power transistors from overvoltage. These components can then be rated only for the typically 450V excursions rather than rated at 650V device for infrequent mains over voltages. Either cost savings, performance improvement and/or reliability increases can be expected from lower voltage, less stressed devices. 2) Soft start Normally an additional device such as NTC thermistor is used in mains rectification applications to reduce inrush currents into the electrolytic capacitors at the expense of wasted heat in the NTC thermistor after the inrush event. The active bridge T2 type devices can instead give a pulse-width modulated gradual charging of the electrolytic during power-up before switching to the normal low-forward-voltage mode.

3) Auxiliary Power Supply Output

A low voltage auxiliary power supply can be tapped from the internal VDD supply and passed out of the bridge-rectifier module for use by external circuits such as Switch Mode Power Supply Controller or Power Factor Controller. These pins can be seen in FIG. 39D and FIG. 39E but are not being used in the example given.

Figure 40:
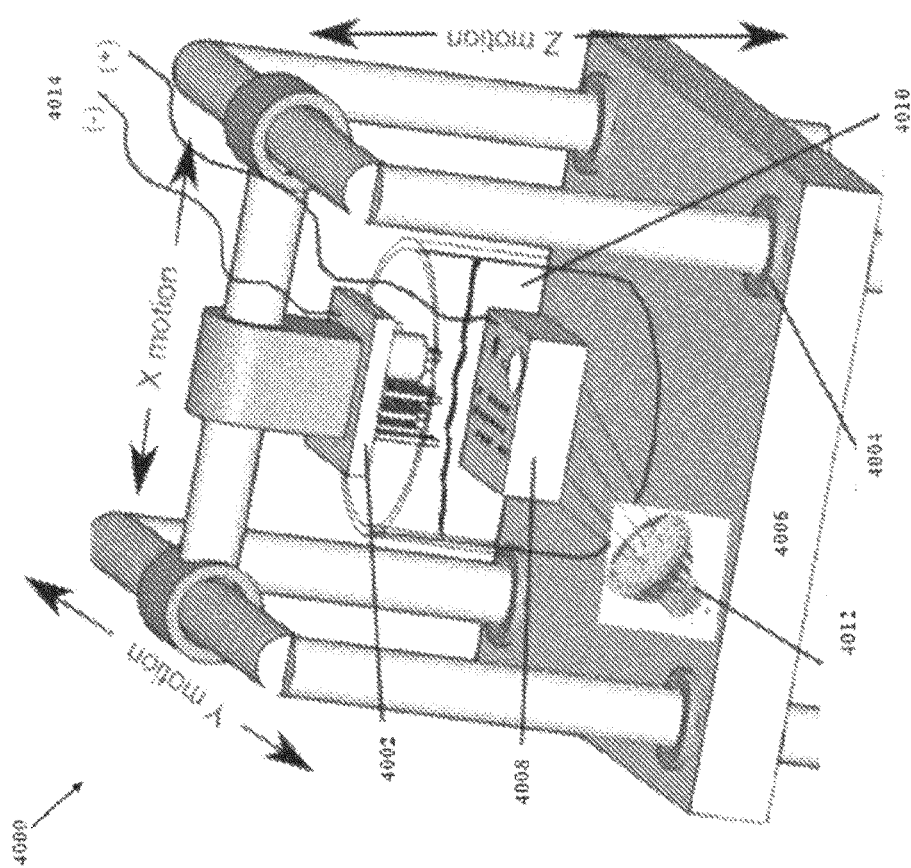
FIG. 40 illustrates a metal assisted chemical etching process using a moving platform.

FIG. 40 illustrates a metal assisted chemical etching process using a moving platform. In an embodiment, a Metal-Insulator-Semiconductor (M-I-S) Anodic etching and/or Metal assisted-chemical-etching using a moving platform 4000 is illustrated. For the understanding/explanation purpose wherever a reference is made to a Metal, generally any conductor would suffice as an alternative.

FIG. 40 shows a platform 4000 include cutting tools 4002, in the form of array of micro needles, connected to a nanometer accurate XYZ positioning table adapted to oscillate in X-Y Z axis directions. The platform 4000 has a bearings 4004 connected to a support 4006 allowing the positioning table to freely oscillate. A substrate 4008, preferable a silicon wafer, is placed in a container is positioned under the array of micro-needles 4002. The container is filled with an acidic solution 4010, preferably Hydrofluoric (HF) acid. A lamp 4012 may be provided to illuminate backside of the substrate 4008.

In an embodiment, a method of etching a substrate, wherein the substrate is a silicon substrate or a substrate having a silicon surface, is disclosed. The method includes placing the substrate in a container, wherein the substrate is a N-type substrate; providing a volume of an acid solution in the container, wherein the acid solution serves as an insulator; and drilling, using one or more needles supplied with a voltage 4014, one or more holes on the surface of the substrate to locally invert the N-type substrate to a P-type substrate, wherein the voltage applied on the surface of the substrate anodically etches the surface of the substrate to create the one or more holes by surface inversion.

In an embodiment, as shown in FIG. 40, an anodic etching is achieved by using needles, for example an array of micro-needles. Making the needles negative makes them act like metal gates in a MOS structure. In an exemplary implementation, a wafer to be etched is N-type and a liquid serves as an insulator. With a voltage of say 10 volts, when the needle gets within about 500 nm of the silicon surface the silicon will locally invert from N-type to P-type and holes will appear at the surface of the silicon. Because of the applied circuit voltage the surface of the silicon will be anodically etched—similar to the way microporous silicon can be formed but in this case holes are created by surface inversion. The microneedle array is positioned on a nanometer accurate XYZ positioning table. A small oscillating X/Y movement of perhaps +/−1OO nm can serve as mechanical agitation of the etching solution although it will make the etched features this much larger. Z oscillating motion can be used to form a piston-type pumping effect to further improve circulation of etchant and effluent to maintain high etch rate.

In another embodiment, a high frequency possibly bipolar electrical pulse rather than DC may reduce conduction losses in the Hydrofluoric (HF) acid and only allow for short pulses where the inversion layer is being etched compared to long times when it is recovering.

In an embodiment, the etching rate is set by the current which in turn depends on the surface area being etched.

It would be appreciated that, this system could also be applied to a Metal-assisted chemical version which mechanically would work similar to that set out for M-I-S etch but now the micro-needles would be plated with noble metal and the etching solution would be HF +H2O2 and no electrical supply would be required.

Cost Estimates/Cost of Ownership

Standard Bridge rectifiers are very inexpensive devices, costing around $0.50 for a 10 A 600V plastic packaged bridge rectifier. This splits 70%:30% between the cost of the diodes and the assembly/packaging materials.

However, the 15 watts minimum it will lose as heat costs incurs and extra $1 to deploy the necessary heatsinking means. Additionally, the cost of ownership is around $15 per year from electricity cost to fuel the 15 W of heat it generates [based on mean world electricity price of $0.19 per KwHr]

D2-device bridge rectifier. 10 A bridge-rectifier made up according to FIG. 3E has the following costs.

CMOS device. Assume $800 per 8" 24-mask wafer and kerf losses @1.5 mm.times.1.5 mm=$0.057.times.4=$0.23

B2 device. Assume $200 per 8" two-mask process wafer @3.3 mm.times.3.3 mm=$0.064.times.4=$0.255

Packaging+50% —package will have profiled shape to aid heat dissipation.

Testing/Yield losses+20%>

Total=.about.$0.87

The price is competitive and is actually cheaper than the standard bridge rectifier if the price of its heatsink is included. Initial cost comparisons however are mute since using a D2-device bridges will save its owner $12.50 per year per bridge at 10 A of rectified current. Payback time is in the order of 2 weeks. It also adds more than 1% to the efficiency figure of a 120 Vac mains operated device which is an important marketing metric for appliance manufacturers It will be appreciated that the invention can be described in the following clauses:

1. A power switching semiconductor device of bipolar construction and of PNP or NPN structure where minority carriers are injected from a base terminal which is normally kept inoperative and out-of-circuit by a depletion region induced by adjacent diffusion of opposite polarity and higher doping or by a junction transistor formed where there is encroachment of the adjacent diffusion or a pre-deposited junction.

2. A power switching semiconductor device according to clause 1 where high reverse bias voltages are supported by a lightly doped drift region which comprises the Base of the transistor.

3. A power switching semiconductor device according to any preceding clause where conduction occurs in two quadrants supporting operation as an AC switch.

4. A power switching semiconductor device according to any preceding clause which has two base connections, one on each side of the wafer, to support efficient AC switching gam.

5. A power switching semiconductor device according to any preceding clause which has one base connection on one side of the wafer which is driven by a single DC base supply.

6. A power switching semiconductor device according to any preceding clause with microprocessor controlled buck regulation of the base voltage/current drive and analogue to digital feedback information into the microprocessor's algorithms.

7. A power switching semiconductor device of PNP or NPN construction where minority carriers are injected from a base terminal which is normally kept inoperative and out of-circuit by a depletion region induced by adjacent diffusion of opposite polarity and higher doping where minority carriers are injected on the upper part of the semiconductor using a dedicated emitter terminal and where two collectors displaced laterally are formed on the lower side of the semiconductor to form the switching terminals.

8. A power switching semiconductor device according to any preceding clause where the energy used to power the base of the device is derived from the conduction voltage drop of the device.

9. A power switching semiconductor device according to any preceding clause where emitter/collector regions are etched then subsequently diffused with dopant.

10. A power switching semiconductor device according to any preceding clause where Quasi-PNP (for overall NPN device) or NPN (for overall PNP construction)/Quasi JFET electrode structure is present.

11. A power switching semiconductor device according to any preceding clause where conduction is synchronised to mains voltage cycle waveform for zero-crossing switching.

12. A power switching semiconductor device according to any preceding clause used to synchronously rectify mains AC power to reduce power losses compared to the Vf of a standard semi conductor diode.

13. A power switching semiconductor device according to any preceding clause where Polysilicon trench fill is used to form emitter/collectors of high doping and/or thin interfacial oxide feature.

14. A power switching semiconductor device according to any preceding clause where collector/emitters suffer reduced minority carrier injection through means of Silicon Germanium or other electric field grading technique.

15. A power switching semiconductor device according to any preceding clause forming 3 d or stacked devices to give higher power ability and/or higher sensitivity and lower conduction losses.

16. A power switching semiconductor device according to any preceding clause where the stacked structure is used to increase the surface area of the finished article to obviate the need or a dedicated heat-sink.

17. A power switching semiconductor device according to any preceding clause which incorporates a charge-control model of bipolar diffusion current transport within its algorithms.

18. A power switching semiconductor device according to any preceding clause which is self-powered from the load using an auxiliary transistor tap circuit switching on around the zero-crossing times.

19. A power switching semiconductor device according to any preceding clause where the finished article is calibrated and coefficients stored in non-volatile memory mounted with the transistor.

20. A power switching semiconductor device according to any preceding clause using a recessed BASE contact (auxiliary transistor emitter) so that the a CE electrode is prominent allowing 3D device stacking with interspaced conductor sheets for heat extraction and electrical conduction.

21. A power switching semiconductor device according to any preceding clause using a transformer coupling arrangement of LF power waveform and RF data waveform allowing for data networking and isolated power between an number of intelligent nodes.

22. A power switching semiconductor device according to any preceding clause where the required control system can be powered using the inbuilt boost converter acting on the energy available from the through current of the main semiconductor switch.

23. A power switching semiconductor module according to any preceding clause acting in the overall capacity as a two terminal fuse for a circuit to be protected.
24. A power switching semiconductor with a current-mode base control where resistive DAC or DACs are used to control current of the overall or individual bases of the power semiconductor according to a control program reactive to the measured operating conditions of the device.
25. An array of power switching semiconductors according to any proceeding clause combined with a multichannel control circuit to effect a matrix converting ac to ac power converter.
26. A power switching semiconductor according to any preceding clause where a buffer layer is inserted of opposite doping under the CE2 or Collector terminal and has doping around the standard concentration ranges typical for punch-through or filed-stop control layers used in IGBTs or Diodes.
27. A power switch driver comprising a coupled dual PWM system where the latter is a high-frequency buck-mode converter using inductor and the former is a standard PWM channel and where the cross modulation of the two PWMs across a base drive inductance affords a continuous dynamic current control of a power switch with a high speed on and off ability.
28. A coupled dual PWM driver where PWM2 frequency is such that the off time is of similar order or not much longer than the minority carrier lifetime ensuring that conductivity of the switched transistor remains approximately constant in the PWM2 period.
29. Multiple, independently programmable, copies of the dual PWM driver each driving a separate finger or power device die to provide the ability to control current and timing independently on each region of a die or multiple die.
30. A coupled multi-channel driver where multiple phase-offset PWM2 type drivers each driving an inductor with a common point on the base terminal of a transistor and a single PWM1 channel to drive standard devices such as silicon-carbide NPN transistor.
31. A coupled multi-channel driver according to above where multiphase offsets create a higher effective PWM2 frequency to match the reduced minority-carrier lifetime of high speed transistors such as silicon-carbide.
32. An intelligent power-transistor driver with multi-channel outputs as described in previous clauses, which applies during operation pre-programmed co-efficient which had been determined after manufacturing to make a device with the overall uniform device voltage, current and temporal characteristics of a single device.
33. An intelligent power-transistor driver with multi-channel outputs as described in previous clauses with an adaptive circuit to respond to an external PWM and by applying known delay coefficients and calibration values known in advance to create the same PWM on/off ratios at the output transistor albeit with a slight overall delay.
34. An intelligent low leakage relay circuit of construction according to any preceding clause where a second switch shunts any leakage current around the load during switch off and optionally a third transistor disconnects to achieve Pico-ampere level leakage currents into the load.
35. An AC switchable power transistor and driver combination according to any preceding clause where a virtual diode action is formed by the driver being commanded or detecting the need for reverse conduction and turning on the transistor accordingly.
36. A minority-carrier switching transistor whose base terminal and internal structure current rating equal to that of the collector or emitter current rating so that it yields a reverse free-wheeling diode function of equal current rating to the forward rating and when the base is actively clamped to ground using typically an NMOS FET from the driver or when the base current is produced by the driver to effect reverse bias switch-on transistor action and to further reduce the voltage of the C to E path below the normal Vdiode drop.
37. A High-side DC switch or multiple high side DC switches comprising a transistor according to any preceding clause and a single or multichannel driver according to any preceding clause It will also be appreciated that still further aspects of the invention can be described in the following further clauses:

According to an aspect, a bi-directional bipolar junction transistor (BJT) structure is provided, including comprising: a base region of a first conductivity type, wherein said base region constitutes a drift region of said structure; first and second collector/emitter (CE) regions, each of a second conductivity type adjacent opposite ends of said base region; wherein said base region is lightly doped relative to said collector/emitter regions; the structure further comprising: a base connection to said base region, wherein said base connection is within or adjacent to said first collector/emitter region.

According to an aspect, said first and second collector/emitter regions and said base region define a bi directional BJT, and wherein a connection to said base region of said bi-directional BJT via a second transistor having a first input/output (I/O) terminal connected to said base connection, and a control connection coupled to said first CE region.

According to an aspect, said second transistor is a junction gate field-effect transistor (JFET), wherein said base connection and base region are source/drain connections of said JFET, wherein said control connection is a gate terminal of said JFET, wherein said base connection is adjacent said first CE region, and wherein a channel region of said JFET is between said base connection and said base region.

According to an aspect, said second transistor is a BJT, wherein said first I/O terminal has said first conductivity type, wherein said base connection is within said first CE region, and wherein said control connection of said BJT is a base is formed by a portion of said first CE region.

According to an aspect, said base region is wider in a direction between said ends of said base region than each of said collector/emitter regions, and wherein a current carrying capability of a connection path between said base connection and said second CE region is less than a current carrying capability of a connection path between said first and second CE regions.

According to an aspect, a forward conduction path from said base region to said second CE region is driven by a voltage on said base region relative to said second CE region, and wherein, when said forward conduction path is present, a forward conduction path between said base connection and said base region includes a depleted portion of said base region.

According to an aspect, when no voltage is applied to any terminals, the structure is in an off-state so as to form depletion regions between said first CE region and base region and between said second CE region and base region.

According to an aspect, when a positive voltage is applied to said second CE region and no voltage is applied to the first CE region and the base connection, the structure is in an off-state so as to form a depletion region between said second CE region and base region.

According to an aspect, when a negative voltage is applied to said second CE region and no voltage is applied to the first CE region and the base connection, the structure is in an off-state so as to form a depletion region between said first CE region and base region.

According to an aspect, when a first positive voltage is applied to said second CE region, a second positive voltage being applied to the base connection and no voltage is applied to the first CE region, the structure is in an on-state in which majority carriers from the first CE region flow through the base region towards the second CE region, and minority carriers from the base connection are injected into the base region, the minority carriers being recombined with the majority carriers in a region adjacent the first CE region.

According to an aspect, when a negative voltage is applied to said second CE region, a positive voltage being applied to the base connection and no voltage is applied to the first CE region, the structure is in an on-state in which majority carriers from the second CE region flow through the base region towards the first CE region, and minority carriers from the base connection are injected into the base region flowing towards the second CE region, the minority carriers being recombined with the majority carriers in a region adjacent the second CE region.

According to an aspect, the first conductivity type comprises a p-type doping polarity and the second conductivity type comprises an n-type doping polarity.

According to an aspect, said structure is non-latching and switches off a connection between said first and second CE regions on removal of a voltage from said base connection.

According to an aspect, said base connection is recessed into a surface of said structure.

According to an aspect, said base connection is an ohmic connection comprising a region of said first conductivity type, and wherein said base region is of ohmic type.

According to an aspect, said ohmic base region is configured to drive transistor comprising the first CE region, base region and second CE region into a saturation region during current conduction.

According to an aspect, said device is a vertical device. According to an aspect, said structure is a lateral structure.

According to an aspect, the second CE region comprises two separation portions laterally disposed to one another and wherein each separate portion forms a switching terminal.

According to an aspect, a bipolar junction transistor (BJT) structure, comprising: a base region of a first conductivity type, wherein said base region constitutes a drift region of said structure; first and second collector/emitter (CE) regions, each of a second conductivity type adjacent opposite ends of said base region; wherein said base region is lightly doped relative to said collector/emitter regions; the structure further comprising: a base connection to said base region, wherein said base connection is within or adjacent to said first collector/emitter region and a buried layer of the second conductivity type disposed between the second CE region and the base region.

According to an aspect, the structure is configured to operate in a DC application.

According to an aspect, a bipolar junction transistor (BJT) structure, comprising: a base region of a first conductivity type, wherein said base region constitutes a drift region of said structure, the drift region being a reverse voltage sustaining region; a collector region of a second conductivity type; an emitter of a second conductivity type, the collector and emitter being adjacent opposite ends of said base region; wherein said base region is lightly doped relative to said collector and emitter regions; the structure further comprising: a base connection region of the first conductivity type formed adjacent to said emitter region and a field stop layer of the first conductivity type formed between the emitter region and the base region, the base connection being within the field stop layer.

According to an aspect, the doping concentration of the field stop layer is less than that of the base connection.

According to an aspect, the thickness of the field stop layer is more than that of the base connection. According to an aspect, that a diode is formed between the collector and base region.

According to an aspect, the diode is configured to operate as a reverse conducting diode when driven by a driver circuit.

According to an aspect, the driver circuit comprising a first PWM controller and a second PWM controller, the first and second PWM controllers being coupled to one another, wherein the first PWM controller is capable of controlling a low voltage transistor and the second PWM controller is a high frequency converter.

According to an aspect, the second PWM controller is a buck converter using an inductor.

According to an aspect, the cross modulation of the first and second PWM controllers across a base drive inductance allows a continuous dynamic current control of the BJT structure with high speed on and off capability.

According to an aspect, the frequency of the second PWM controller is such that the off time is of substantially similar order compared to the minority carrier (e.g. electron) lifetime ensuring that conductivity of the BJT structure remains substantially constant during the period controlled by the second PWM controller.

According to an aspect, the second PWM controller is a phase offset controller.

According to an aspect, a third PWM controller which is a phase offset controller, wherein the second and third phase offset controllers each drive an inductor with a common point on a base connection terminal of a transistor.

According to an aspect, the first PWM controller is coupled to the base connection terminal of the transistor so as to drive the transistor.

According to an aspect, the multiphase offsets of the second and third PWM controllers create a relatively high effective frequency to match a reduced minority-carrier lifetime of high speed transistors.

According to an aspect, the combination of the driver circuit and the BJT structure is configured to provide a reverse conducting diode.

According to an aspect, the base region is of p conductivity type, the driver is configured to detect a negative current of the base so that holes can be pulled out from the junction between the first CE region and base to clamp a negative excursion.

According to an aspect, the current rating of the base region substantially equal to that of the collector or emitter so as to yield a reverse free-wheeling diode of substantially equal current rating to the forward rating.

According to an aspect, the base region is configured to be clamped to ground using a MOSFET from the driver.

According to an aspect, the base current is produced by the driver circuit to result in a reverse bias switch-on transistor action so as to reduce the voltage drop in a current flow path below a normal voltage drop of a diode.

According to an aspect, a computer program product comprising a computer readable medium in which a computer program is stored, the computer program comprising computer readable code which, when run by a controller of a driver circuit, causes the driver circuit to operate as the driver circuit, wherein the computer program is stored on the computer readable medium.

According to an aspect, when the controller is configured to detect a voltage of the BJT structure in an off-state, the computer program product is configured to turn on the BJT structure to emulate a reverse conducting diode action.

According to an aspect, a driver circuit, in particular for a BJT structure driver, comprising: i) a voltage sensing resistor and ii) a current sensing resistor, each coupled to one of said CE regions, and a microcontroller coupled to receive a voltage sensing signal and a current sensing signal from said resistors and to provide a PWM output for controlling a base current into said base connection via an inductance.

According to an aspect, a circuit breaker comprising a first, power semiconductor switching device and a driver circuit, wherein said circuit breaker has two power switching terminals, and further comprises a power supply, and a controller for said power semiconductor switching device powered by said power supply, wherein said power supply is coupled in series with said first power semiconductor switching device between said power switching terminals to derive a power supply from said terminals whilst said power semiconductor switching device is on, and wherein said power supply comprises a second switching device coupled in series with said first power semiconductor switching device, between said power switching terminals, such that the circuit breaker is operable without a separate power supply. According to an aspect, said first device is a high voltage device, said second device is a low voltage device comprising part of a de-to-de power convertor input stage.

According to an aspect, said power supply is a switched mode power convertor comprising a plurality of low voltage switching devices to charge and discharge an energy storage component such that a power supply for said controller is provided irrespective of the direction of current flow between said power switching terminals, the circuit breaker further comprising a sensor to sense said direction of said current flow for controlling said plurality of switching devices.

According to an aspect, a circuit breaker further comprises a reservoir capacitor charged by leakage current through said power switching device, to provide a power supply for sensing said direction of current flow at start-up of said power supply.

According to an aspect, a circuit breaker operably connected to the BJT structure, the circuit breaker comprising: an input capacitor connected to a CE region; an inductor coupled to the input capacitor;

first and second switching devices coupled to the inductor; a second capacitor coupled to the second switching device; and a pulse width modulation (PWM) controller configured to control the first and second switching devices.

According to an aspect, when a positive voltage is applied to the CE terminal, the first switching device is configured to charge the inductor, and the second switching device is configured to charge the second capacitor.

According to an aspect, the charging of the inductor is controlled by controlling the duty cycles of the PWM controller.

According to an aspect, when a negative voltage is applied to the first CE terminal, the second switching device and the second capacitor are disconnected from the circuit breaker.

According to an aspect, a third switching device and a third capacitor which are coupled to the first switching device, the inductor and the first capacitor.

According to an aspect, the third switch is configured to charge the third capacitor.

According to an aspect, a bootstrap circuit operatively connected to the BJT structure and operatively connected to the circuit breaker, the bootstrap circuit comprising a first diode coupled with the second capacitor of the circuit breaker and a second diode coupled with the third capacitor of the circuit breaker, wherein the bootstrap circuit is configured to store positive or negative leakage current in the first and/or third capacitors through the first and second diodes so as to turn on the bi-direction BJT structure.

According to an aspect, a bleed resistor to provide sufficient current to turn on the BJT structure if there is inherent leakage current present in the BJT structure.

According to an aspect, an auxiliary tap circuit switching on around the zero-crossing times so as to power the BJT structure.

According to an aspect, a driver circuit operatively connected to a plurality of BJT structures, wherein each BJT structure is disposed side by side on a chip and wherein the driver circuit comprises a plurality of independent PWM drivers each independently driving the base connection of each BJT structure through an inductor.

According to an aspect, each PWM driver is configured to control current to the base connection and switching time of the BJT structure independently.

According to an aspect, each PWM driver is configured to control the current during an on-state of the BJT structure using a discontinuous current inductor drive.

According to an aspect, the discontinuous current mode occurs when an off-time from the PWM driver is sufficiently long so that the inductor current decreases to zero.

According to an aspect, a driver circuit operatively connected to a BJT structures, comprising a resistive digital to analogue controller (DAC) for controlling the current of the base of the BJT structure.

According to an aspect, the DAC is configured to control the base current ofthe BJT structure according to a control program which is reactive to measured operating conditions of the BJT structure.

According to an aspect, a matrix converter comprising an array of BJT structures, the matrix converter further comprising a control circuit comprising a plurality of channels which are configured to control the switching of the array of BJT structures.

According to an aspect, a relay circuit for a low leakage current application, the relay circuit comprising the BJT structure, the relay circuit further comprising a load resistor and a switching device arranged parallel to the load resistor, wherein the switching device is configured to bypass any leakage current from the BJT structure around the load resistor during switching off operation.

6 According to an aspect, a further switching device coupled with the load resistor, the further Switching device being configured to obtain Pico-ampere level leakage current into the load resistor.

According to an aspect, a driver chip operatively connected to a BJT structures and comprising the driver circuit, wherein the driver chip is configured to apply pre-programmed coefficients determined after manufacturing the components of the driver chip.

According to an aspect, a driver chip, wherein the first PWM controller is configured to vary phases for different regions of the BJT structure based on calibration parameters of the driver chip so as to allow a large die including the BJT structure to turn on and/or off to compensate for the difference in for example carrier lifetime and/or doping levels.

According to an aspect, a driver chip, wherein the driver chip is mounted directly on top of a wafer comprising the BJT structure.

According to an aspect, a method of manufacturing a bipolar junction transistor (BJT) structure, the method comprising: forming a base region of a first conductivity type, wherein said base region constitutes a drift region of said structure; forming first and second collector/emitter (CE) regions, each of a second conductivity type adjacent opposite ends of said base region, wherein said base region is lightly doped relative to said collector/emitter regions; and forming a base collection to said base region, wherein said base connection is within or adjacent to said first collector/emitter region.

According to an aspect, a method according to clause 69, further comprising: etching the first collector/emitter region; and forming a dopant diffusion in the etched region.

According to an aspect, filling polysilicon in a trench to form the first collector/emitter region and/or to form a thin interfacial oxide region.

According to an aspect, applying an anisotropic wet chemical etching of the first collector/emitter region with artwork aligned at either zero degrees or 45 degrees to form a simultaneous undercut of an oxide and a self-terminating V-groove etch of contact holes.

According to an aspect, applying the anisotropic wet etching to form a bevel etch to control the edges of the BJT structure.

According to an aspect, applying an electric field grading technique to reduce minority carrier injection from the collector/emitter regions.

According to an aspect, forming a three dimensional or stacked structure so as to give higher power ability and/or higher sensitivity and lower conduction losses.

According to an aspect, forming a recessed BASE contact so that the electrodes on collector/emitter regions can form the three dimensional or stacked structure.

According to an aspect, an active rectifier, comprising: a power bipolar junction transistor (BJT), having a first and second input/output (I/O) connections and a base connection; first and second rectifier terminals, wherein said first I/O connection of said BJT is coupled to said first rectifier termlinal, wherein said second I/O connection of said BJT is coupled to said second rectifier terminal; a driver oscillator to provide a two phase drive waveform having a first (on) portion and a second (oft) portion; at least one controllable switch controlled by said driver oscillator and coupled between said second rectifier terminal, said base connection of said BJT and said second I/O connection of said BJT, to selectively route current from said second rectifier terminal between said second I/O connection of said BJT and said base connection of said BJT; wherein said driver oscillator controls said controllable switch to route said current from said second rectifier terminal between said base and second I/O connections of said BJT in proportion of a ratio of durations of said first and second portions of said drive waveform.

According to an aspect, said second I/O connection of said BJT is coupled to said second rectifier terminal via a filter, and wherein said filter comprises a capacitor such that a connection between said second I/O connection of said BJT and said second rectifier terminal is via said capacitor.

According to an aspect, an inductance between said second rectifier terminal and said base connection said BJT to store current for said base connection whilst said controllable switch is routing current from said second rectifier terminal away from said base connection of said BJT.

According to an aspect, said controllable switch comprises a first controllable switch coupled between said second rectifier terminal and said second I/O connection of said BJT and a second controllable switch coupled between said second rectifier terminal and said base connection of said BJT and; and wherein said two phase drive waveform comprises first and second waveforms, said first waveform having an on portion corresponding to said first portion of said two phase drive waveform, said
second waveform having an off portion corresponding to said second portion of said two phase drive waveform, wherein said first waveform controls said first controllable switch and said second waveform controls said second controllable switch.

According to an aspect, said controllable switch comprises a first controllable switch coupled between said second rectifier terminal and said second I/O connection of said BJT and a second controllable switch coupled between said second rectifier terminal and said base connection of said BJT and; and wherein said two phase drive waveform comprises first and second waveforms, said first waveform having an off portion corresponding to said second portion of said two phase drive waveform, said second waveform having an on portion corresponding to said first portion of said two phase drive waveform, wherein said first waveform controls said first controllable switch and said second waveform controls said second controllable switch.

According to an aspect, a boost converter to boost a voltage drop across one or more circuit elements coupled between said rectifier terminals to provide a power supply for said drive oscillator.

According to an aspect, said boost converter is coupled across one or more circuit elements coupled in an emitter circuit of said BJT According to an aspect, an inductance between said second rectifier terminal and said base connection said BJT to store current for said base connection whilst said controllable switch is routing current from said second rectifier terminal away from said base connection of said BJT; and wherein said boost converter comprises said inductance, to boost said voltage drop, and said driver oscillator such that said driver oscillator, and inductance together with said at least one controllable switch from a boost converter to power said driver oscillator.

According to an aspect, an active rectifier configured to use leakage current through said BJT, or a high voltage current source device, or a resistor, to provide power to bootstrap said driver oscillator of said booster converter.

According to an aspect, said portions of said first and second waveforms are non-overlapping such that there is a dead time between said on portions; the active rectifier further comprising a power harvesting device or Schottky diode coupled to a connection between said second rectifier terminal and said second I/O terminal of said BJT to harvest power from said voltage drop during said dead time.

According to an aspect, said first I/O connection of said BJT is a collector connection and said second I/O connection of said BJT is an emitter connection.

According to an aspect, said ratio of durations of said first portion to said second portion of said two phase drive waveform is less than 1:1.

According to an aspect, a bi-directional bipolar junction transistor (BJT) structure, comprising: a base region of a first conductivity type, wherein said base region constitutes a drift region of said structure; first and second collector/emitter (CE) regions, each of a second conductivity type adjacent opposite ends of said base region; wherein said base region is lightly doped relative to said collector/emitter regions; the structure further comprising: a base connection to said base region, wherein said base connection is within or adjacent to said first collector/emitter region.

According to an aspect, said first and second collector/emitter regions and said base region define a bi-directional BJT, and wherein a connection to said base region of said bi directional BJT via a second transistor having a first input/output (I/O) terminal connected to said base connection, and a control connection coupled to said first CE region.

According to an aspect, said second transistor is a junction gate field-effect transistor (JFET), wherein said base connection and base region are source/drain connections of said JFET, wherein said control connection is a gate terminal of said JFET, wherein said base connection is adjacent said first CE region, and wherein a channel region of said JFET is between said base connection and said base region.

According to an aspect, said second transistor is a BJT, wherein said first I/O terminal has said first conductivity type, wherein said base connection is within said first CE region, and wherein said control connection of said BJT is a base is formed by a portion of said first CE region.

According to an aspect, said base region is wider in a direction between said ends of said base region than each of said collector/emitter regions, and wherein a current carrying capability of a connection path between said base connection and said second CE region is less than a current carrying capability of a connection path between said first and second CE regions.

According to an aspect, a forward conduction path from said base region to said second CE region is driven by a voltage on said base region relative to said second CE region, and wherein, when said forward conduction path is present, a forward conduction path between said base connection and said base region includes a depleted portion of said base region.

According to an aspect, when no voltage is applied to any terminals, the structure is in an off state so as to form depletion regions between said first CE region and base region and between said second CE region and base region.

According to an aspect, when a positive voltage is applied to said second CE region and no voltage is applied to the first CE region and the base connection, the structure is in an off-state so as to form a depletion region between said second CE region and base region.

According to an aspect, when a negative voltage is applied to said second CE region and no voltage is applied to the first CE region and the base connection, the structure is in an off-state so as to form a depletion region between said first CE region and base region.

According to an aspect, when a first positive voltage is applied to said second CE region, a second positive voltage being applied to the base connection and no voltage is applied to the first CE region, the structure is in an on-state in which majority carriers from the first CE region flow through the base region towards the second CE region, and minority carriers from the base connection are injected into the base region, the minority carriers being recombined with the majority carriers in a region adjacent the first CE region.

According to an aspect, when a negative voltage is applied to said second CE region, a positive voltage being applied to the base connection and no voltage is applied to the first CE region, the structure is in an on-state in which majority carriers from the second CE region flow through the base region towards the first CE region, and minority carriers from the base connection are injected into the base region flowing towards the second CE region, the minority carriers being recombined with the majority carriers in a region adjacent the second CE region.

According to an aspect, the first conductivity type comprises a p-type doping polarity and the second conductivity type comprises an n-type doping polarity; and/or wherein said structure is non-latching and switches off a connection between said first and second CE regions on removal of a voltage from said base connection; and/or wherein said base connection is recessed into a surface of said structure; and/or wherein said base connection is an ohmic connection comprising a region of said first conductivity type, and wherein said base region is of ohmic type, wherein optionally said ohmic base region is configured to drive transistor comprising the first CE region, base region and second CE region into a saturation region during current conduction.

According to an aspect, said device is a vertical device.
According to an aspect, said structure is a lateral structure.
According to an aspect, the second CE region comprises two separation portions laterally disposed to one another and wherein each separate portion forms a switching terminal.

According to an aspect, a bipolar junction transistor (BJT) structure, comprising: a base region of a first conductivity type, wherein said base region constitutes a drift region of said structure; first and second collector/emitter (CE) regions, each of a second conductivity type adjacent opposite ends of said base region; wherein said base region is lightly doped relative to said collector/emitter regions; the structure further comprising: a base connection to said base region, wherein said base connection is within or adjacent to said first collector/emitter region and a buried layer of the second conductivity type disposed between the second CE region and the base region.

According to an aspect, the structure is configured to operate in a DC application.

According to an aspect, a bipolar junction transistor (BJT) structure, comprising: a base region of a first conductivity type, wherein said base region constitutes a drift region of said structure, the drift region being a reverse voltage sustaining region; a collector region of a second conductivity type; an emitter of a second conductivity type, the collector and emitter being adjacent opposite ends of said base region; wherein said base region is lightly doped relative to said collector and emitter regions; the structure further comprising: a base connection region of the first conductivity type formed adjacent to said emitter region and a field stop layer of the first conductivity type formed between the emitter region and the base region, the base connection being within the field stop layer.

According to an aspect, the doping concentration of the field stop layer is less than that of the base connection; and/or wherein the thickness of the field stop layer is more than that of the base connection.

According to an aspect, a BJT structure, being configured such that a diode is formed between the collector and base region, wherein the diode is optionally configured to operate as a reverse conducting diode when driven by a driver circuit.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

The invention claimed is:

1. A method of driving a bidirectional semiconductor power transistor device, the method comprising:
    driving the semiconductor power transistor device on a high side of the transistor that is at a higher potential than an opposing low side of the transistor, the high side of the transistor comprising a P+ electrode and a N+ electrode;
    selectively steering current into either the P+ electrode of the semiconductor power transistor device or into the N+ electrode of the semiconductor power transistor device on the high side of the semiconductor power transistor device.

2. The method of claim 1, wherein driving the semiconductor power transistor device comprises driving a gate of the semiconductor power transistor device.

3. The method of claim 1, further comprising using a controller to determine, through a voltage comparator, the side of the transistor that is at the lowest potential and driving the semiconductor power transistor device accordingly.

4. The method of claim 3, wherein the controller drives the semiconductor power transistor device by outputting a PWM signal to drive switches.

5. The method of claim 4, wherein the switches comprise low on-resistance mosfets.

6. The method of claim 1, wherein the bidirectional semiconductor power transistor device comprises a double sided bidirectional semiconductor power transistor device.

7. The method of claim 1, wherein the bidirectional semiconductor power transistor device comprises a bidirectional Bipolar-Mode JFET (BMJFET).

8. The method of claim 7, wherein the bidirectional Bipolar-Mode JFET (BMJFET) comprises a double sided bidirectional Bipolar-Mode JFET (BMJFET).

9. The method of claim 7, wherein the bidirectional Bipolar-Mode JFET (BMJFET) comprises an ultra-lateral single sided bidirectional Bipolar-Mode JFET (BMJFET).

10. The method of claim 1, wherein the bidirectional semiconductor power transistor device comprises a Silicon Carbide semiconductor construction.

11. The method of claim 1, wherein the bidirectional semiconductor power transistor device comprises N-type wafer.

12. An electronic component comprising:
    a bidirectional semiconductor power transistor device; and
    a switching construction configured to drive the bidirectional semiconductor power transistor device in the manner recited in claim 1.

13. The electronic component of claim 12, wherein the electronic component comprises an auxiliary resonant commutated pole converter auxiliary switch.

* * * * *